(12) United States Patent
Oohira

(10) Patent No.: US 7,253,490 B2
(45) Date of Patent: Aug. 7, 2007

(54) MAGNETIC SENSOR HAVING VERTICAL HALL DEVICE AND METHOD FOR MANUFACTURING THE SAME

(75) Inventor: Satoshi Oohira, Ichinomiya (JP)

(73) Assignee: DENSO Corporation, Kariya (JP)

( * ) Notice: Subject to any disclaimer, the term of this patent is extended or adjusted under 35 U.S.C. 154(b) by 0 days.

(21) Appl. No.: 11/082,023

(22) Filed: Mar. 17, 2005

(65) Prior Publication Data
US 2005/0230770 A1 Oct. 20, 2005

(30) Foreign Application Priority Data

| Mar. 30, 2004 | (JP) | ............................. 2004-100841 |
| Apr. 20, 2004 | (JP) | ............................. 2004-124460 |
| Jan. 12, 2005 | (JP) | ............................. 2005-005653 |

(51) Int. Cl.
*H01L 29/82* (2006.01)
*H01L 43/00* (2006.01)

(52) U.S. Cl. ............................. 257/424; 257/E43.003; 257/E27.005

(58) Field of Classification Search ......... 257/E43.003
See application file for complete search history.

(56) References Cited

U.S. PATENT DOCUMENTS

| 4,253,107 A * | 2/1981 | Macdougall ................. 257/427 |
| 4,607,271 A * | 8/1986 | Popovic et al. .............. 257/422 |
| 4,700,211 A * | 10/1987 | Popovic et al. .............. 257/423 |
| 4,829,352 A * | 5/1989 | Popovic et al. .............. 257/426 |
| 4,929,993 A * | 5/1990 | Popovic ....................... 257/424 |
| 5,057,890 A * | 10/1991 | Falk et al. .................... 257/427 |
| 5,572,058 A * | 11/1996 | Biard ........................... 257/421 |
| 5,627,398 A * | 5/1997 | Zlebir et al. ................. 257/427 |
| 2004/0207031 A1* | 10/2004 | Berndt et al. ................ 257/414 |

FOREIGN PATENT DOCUMENTS

| JP | A-1-251763 | 10/1989 |
| JP | A-7-22666 | 1/1995 |

OTHER PUBLICATIONS

Maenaka et al. "Integrated Three Dimensional Magnetic Sensors." *T.IEE*. vol. 109-C, No. 7 (1989):482-491.
Maenaka et al. "Characteristics of Vertical Hall Cells and Improvement of Their Sensitivity." *T.IEE*. vol. 117-E, No. 7 (1997):364-371.

* cited by examiner

*Primary Examiner*—Evan Pert
*Assistant Examiner*—Benjamin P. Sandvik
(74) *Attorney, Agent, or Firm*—Posz Law Group, PLC

(57) ABSTRACT

A vertical Hall device includes: a substrate; a semiconductor region having a first conductive type and disposed in the substrate; and a magnetic field detection portion disposed in the semiconductor region. The magnetic field detection portion is capable of detecting a magnetic field parallel to a surface of the substrate in a case where a current flows through the magnetic field detection portion in a vertical direction of the substrate. The semiconductor region is a diffusion layer including a conductive impurity doped and diffused therein. The semiconductor region is made of diffusion layer so that the device has high design degree of freedom.

29 Claims, 38 Drawing Sheets

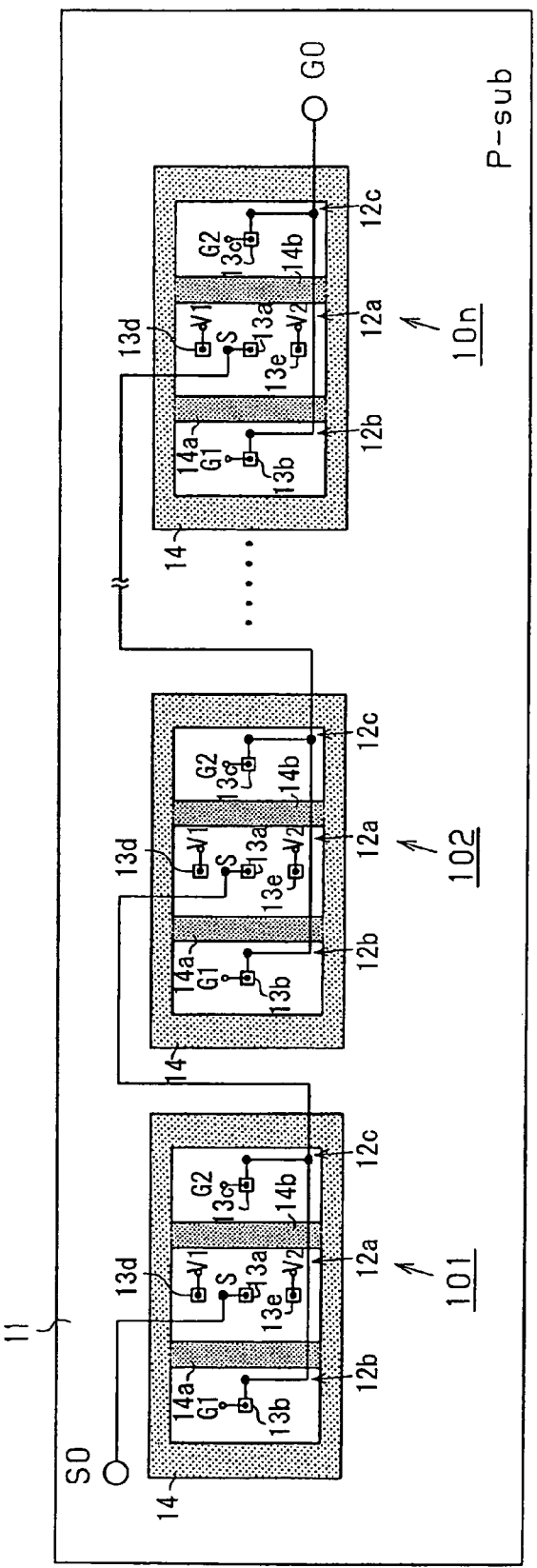
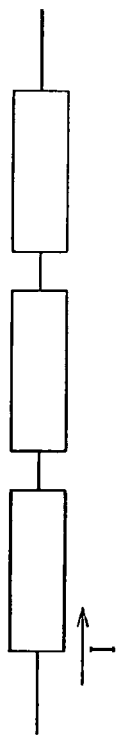
FIG. 31A
FIG. 31B

MAGNETIC SENSOR HAVING VERTICAL HALL DEVICE AND METHOD FOR MANUFACTURING THE SAME

CROSS REFERENCE TO RELATED APPLICATIONS

This application is based on Japanese Patent Applications No. 2004-100841 filed on Mar. 30, 2004, No. 2004-124460 filed on Apr. 20, 2004, and No. 2005-5653 filed on Jan. 12, 2005, the disclosures of which are incorporated herein by references.

FIELD OF THE INVENTION

The present invention relates to a magnetic sensor having a vertical Hall device and a method for manufacturing the same.

BACKGROUND OF THE INVENTION

In general, a lateral Hall cell detects a magnetic field component perpendicular to a substrate surface (i.e., a chip surface). The lateral Hall cell is disclosed in, for example, "Integrated three-dimensional magnetic sensor" in Journal of Institute of Electrical Engineers of Japan, Vol. 109-C, No. 7, pages 483-490 (1989). However, it is difficult for the lateral Hall device to detect a magnetic field component parallel to the substrate surface.

To detect the magnetic field component parallel to the substrate surface, a vertical Hall device as a vertical type Hall device is provided. The vertical Hall device is disclosed in, for example, Japanese Patent Application Publication No. H01-251763. The vertical Hall cell can detect the magnetic field component in parallel to the chip surface.

However, an epitaxial substrate is necessitated to provide the vertical Hall device. Therefore, the design degree of freedom is limited to use the epitaxial substrate.

SUMMARY OF THE INVENTION

In view of the above-described problem, it is an object of the present invention to provide a vertical Hall device having high design degree of freedom. It is another object of the present invention to provide a method for manufacturing the vertical Hall device having high design degree of freedom.

A vertical Hall device includes: a substrate; a semiconductor region having a first conductive type and disposed in the substrate; and a magnetic field detection portion disposed in the semiconductor region. The magnetic field detection portion is capable of detecting a magnetic field parallel to a surface of the substrate in a case where a current flows through the magnetic field detection portion in a vertical direction of the substrate. The semiconductor region is a diffusion layer including a conductive impurity doped and diffused therein.

In the above device, the semiconductor region is made of a diffusion layer. Therefore, the substrate can be prepared from a single conductive type substrate, an epitaxial substrate, SOI substrate or the like. Thus, the design degree of freedom for selecting the substrate is increased. Thus, the vertical Hall device has high design degree of freedom.

Preferably, the device further includes a separation wall having a second conductive type and disposed in the semiconductor region for separating the magnetic field detection portion electrically. The separation wall provides a current path in such a manner that the separation wall selectively narrows near a bottom of the semiconductor region. More preferably, the separation wall is disposed from the surface of the semiconductor region to a predetermined depth of the semiconductor region so that the current path is formed between a bottom of the separation wall and a bottom of the semiconductor region.

Preferably, the device further includes: a first, a second and a third current supply terminals disposed on the surface of the semiconductor region; and a first and a second voltage output terminals disposed on the surface of the semiconductor region. The first and the second current supply terminals flow the current through the magnetic field detection portion in the vertical direction of the substrate. The first and the third current supply terminals flow the current through the magnetic field detection portion in the vertical direction of the substrate. The first and the second voltage output terminals output a Hall voltage signal corresponding to the magnetic field parallel to the surface of the substrate. The first current supply terminal is disposed between the first and the second voltage output terminals. The second and the third current supply terminals are disposed symmetrically on either side of a line between the voltage output terminals.

Preferably, the surface of the substrate is parallel to a predetermined surface orientation of crystal, which shows a resistance change in accordance with a stress application caused by a Piezo resistance effect, the resistance change of the predetermined surface orientation is smallest among those of other surface orientations.

Further, a method for manufacturing a vertical Hall device includes the steps of: forming a semiconductor region having a first conductive type in a semiconductor substrate in such a manner that an impurity having the first conductive type is doped and diffused in the substrate; and forming a magnetic field detection portion in the semiconductor region. The magnetic field detection portion is capable of detecting a magnetic field parallel to a surface of the substrate in a case where a current flows through the magnetic field detection portion in a vertical direction of the substrate.

The above method provides the vertical Hall device having the substrate. The design degree of freedom for selecting the substrate is increased. Thus, the vertical Hall device has high design degree of freedom.

BRIEF DESCRIPTION OF THE DRAWINGS

The above and other objects, features and advantages of the present invention will become more apparent from the following detailed description made with reference to the accompanying drawings. In the drawings:

FIG. 31A is a plan view showing a vertical Hall device, and FIG. 31B is a schematic circuit diagram showing the device, according to a eleventh embodiment of the present invention;

DETAILED DESCRIPTION OF THE PREFERRED EMBODIMENTS

First Embodiment

The inventor have preliminarily studied about a Hall cell as a comparison of a Hall device according to a first embodiment of the present invention. Firstly, FIG. 46 explains a magnetic field detection principle of the Hall cell. Here, the Hall cell is capable of detecting not only a magnetic field but also an angle without contacting the cell. Therefore, for example, the Hall cell is mounted on a Hall IC so that the Hall cell detects an angle of, for example, a throttle valve opening degree in an auto motive vehicle.

Figure 46:
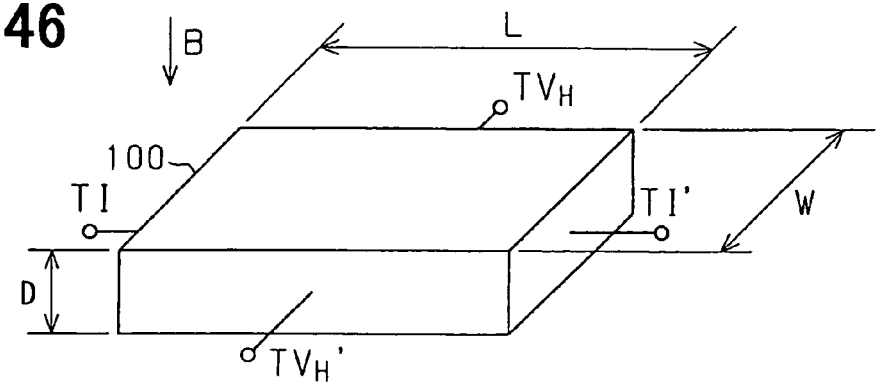
FIG. 46 is a schematic perspective view explaining a magnetic detection function of a Hall cell as a comparison of the first embodiment.

In FIG. 46, when a current flows through a substance, and a magnetic field perpendicular to the current is applied to the substance, a new electric field is generated to be perpendicular to both of the current and the magnetic field. Thus, Hall voltage corresponding to the electric field is generated by this Hall effect. For example, in a Hall cell 100 in FIG. 46, a Hall plate as a magnetic field detection portion of the cell has a width defined as W, a length defined as L, and a thickness defined as D. An angle between the cell 100 and the magnetic field is defined as θ, a magnetic flux density of the magnetic field is defined as B, and a current flowing through a pair of terminals TI, TI' is defined as I. In this case, a Hall voltage $V_H$, which is generated between the terminals $TV_H$, $TV_H'$, is shown as following relationship:

$$V_H = (R_H I B/D) \cos\theta, \text{ and}$$

$$R_H = 1/(QN).$$

Here, a Hall coefficient is defined as $R_H$, a charge is defined as Q, and a carrier density in the cell is defined as N.

Figure 47A:
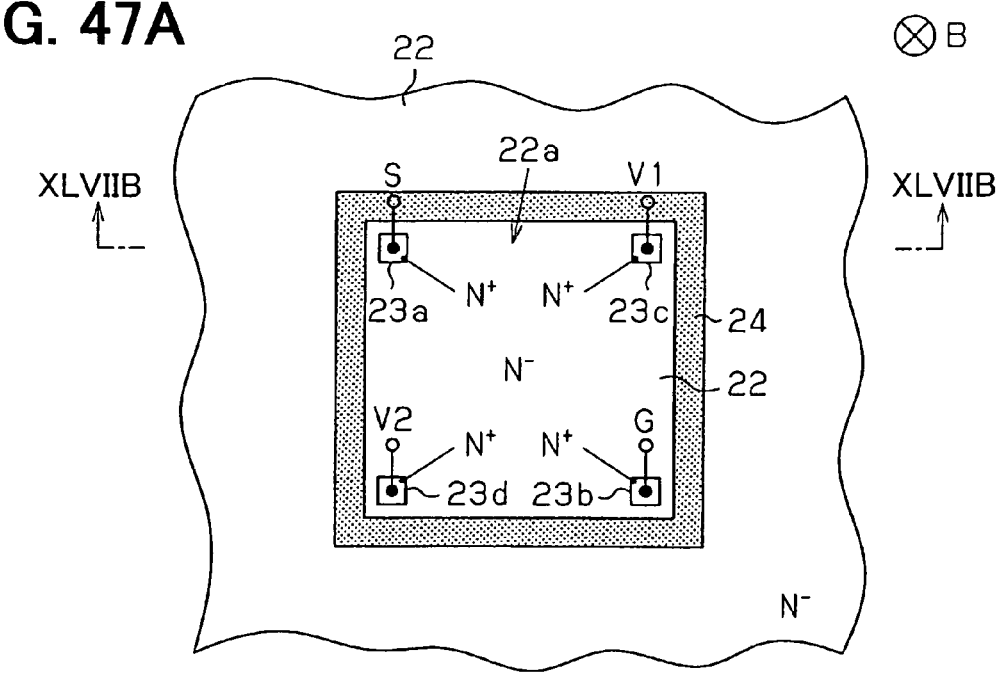
FIG. 47A is a plan view showing a vertical Hall device according to a first comparison sample of the first embodiment.
Figure 47B:
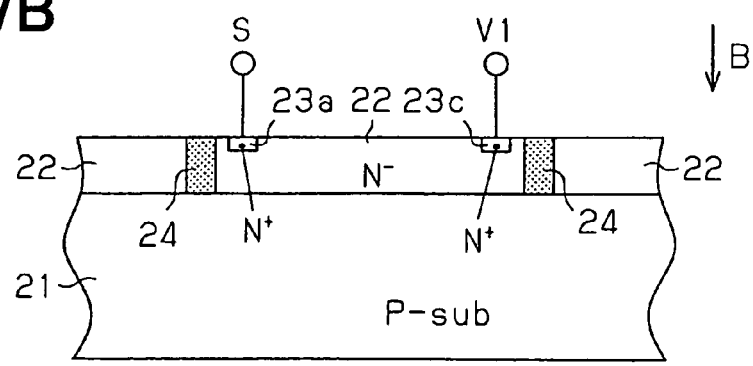
FIG. 47B is a cross sectional view showing the device taken along line XLVIIB-XLVIIB in FIG. 47A.

Therefore, the Hall voltage $V_H$ is changed in accordance with the angle θ between the Hall cell and the magnetic field. To use this relationship, the angle θ can be detected by the Hall cell. Thus, the Hall IC provides an angle detection sensor. In general, a lateral Hall cell detects a magnetic field component perpendicular to a substrate surface (i.e., a chip surface). The lateral Hall cell shown in FIGS. 47A and 47B is composed of a semiconductor substrate (i.e., P-sub) 21 and a semiconductor region 22. The semiconductor substrate 21 has P type conductivity and is made of silicon. The semiconductor region 22 having N type conductivity is made of silicon, and is deposited on the substrate 21 by an epitaxial growth method. The semiconductor region (i.e., N⁻ region) 22 has an impurity concentration in a range between $1.0 \times 10^{14}$ and $1.0 \times 10^{17}$.

In the region 22, a diffusion layer 24 as a P type diffusion separation wall is formed so that the diffusion layer 24 separates between the Hall cell and other electric parts. The diffusion layer 24 reaches the semiconductor substrate 21. An active region 22a surrounded by the diffusion region 24 is disposed on the surface of the semiconductor region 22. In the active region 22a, a contact regions 23a-23d as a N⁺ diffusion region is formed. The contact region 23a-23d has high impurity concentration selectively increased. Each contact region 23a-23d has an electrode, which is connected to the contact region 23a-23d with excellent ohmic contact. Specifically, the contact regions 23a-23d are disposed on corners of the active region 22a so that a line connecting between the contact regions 23a, 23b is perpendicular to another line connecting between the contact regions 23c, 23d. The contact region 23a is electrically connected to a terminal S, the contact region 23b to a terminal G, the contact region 23c to a terminal V1, and the contact region 23d to a terminal V2.

For example, when a driving current flows from the terminal S to the terminal G, the current flows into the contact region 23b in the semiconductor region 22 through the contact region 23a. In this case, the current mainly flows near the surface of the semiconductor region 22 so that the current mainly includes a component flowing in parallel to the surface of the semiconductor region 22, which is defined as a chip surface. At this time, when the magnetic field including a perpendicular component perpendicular to the current, i.e., perpendicular to the chip surface, is applied to the cell, the Hall voltage is generated between the terminals V1, V2 according to Hall effect. Here, an arrow B shown in FIGS. 47A and 47B represents the magnetic field. Accordingly, the Hall voltage between the terminals V1, V2 is detected so that the magnetic field component perpendicular to the chip surface is obtained from the above formula. Here, the driving current can flow between the terminals V1, V2 so that the Hall voltage is detected between the terminals S, G. Therefore, by switching the driving current periodically, the offset voltage (i.e., nonequilibrium voltage) of the cell is compensated.

Figure 48A:
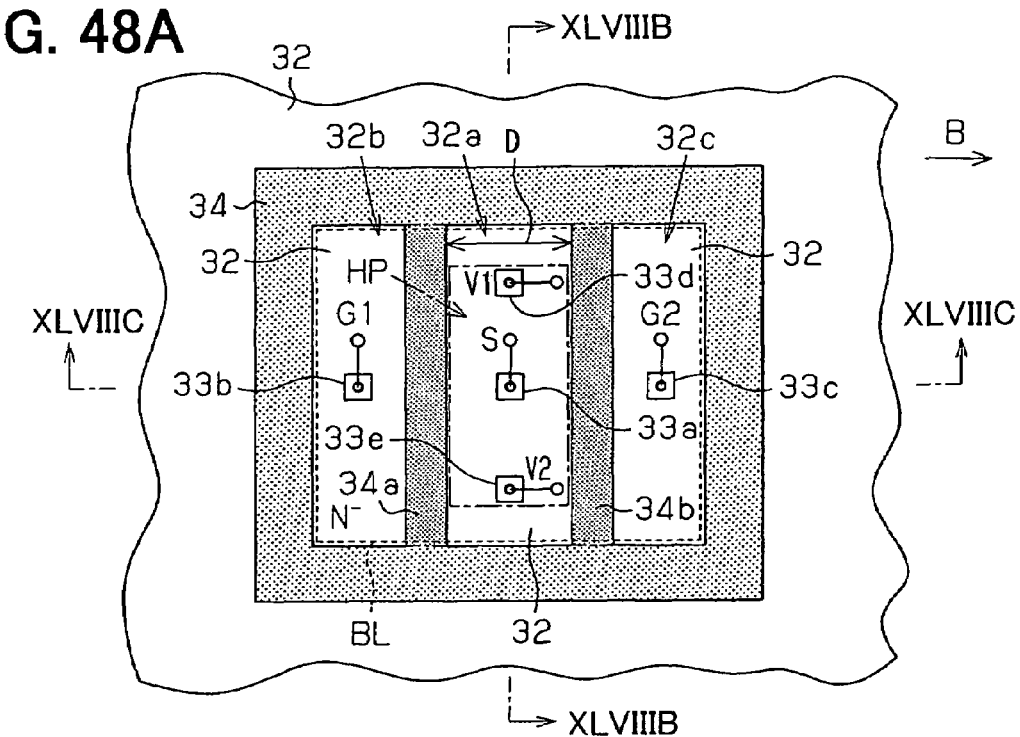
FIG. 48A is a plan view showing a vertical Hall device according to a second comparison sample of the first embodiment.
Figure 48B:
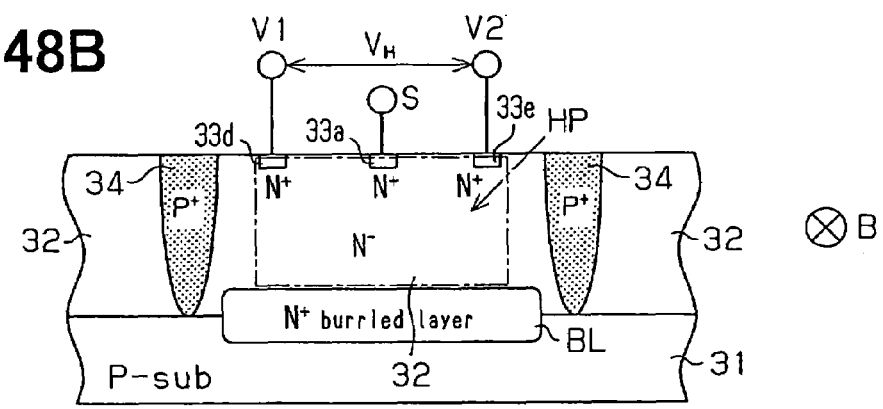
FIG. 48B is a cross sectional view showing the device taken along line XLVIIIB-XLVIIIB in FIG. 48A.
Figure 48C:
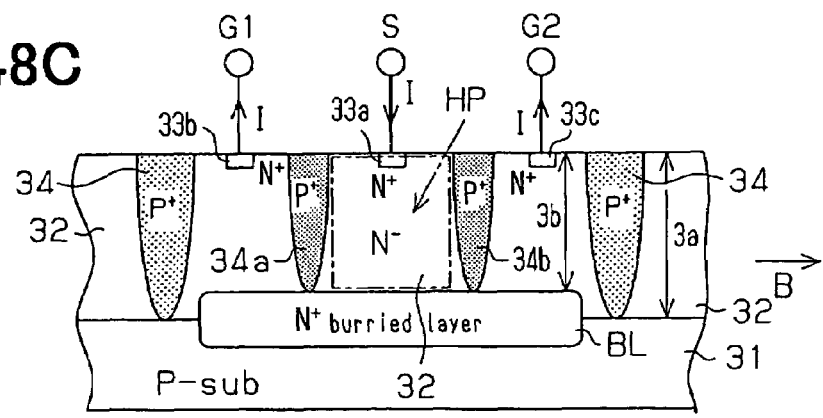
FIG. 48C is a cross sectional view showing the device taken along line XLVIIIC-XLVIIIC in FIG. 48A.

Although the above Hall cell is a lateral type Hall device, a vertical Hall device as a vertical type Hall device as a comparison of the Hall device according to the first embodiment is prepared. FIGS. 48A to 48C show the vertical Hall cell, which detects the magnetic field component in parallel to the chip surface. This Hall device is capable of including two Hall cells, which are integrated on a semiconductor substrate 31. Two Hall cells detect magnetic field having different phases (i.e., angles). This two Hall cells are disposed to have an angle of 90 degrees therebetween so that the Hall device can output a linear output (i.e., a linear voltage signal) in a range between 0° and 360°. Thus, the Hall device provides a rotation sensor. As shown in FIGS. 48A to 48C, the Hall device is made of semiconductor substrate having an epitaxial layer, i.e., an epitaxial substrate. Specifically, the Hall device includes a semiconductor substrate 31 (i.e., P-sub) made of P conductive type silicon. An embedded layer BL disposed on a surface portion of the substrate 31. The embedded layer BL is formed by doping a N conductive type impurity. A semiconductor region 32 is formed on the substrate 31 and the embedded layer BL. The semiconductor region 32 has a N conductive type silicon, which is formed by an epitaxial growth method. The embedded layer BL works as a lower electrode, and the impurity concentration of the embedded layer BL is higher than that of the semiconductor region 32. In the Hall device, the depth 3a of the semiconductor region 32 is, for example, 9.5 μm. An embedded depth 3b between the surface of the semiconductor region 32 and the embedded layer BL is, for example, 5.5 μm. The thickness of the embedded layer BL is, for example, 6.0 μm.

In the semiconductor region 32, a diffusion layer 34 having P conductive type as a P conductive type diffusion separation wall is formed to contact the semiconductor substrate 31 so that the diffusion layer 34 separates the Hall cell from other parts. Multiple contact regions 33a-33e are formed in the semiconductor region 32, and the contact regions 33a-33e are surrounded by the diffusion layer 34. Specifically, the contact regions 33a-33e are disposed in a region, i.e., an active region, which is surrounded with the diffusion layer 34. The contact regions 33a-33e are formed by increasing the impurity concentration selectively. The contact regions 33a-33e have the N conductive type. Thus, each contact region 33a-33e is connected to an electrode disposed on the contact region 33a-33e with excellent ohmic contact. The contact regions 33a-33e are electrically connected to terminals S, G1, G2, V1, V2, respectively, through the electrodes and wirings.

Further, the active region surrounded with the diffusion layer 34 is divided into three regions 32a-32c so that P conductive type diffusion layers 34a, 34b as a P conductive type diffusion separation wall are separated by a PN junction separation wall disposed at an interface between the diffusion layers 34a, 34b and the regions 32a-32c. The diffusion layers 34a, 34b contact the substrate 32 so that the regions 32a-32c are electrically separated each other.

Further, in the regions 32a-32c, the contact regions 33a, 33d, 33e are disposed in the region 32a, the contact region 33b is disposed in the region 32b, and the contact region 33c is disposed in the region 32c. The contact region 33a is sandwiched between the contact regions 33b, 33c and the contact regions 33d, 33e, which are perpendicular to the contact regions 33b, 33c. Thus, the contact region 33a is disposed to face both of the contact regions 33b, 33c through the diffusion layers 34a, 34b.

In the Hall device, a region sandwiched between the contact regions 33d, 33e provides a magnetic field detection portion HP as a Hall plate. The detection portion HP is electrically separated from other portions in the region 32a. Thus, the Hall cell generates a Hall voltage signal corresponding to the magnetic field applied to the detection portion HP.

Here, for example, a driving current flows from the terminal S to the terminal G1 and from the terminal S to the terminal G2. The driving current has a predetermined constant current. The driving current flows from the contact region 33a disposed on the substrate 31 to the contact regions 33b, 33c through the detection portion HP and the embedded layer BL. In this case, in the magnetic field detection portion HP, the current having a component perpendicular to the chip surface flows through the detection portion HP. Therefore, when the driving current flows through the detection portion HP, the magnetic field including a component parallel to the chip surface is applied to the detection portion HP in the Hall cell. The magnetic field B is shown in FIGS. 48A to 48C. In this case, the Hall voltage is generated between the terminals V1, V2 by the Hall effect. The Hall voltage corresponds to the magnetic field. Accordingly, by measuring the Hall voltage between the terminals V1, V2, the magnetic field component parallel to the chip surface, i.e., the surface of the substrate 32, is obtained on the basis of the above formula, i.e., "$V_H = (R_H I B/D) \cos \theta$." In this Hall cell, the thickness defined as D corresponds to the thickness of the detection portion HP. Here, the direction of the driving current in the Hall cell can be set any direction as long as the driving current has the component perpendicular to the chip surface. For example, the driving current can flow in an opposite direction from the contact regions 33b, 33c to the contact region 33a.

Figure 49A:
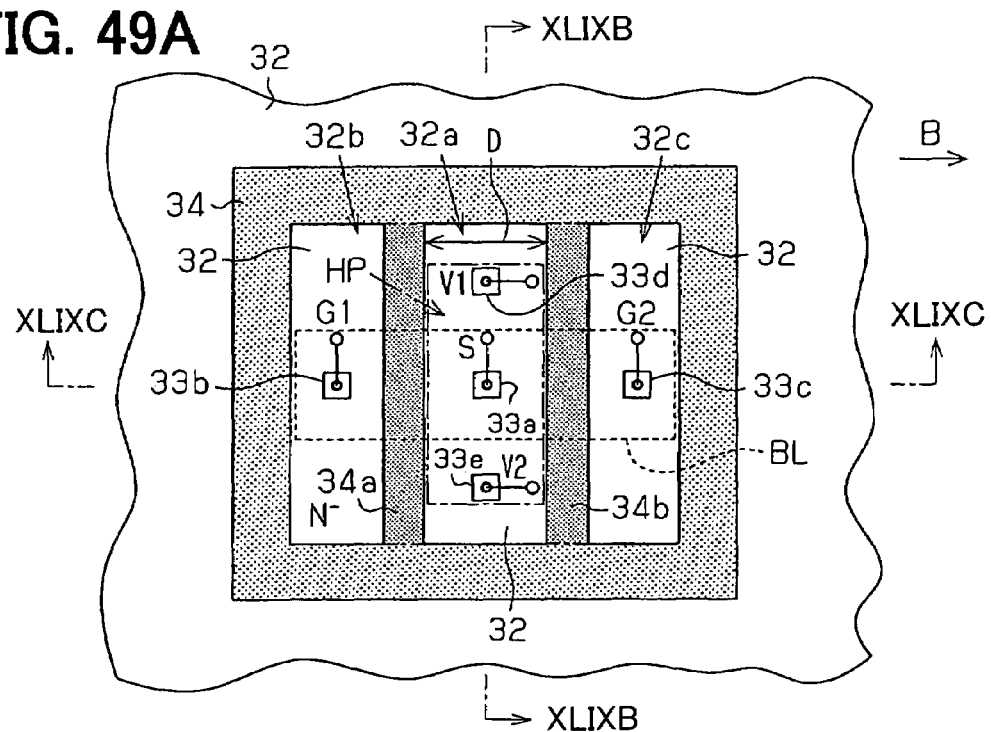
FIG. 49A is a plan view showing a vertical Hall device according to a third comparison sample of the first embodiment.
Figure 49B:
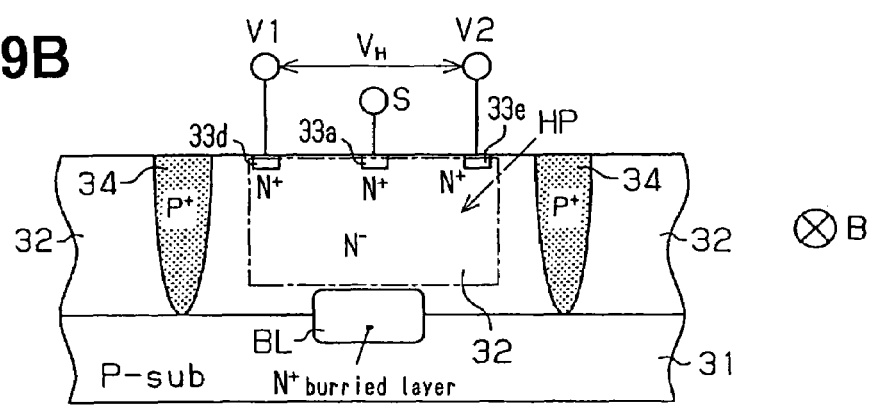
FIG. 49B is a cross sectional view showing the device taken along line XLIXB-XLIXB in FIG. 49A.
Figure 49C:
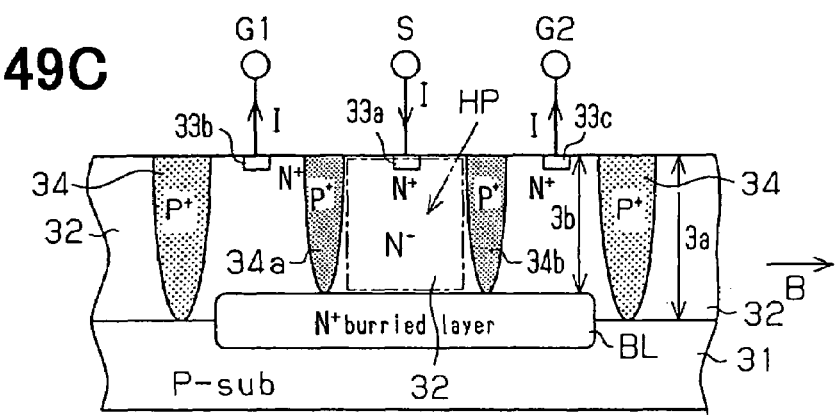
FIG. 49C is a cross sectional view showing the device taken along line XLIXC-XLIXC in FIG. 49A.

Further, to increase the sensitivity of the Hall cell, another Hall device has been studied. The Hall device is shown in FIGS. 49A to 49C. In the Hall device, the width of the embedded layer BL becomes narrower so that the substantial current path of the detection portion HP becomes narrower. Thus, the magnetic field detection sensitivity is increased.

Thus, the magnetic field component parallel to the chip surface applied to the detection portion HP is detected by the vertical type Hall device shown in FIGS. 48A to 48C or in FIGS. 49A to 49C. In these Hall devices, the embedded layer BL is formed so that the current path near the bottom of the semiconductor region 32 is appropriately secured. Further, in the Hall device shown in FIGS. 49A to 49C, the width of the embedded layer BL becomes narrower, the magnetic field detection sensitivity is increased.

However, the epitaxial substrate is necessitated to provide these vertical type Hall devices. Therefore, the design degree of freedom is limited to use the epitaxial substrate.

In view of the above limitation, a new vertical type Hall device and a method for manufacturing the Hall device according to a first embodiment of the present invention are provided.

Figure 1A:
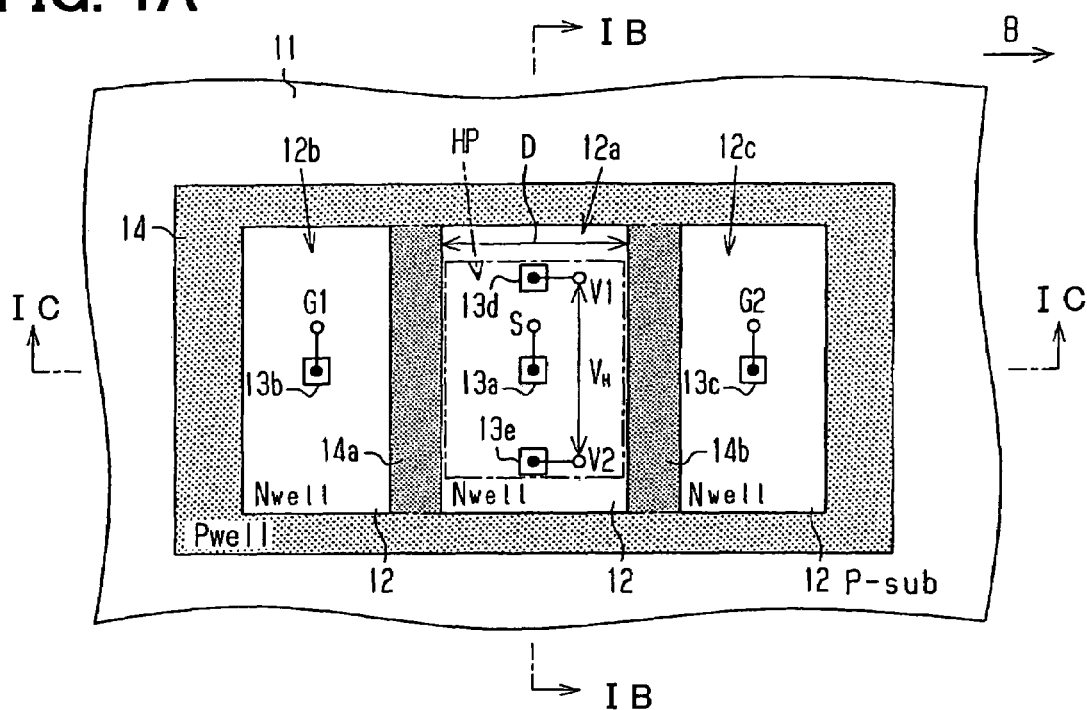
FIG. 1A is a plan view showing a vertical Hall device according to a first embodiment of the present invention.
Figure 1B:
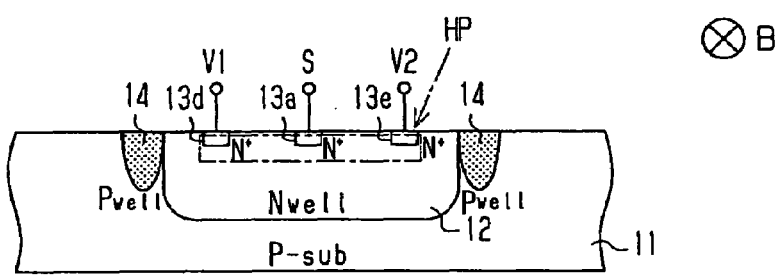
FIG. 1B is a cross sectional view showing the device taken along line IB-IB in FIG. 1A.
Figure 1C:
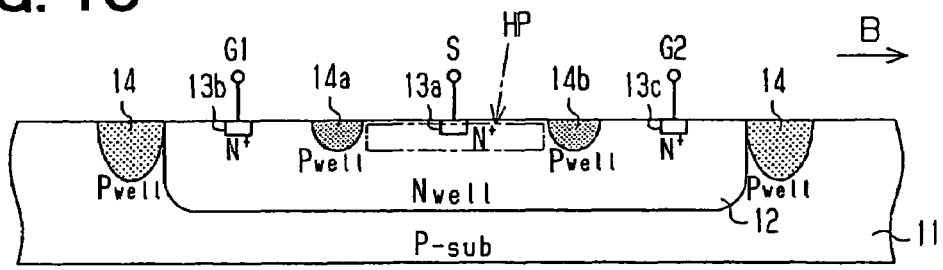
FIG. 1C is a cross sectional view showing the device taken along line IC-IC in FIG. 1A.

The vertical Hall device according to the first embodiment of the present invention is shown in FIGS. 1A to 1C. The Hall device is formed on a P conductive type silicon substrate 11 as a P-sub having a principal surface of a (100) crystal surface orientation, i.e., a (100)-surface orientation. Thus, the Hall device is made of a single conductive type semiconductor substrate instead of an epitaxial substrate. A semiconductor region 12 having the N conductive type is formed on the substrate 11. The semiconductor region 12 is formed by doping the N conductive type impurity so that the semiconductor region 12 is provided as a diffusion layer. Specifically, the semiconductor region 12 as a N well is embedded in the substrate 11 so that the semiconductor region 12 is surrounded with the semiconductor substrate 11.

In general, a (100)-surface orientation in a silicon substrate has the smallest resistance change in accordance with a stress applied to the substrate among other surface orientations. The resistance change is caused by a Piezo electric effect. Therefore, when the Hall cell is formed of the substrate having the (100)-surface orientation, an offset voltage of the Hall device is reduced. The offset voltage is arisen from a stress application in a case where the Hall device is packaged.

Further, the N conductive type semiconductor substrate has large carrier mobility larger than that of the P conductive type semiconductor substrate. Therefore, it is preferred that the semiconductor region 12 in the Hall device is made of the N conductive type semiconductor layer. However, the semiconductor region 12 can be made of the P conductive type semiconductor layer. Specifically, the semiconductor region 12 can be made of the P− conductive type semiconductor layer. Further, as the impurity concentration of the semiconductor region 12 becomes smaller, the carrier mobility in the semiconductor region 12 becomes larger. In this case, the sensitivity of the Hall device as the magnetic field detection device is increased. This is, the output voltage as the detection signal becomes larger. Therefore, it is preferred that the impurity concentration of the semiconductor region 12 is small. On the other hand, as the carrier mobility of the semiconductor region 12 becomes larger, the temperature characteristics of the Hall voltage as the output signal deteriorates. Specifically, the Hall voltage is much changed in accordance with temperature change when the carrier mobility is large. Thus, the impurity concentration of the semiconductor region 12 is determined appropriately in view of the above relationships. The impurity concentration of the semiconductor region 12 is, for example, in a range between $1.0 \times 10^{14}/cm^3$ and $1.0 \times 10^{17}/cm^3$.

In the Hall device, a diffusion layer 14 as a P conductive type diffusion separation wall is formed so that the diffusion layer 14 separates the Hall cell from other parts. Multiple contact regions 13a-13e are formed on the surface of the semiconductor region 12. Specifically, the contact regions 13a-13e are disposed in an active region, which is surrounded with the diffusion layer 14. The contact regions 13a-13e are formed by increasing the impurity concentration selectively. The contact regions 13a-13e have the N conductive type. Each contact region 13a-13e is connected to an electrode disposed on the contact region 13a-13e with excellent ohmic contact. Further, each contact region 13a-13e is electrically connected to the terminal S, G1, G2, V1, V2, respectively, through the electrode and a wiring. The contact regions 13a, 13b provide a pair corresponding to a current supply pair, and the contact regions 13a, 13c provide another pair corresponding to another current supply pair. The contact regions 13d, 13e provide a pair corresponding to a voltage output pair.

The active region surrounding with the diffusion layer 14 is divided into three regions 12a-12c with PN junctions provided by an interface between diffusion layers 12, 14a, 14b. Specifically, three regions 12a-12c are separated with the P conductive type diffusion layers 14a, 14b as a P conductive type diffusion separation wall. Here, each diffusion layer 14a, 14b has a shallow diffusion depth shallower than the semiconductor region 12. Specifically, the depth of the diffusion layer 14a, 14b is smaller that that of the semiconductor region 12. The bottom of the semiconductor region 12 becomes narrower selectively so that the current path becomes narrower. The regions 12a-12c are electrically separated each other in the semiconductor region 12.

In the regions 12a-12c, the contact regions 13a, 13d, 13e are disposed on the region 12a, the contact region 13b is disposed on the region 12b, and the contact region 13c is disposed on the region 12c. The contact region 13a is sandwiched between the contact regions 13b, 13c, and is sandwiched between the contact regions 13d, 13e. A line connected between the contact regions 13d, 13e is perpendicular to another line connected between the contact regions 13b, 13c. Thus, the contact region 13a is disposed to face the contact region 13b, 13c through the diffusion layer 14a, 14b.

In the Hall device, the magnetic field detection portion HP as the Hall plate is provided by a region sandwiched between the contact regions 13d, 13e, the region which is disposed in the region 12a and separated from other parts. When the magnetic field is applied to the detection portion HP, the Hall voltage is generated. The Hall voltage as the output voltage corresponds to the magnetic field applied to the detection portion HP. The contact region 13a, which corresponds to one terminal of a pair of current supply terminals, is sandwiched between the contact regions 13a, 13e, which correspond to a pair of voltage output terminals. The contact regions 13b, 13c, which correspond to the other terminal of the current supply terminals, are disposed in line symmetry of the voltage output terminals. Thus, a component of the Hall voltage, which is generated in accordance with the current flowing in a lateral direction of the detection portion HP, i.e., the current flowing in parallel to the chip surface, is cancelled. Thus, the magnetic field component parallel to the chip surface can be detected with high accuracy. Further, the diffusion layers 14a, 14b prevent the current from flowing in the lateral direction, i.e., the direction parallel to the chip surface. Thus, the detection accuracy is much improved.

Here, for example, a driving current flows from the terminal S to the terminal G1 and from the terminal S to the terminal G2. The driving current has a predetermined constant current. The driving current flows from the contact region 13a disposed on the substrate 11 to the contact regions 13b, 13c through the detection portion HP and the bottom of the diffusion layers 14a, 14b. In this case, in the magnetic field detection portion HP, the current having a component perpendicular to the chip surface flows through the detection portion HP. Therefore, when the driving current flows through the detection portion HP, the magnetic field including a component parallel to the chip surface is applied to the detection portion HP in the Hall cell. The magnetic field B is shown in FIGS. 1A to 1C. In this case, the Hall voltage $V_H$ is generated between the terminals V1, V2 by the Hall effect. The Hall voltage $V_H$ corresponds to the magnetic field. Accordingly, by measuring the Hall voltage $V_H$ between the terminals V1, V2, the magnetic field component parallel to the chip surface, i.e., the surface of the substrate 11, is obtained on the basis of the above formula "$V_H = (R_H IB/D) \cos \theta$." In this Hall cell, the thickness defined as D corresponds to the thickness of the detection portion HP. Here, the direction of the driving current in the Hall cell can be set any direction as long as the driving current has the component perpendicular to the chip surface. For example, the driving current can flow in an opposite direction from the contact regions 13b, 13c to the contact region 13a.

Thus, in the vertical Hall device, the N conductive type impurity is doped and diffused on the surface of the semiconductor substrate 11 so that the semiconductor region 12 as the diffusion well is formed. Accordingly, the Hall device can be made of the single conductive type substrate. The design degree of freedom for selecting the substrate composing the Hall device is increased. Further, the Hall device has no embedded layer BL shown in FIGS. 48A to 48C or in FIGS. 49A to 49C. Therefore, a positioning error in a case where the embedded layer BL is formed in the substrate and an increase of the offset voltage attributed to the positioning error are not caused in the Hall device according to the first embodiment. Further, in the embedded layer BL made of the diffusion layer shown in FIGS. 48A to 48C or in FIGS. 49A to 49C, a coefficient of resistance change in accordance with temperature change having a unit of $\Omega/°$ C. correlates with the impurity concentration. The impurity concentration of the embedded layer BL is deviated from a predetermined value in a manufacturing process of the embedded layer BL. Therefore, when multiple Hall devices having the embedded layer BL are manufactured in large quantities, or when multiple Hall devices are formed on one chip, the impurity concentration of the embedded layer BL is deviated. Therefore, the temperature characteristics of the magnetic field detection sensitivity among the Hall devices are deviated. Further, when the Hall device includes a temperature compensation circuit for compensating the deviation of the temperature characteristics, the dimensions of the Hall device becomes larger. However, the Hall device according to the first embodiment with no embedded layer BL has excellent temperature characteristics.

Figure 2:
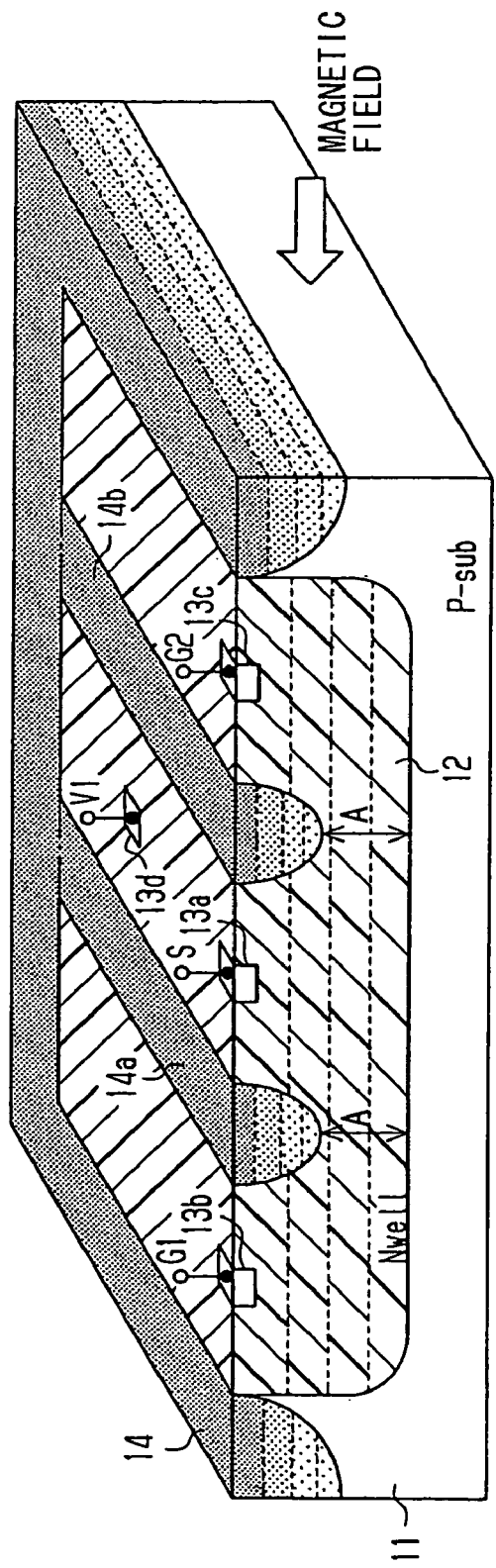
FIG. 2 is a schematic perspective view explaining an impurity concentration profile in the device according to the first embodiment.

Next, the detailed construction of the Hall device is described with reference to FIG. 2. Specifically, the impurity concentrations and concentration profiles in the semiconductor region 12 and other parts are described. FIG. 2 is a schematic cross sectional perspective view showing the Hall device taken along line IC-IC in FIG. 1A.

In general, when an impurity is doped on the surface of a semiconductor substrate and the impurity is diffused in the substrate so that a diffusion layer is formed, a width of the diffusion layer in the substrate becomes narrower as a depth from the surface of the substrate becomes deeper. Therefore, in a vertical Hall device having a magnetic field detection portion divided by the diffusion layer, for example, in the device shown in FIGS. 48A to 48C, the current flowing through the magnetic field detection portion HP becomes broader as the depth from the surface becomes deeper. Thus, the sensitivity of the magnetic field is reduced. However, in the vertical Hall device according to the first embodiment, the impurity concentration of the semiconductor region 12 composing the magnetic field detection portion HP and the impurity concentration of the diffusion layers 14a, 14b for dividing the magnetic field detection portion HP are decreased as the depth from the surface becomes deeper. Thus, the surface provides the maximum impurity concentrations of them. This is shown as a contrasting density of hatchings in FIG. 2. In FIG. 2, as the hatching becomes thicker, the impurity concentration becomes higher. The width of a depletion layer depends on the impurity concentration near the PN junction. The width of the diffusion layers 14a, 14b becomes narrower as the depth from the surface becomes deeper. These narrowing of the width of the diffusion layers 14a, 14b and high density effect of the impurity concentration are mutually affected so that the magnetic field detection portion HP is defined along with the vertical direction of the chip surface of the device. Thus, the current flowing through the magnetic field detection portion HP is limited from expanding. Accordingly, the current component flowing in the vertical direction of the chip surface is increased relatively. Thus, the sensitivity of the magnetic field is increased. Here, the sensitivity of the device is defined as a product sensitivity constant.

Figure 3:
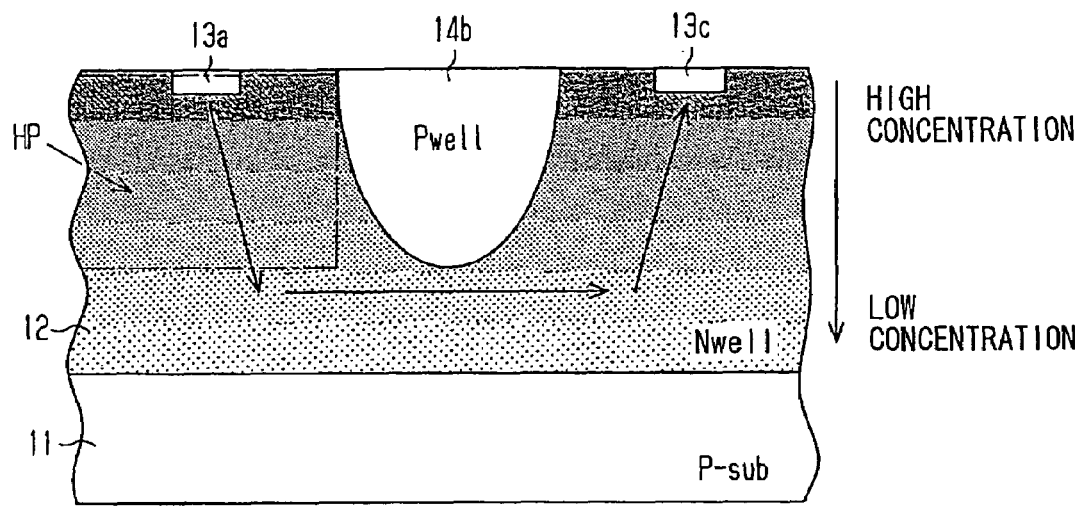
FIG. 3 is a partially enlarged cross sectional view explaining an impurity concentration profile in a semiconductor region of the device according to the first embodiment.

FIG. 3 shows a partially enlarged cross sectional view showing a part of the device. In FIG. 3, a contrasting density of hatchings represents the impurity concentration, and further, an arrow represents a flowing direction of the current. The semiconductor region 12 has the maximum impurity concentration near the surface of the device so that the impurity concentration of the semiconductor region 12 is reduced as the depth from the surface becomes deeper. Here, for example, when the current is supplied to the contact region 13c from the contact region 13a, the current flows through a portion having high impurity concentration, which has a low resistance. Thus, the current flows just under the diffusion layer 14b. Therefore, the current in the magnetic field detection portion HP flows in a slant direction, which is slanted from the vertical direction of the chip surface.

In the vertical Hall device shown in FIGS. 48A to 48C, the semiconductor region 32 is formed as the epitaxial layer. Therefore, the impurity concentration in the semiconductor region 32 is substantially homogeneous. Thus, the width of the depletion layer in a depth direction becomes almost the same. Thus, the current flowing through the magnetic field detection portion HP becomes broader. Thus, the sensitivity is reduced. In the Hall device shown in FIGS. 48A to 48C, the width of the embedded layer BL becomes narrower as the depth becomes deeper. Thus, the current is slightly limited from broadening. However, the offset voltage of the device may be increased. In the Hall device according to the first embodiment, the sensitivity of the device is increased without increasing the offset voltage.

A dimension A shown in FIG. 2 represents a width of the current path in the vertical direction. Specifically, the current path is disposed under the diffusion layers 14a, 14b, and disposed near the bottom of the semiconductor region 12. To increase the sensitivity of the Hall device, it is preferred for the dimension A of the current path to become narrower. Thus, it is preferred that the depth of the diffusion layers 174a, 14b becomes deeper. This result is confirmed by an experiment and a simulation performed by the inventor.

Figure 4:
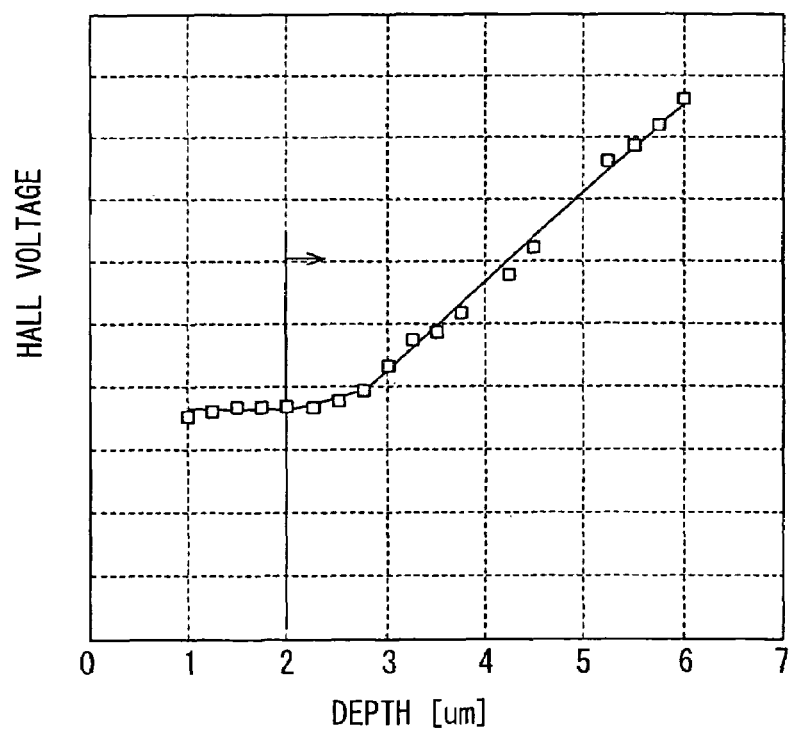
FIG. 4 is a graph showing a relationship between a Hall voltage and a diffusion depth of a separation wall in the device according to the first embodiment.

FIG. 4 shows a simulation result. In FIG. 4, a vertical axis represents a Hall voltage, and a horizontal axis represents a diffusion depth of the diffusion layer 14a, 14b. When the diffusion depth is equal to or deeper than 2 μm, the Hall voltage as the output voltage begins to increase. Further, when the diffusion depth is equal to or deeper than 3 μm, the Hall voltage increases rapidly. Therefore, in the Hall device according to the first embodiment, the diffusion depth of the diffusion layer 14a, 14b is equal to or deeper than 2 μm. In this case, the current flowing through the magnetic field detection portion HP is suppressed from broadening in the horizontal direction. Thus, the sensitivity of the device is improved. Preferably, the diffusion depth of the diffusion layer 14a, 14b is equal to or deeper than 3 μm.

Figure 5A:
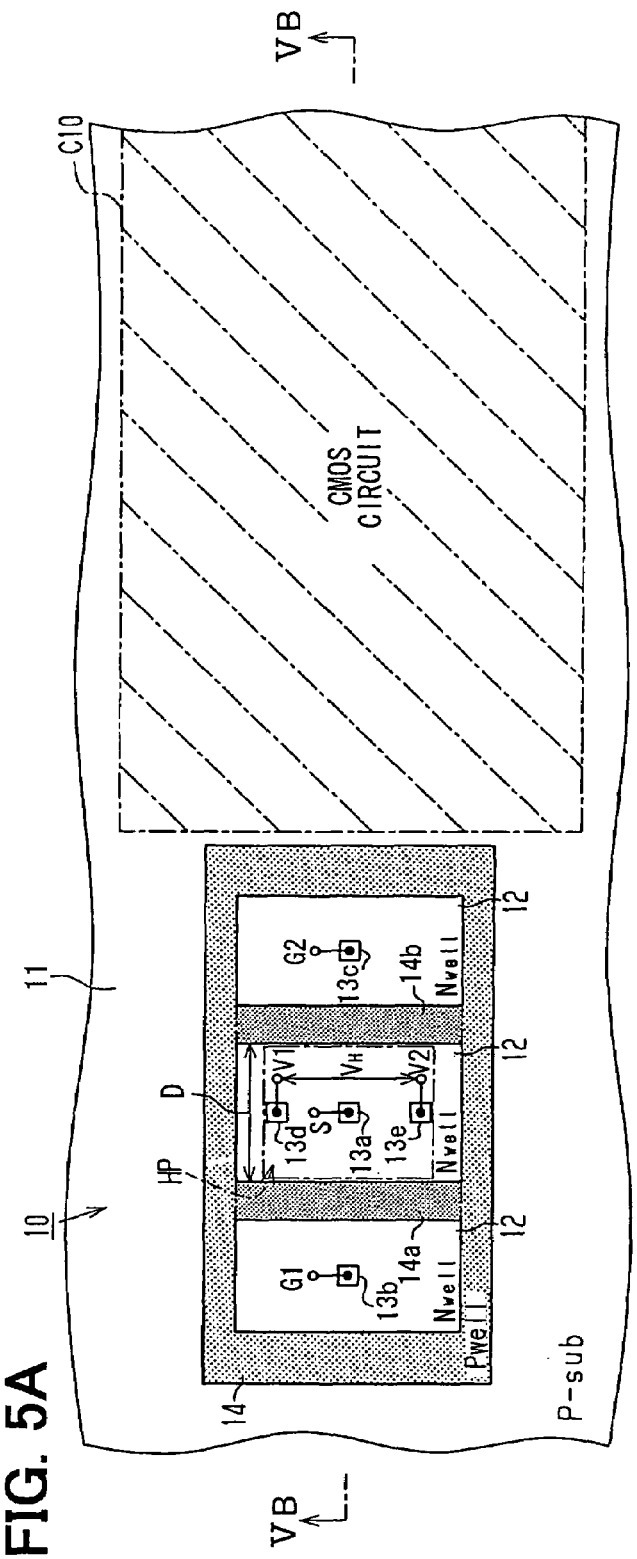
FIG. 5A is a plan view showing another vertical Hall device according to the first embodiment.
Figure 5B:
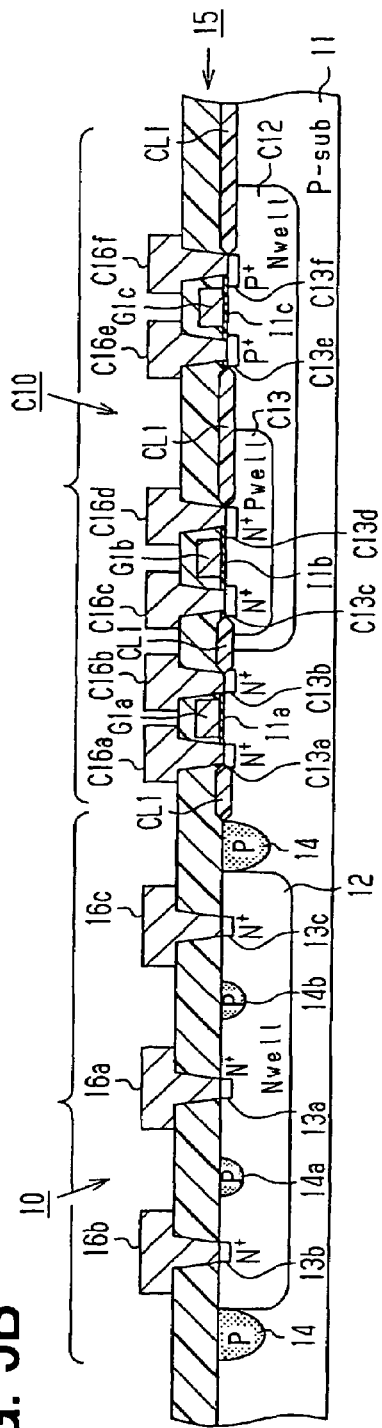
FIG. 5B is a cross sectional view showing the device taken along line VB-VB in FIG. 5A.

The Hall device can include a signal processing circuit, a compensation circuit and a temperature compensation circuit. The signal processing circuit processes the Hall voltage outputted from the Hall cell on the basis of a predetermined signal processing. The compensation circuit computes and compensates the offset voltage. The temperature compensation circuit computes and compensates the temperature deviation of the Hall voltage. FIGS. 5A and 5B show the Hall device having a periphery circuit portion C10 and a Hall cell portion 10 such as the signal processing circuit, the compensation circuit and the temperature compensation circuit.

The periphery circuit portion C10 includes a CMOS (i.e., complementary metal oxide semiconductor) circuit. The circuit portion C10 further includes multiple FETs (i.e., field effect transistor) having channels composed of the semiconductor substrate 11, a N conductive type semiconductor region C12 as a N well, and a P conductive type diffusion layer C13 as a P well. In the FET, a N conductive type diffusion layers C13a-C13d as a N+ diffusion layer provide a source, and a P conductive type diffusion layers C13e, C13f as a P+ diffusion layer provide a drain. To control the current flowing between the source and the drain, gate insulation films I1a-I1c are formed, and gate electrodes G1a-G1c are formed of a poly crystalline silicon. The FETs are separated each other with a field oxide film (i.e., a LOCOS oxide film) CL1 having a LOCOS (i.e., local oxidation of silicon) construction. Further, an insulation film 15 made of PSG (i.e., phosphor silicate glass) is formed on the field oxide film CL1. Each diffusion layer C13a-C13f is connected to a wiring, i.e., an electrode C16a-C16f through a contact hole formed in the insulation film 15. The electrode C16a-C16f is made of aluminum.

Thus, the Hall device includes the CMOS circuit as a periphery circuit. Thus, the following advantages are expected.

The Hall device with the periphery circuit can be integrated with high density, i.e., the dimensions of the Hall device can be minimized. Therefore, when the Hall device includes the compensation circuit, the compensation circuit can compensate the output signal with high accuracy. Further, the Hall device with the periphery circuit portion C10 can include a high-speed circuit. For example, when the Hall device is used for a rotation sensor, the Hall device is required to detect a high-speed rotation with high accuracy. In this case, the CMOS circuit as the periphery circuit provides the high-speed circuit so that the Hall device can detect high speed rotation with high response speed. Thus, the Hall device can detect the rotation with high accuracy.

Further, the Hall device has small energy consumption, since the CMOS is used as the periphery circuit. Specifically, standby power consumption of the CMOS is low so that the Hall device totally consumes small energy. Therefore, when the Hall device is energized from a battery, the battery can supply energy to the Hall device for a long time.

Furthermore, the Hall device and the periphery circuit can be integrated into one chip. Therefore, a manufacturing cost of the Hall device is reduced.

Figure 6:
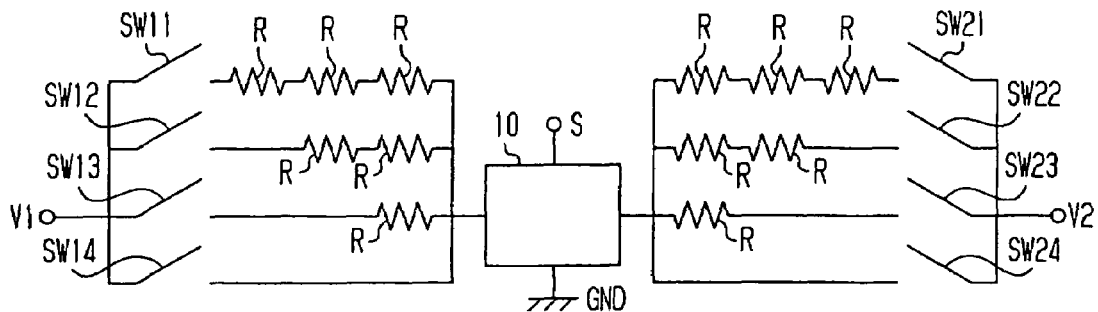
FIG. 6 is a circuit diagram showing the device according to the first embodiment.
Figure 7:
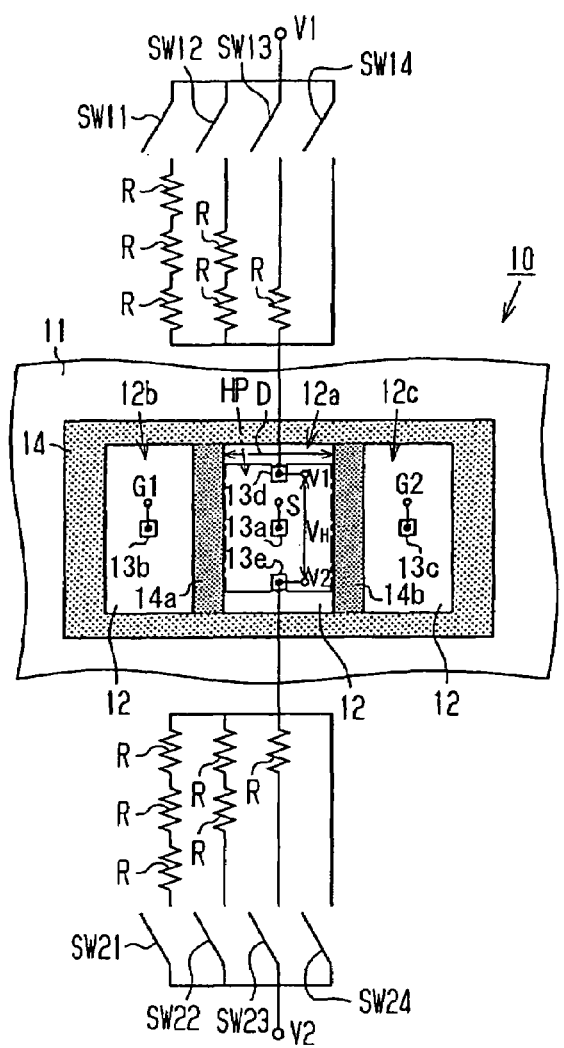
FIG. 7 is a schematic circuit diagram showing the device according to the first embodiment.

Further, in the vertical Hall device, the contact regions 13d, 13e corresponding to a pair of voltage output terminals output the Hall voltage as a Hall voltage signal in such a manner that the Hall voltage signal is outputted through a wiring having a variable resistance. FIGS. 6 and 7 show wiring diagrams of the Hall device. In FIGS. 6 and 7, R represents a resistance. Multiple wirings having different resistances are disposed between the Hall cell portion 10 and a pair of terminals V1, V2 as the voltage output terminals. The wirings are connected in parallel electrically. These wirings are connected and disconnected by multiple switches SW11-SW14, SW21-SW24. Thus, the switches SW11-SW14, SW21-SW24 turn on and/or off so that a combination of the wirings can be selected. Thus, in a case where the device outputs a certain Hall voltage as the offset voltage when no magnetic field is applied to the device, the wirings are selected appropriately so that the offset voltage becomes smaller. Specifically, the resistance of the wirings disposed between the terminals V1, V2 for outputting the Hall voltage is selected appropriately so that the offset voltage reaches zero. Thus, the offset voltage of the device is compensated and reduced. Here, although the Hall cell portion 10 and the periphery circuit portion C10 are integrated in one chip, the Hall cell portion 10 and the periphery circuit portion C10 can be formed in different substrates. For example, the Hall device includes two chips, one of which includes the Hall cell portion 10, and the other one of which includes the periphery circuit portion C10.

Next, as shown in FIGS. 8A to 8C and 9A to 9C, the manufacturing method of the Hall device is described. In this method, the Hall cell portion 10 and the circuit portion C10 are manufactured simultaneously.

Firstly, a silicon substrate 11 having the P conductive type is prepared. The substrate 11 has a principal surface of a (100)-surface orientation. Then, a mask (not shown) having a predetermined pattern is formed on the substrate 11 so that the N conductive type impurity such as phosphorous is doped on the surface of the substrate 11. Further, the substrate 11 is annealed if necessary. Thus, the N conductive type semiconductor region 12 and another semiconductor region C12 are formed as a diffusion layer.

Figure 8A:
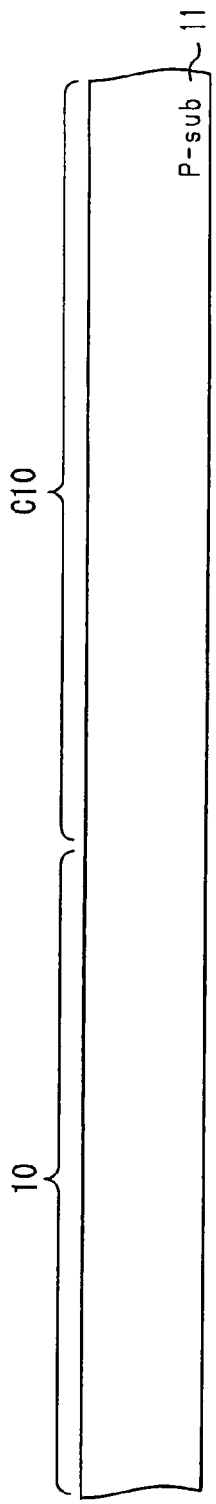
FIGS. 8A to 8C are cross sectional views explaining a method for manufacturing the device according to the first embodiment.
Figure 8B:
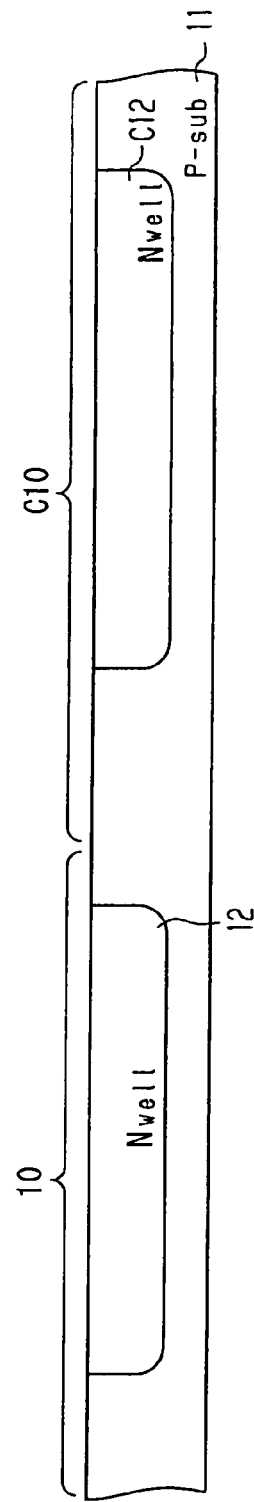
Figure 8C:
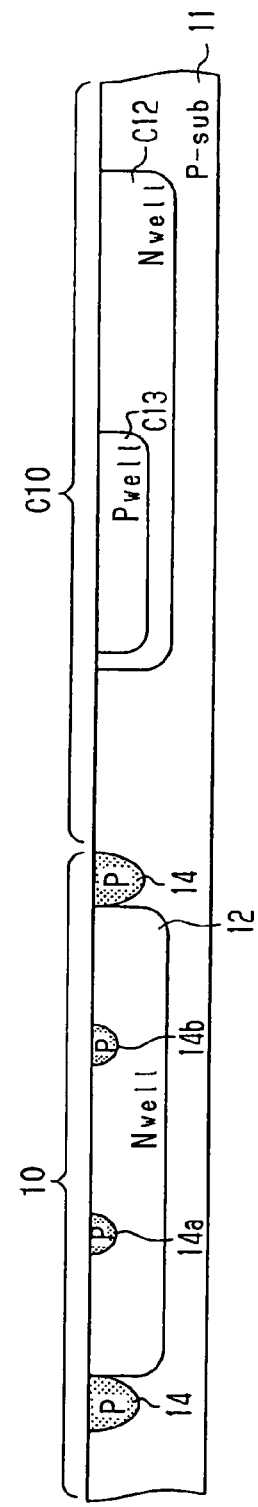

As shown in FIG. 8C, another photo mask having a predetermined pattern, which is patterned by a photolithography method, is formed on the substrate 11. Then, the P conductive type impurity such as boron is doped on the substrate 11. After that, if necessary, the substrate is annealed so that the P conductive type diffusion layer 14, 14a, 14b and another diffusion layer C13 as a P well are formed. Here, the impurity concentration of the semiconductor region 12 and the diffusion layers 14a, 14b are controlled appropriately so that the current path near the bottom of the semiconductor region 12 sufficiently exists even after the depletion layer is formed between the semiconductor region 12 and the diffusion layers 14a, 14b. Thus, the width of the depletion layer is appropriately formed. Therefore, the current path is not blocked. The Hall device having no embedded layer BL has excellent detection functions. The Hall device can be manufactured with the above method, in which the impurity concentration is only controlled.

Figure 9A:
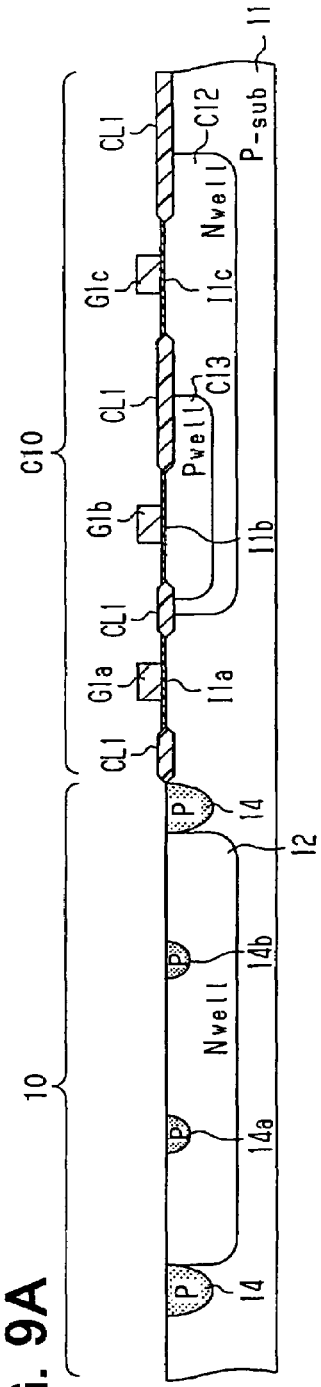
FIGS. 9A to 9C are cross sectional views explaining the method for manufacturing the device according to the first embodiment.
Figure 9B:
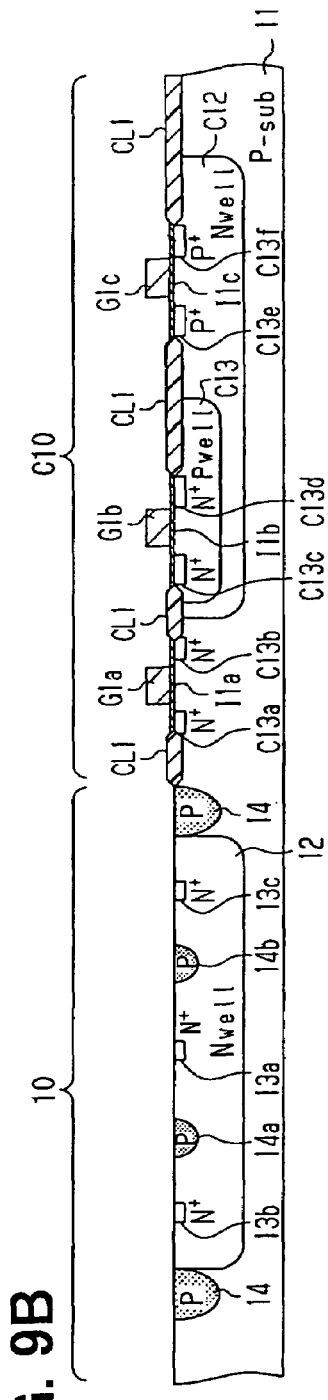
Figure 9C:
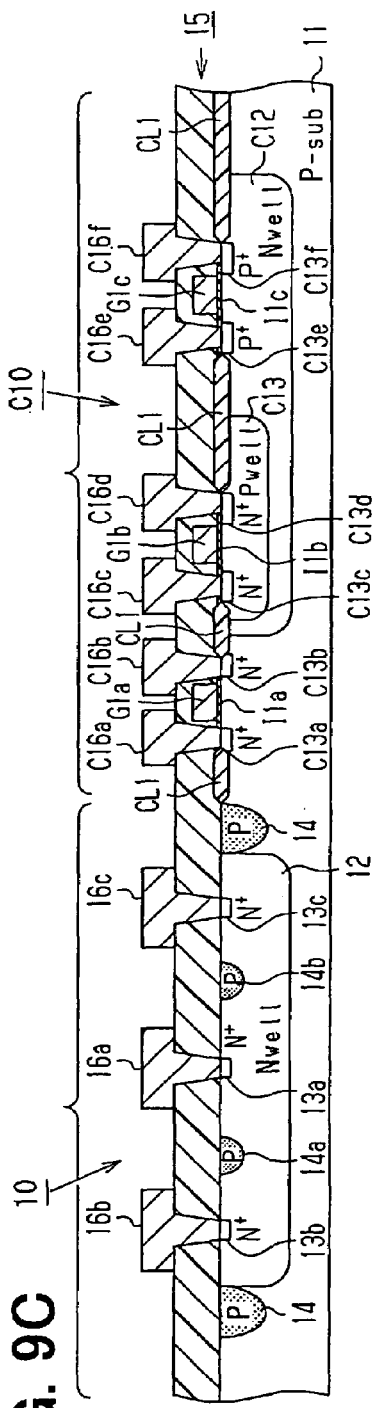

As shown in FIG. 9A, the field oxide film CL1 as the LOCOS oxide film is formed on a predetermined position by a conventional selective oxidation method. Specifically, an oxide silicon film as a pad oxide film and a silicon nitride film are deposited in this order. Then, the silicon nitride film is selectively eliminated by the photo-lithography method so that an opening is formed at a predetermined position. Then, the substrate 11 is heated so that the inside of the opening, which is not covered with the silicon nitride film, is locally oxidized so that the LOCOS oxide film CL1 is formed. Then, the silicon oxide film and the silicon nitride film are removed.

Then, the substrate 11 is thermally oxidized so that the gate insulation films I1a-I1c are formed. The gate insulation films I1a-I1c are made of silicon oxide. The gate electrodes G1a-G1c are formed on the gate insulation films I1a-I1c. The gate electrodes G1a-G1c are made of poly crystalline silicon. Specifically, the poly crystalline silicon film is deposited by a LP-CVD (i.e., low pressure chemical vapor deposition) method. A conductive impurity such as phosphorous is doped in the polycrystalline silicon film by a thermal diffusion method. After that, the poly crystalline silicon film is selectively etched so that the gate electrodes G1a-G1c are formed at a predetermined position.

Next, the N conductive type impurity such as arsenic and the P conductive type impurity such as boron are doped by an ion implantation method at a predetermined position by using a photo mask having a predetermined pattern. Then, the substrate 11 is annealed if necessary. Thus, the contact regions 13a-13e and the diffusion layers C 3a-C13f are formed. Here, the diffusion layers C13a-C13f can be formed by using the LOCOS oxide film C11 or the gate electrodes G1a-G1c as a mask of self-alignment. Further, a sidewall and/or a silicide are formed at this time.

Further, the insulation film 15 made of PSG is formed by the thermal CVD method. The insulation film 15 is appropriately patterned so that a contact hole is formed. Then, the wiring is formed to fill the contact hole. The wiring is made of aluminum. The wiring is patterned if necessary. Thus, the wirings 16a-16c, C16a-C16f are formed between the contact regions and the diffusion layers with excellent ohmic contact. Thus, the Hall cell portion 10 and the periphery circuit portion C10 are completed.

In the above method for manufacturing the Hall device, the Hall cell portion 10 is manufactured together with the periphery circuit portion C10, and therefore, the manufacturing process for manufacturing the Hall device is reduced. Specifically, the number of the process is reduced.

Thus, the vertical Hall device according to the first embodiment has the following advantages.

(1) The semiconductor region 12 is provided by the diffusion layer (i.e., the N well), which is formed by doping and diffusing the conductive impurity in the semiconductor substrate. Thus, the Hall device can be formed from the substrate having a single conductive type. Thus, the selecting degree of freedom for selecting the substrate composing the vertical Hall device is increased.

(2) The Hall device is formed from the substrate having the single conductive type. The cost of the substrate having the single conductive type is lower than that of the epitaxial substrate. Therefore, the manufacturing cost of the Hall device is reduced.

(3) The semiconductor region 12 has the maximum impurity concentration near the chip surface. The impurity concentration of the semiconductor region 12 is reduced as the depth from the chip surface becomes deeper. Therefore, the semiconductor region 12 can be formed by a conventional semiconductor process. For example, the semiconductor region 12 is manufactured in such a manner that the conductive impurity is doped on the surface of the chip by the ion implantation method, and the impurity is diffused by the thermal diffusion method.

(4) The N conductive type semiconductor region 12 is surrounded with the P conductive type semiconductor substrate 11. Thus, the PN junction is formed between the semiconductor region 12 and the substrate 11 so that the semiconductor region 12 including the magnetic field detection portion HP is electrically separated from other parts. Thus, the Hall cell is separated from other parts appropriately.

(5) The P conductive type diffusion layers 14a, 14b for providing the current path are formed in the semiconductor region 12 by narrowing the semiconductor region 12 near the bottom. The magnetic field detection portion HP is electrically divided by the diffusion layers 14a, 14b. Thus, the vertical Hall device for detecting the magnetic field parallel to the chip surface has high sensitivity. Further, the diffusion layers 14a, 14b are formed by the conventional semiconductor process such as a CMOS process so that the Hall device can be manufactured easily.

(6) The diffusion layers 14a, 14b are formed in the semiconductor region 12 in such a manner that the depth of the diffusion layer 14a, 14b is shallower than that of the semiconductor region 12. Accordingly, the vertical Hall device has high sensitivity, and the Hall device can be manufactured easily.

(7) The diffusion depth of the diffusion layer 14a, 14b is equal to or deeper than 2 µm. The current flowing through the magnetic field detection portion HP is limited from expanding in the horizontal direction effectively. Thus, the sensitivity of the Hall device is improved. However, the diffusion depth of the diffusion layer 14a, 14b can be another although the depth is preferably equal to or deeper than 2 µm.

(8) The diffusion layer 14a, 14b has the maximum impurity concentration near the chip surface, and the impurity concentration of the semiconductor region 12 is reduced as the depth from the surface becomes deeper. Thus, the current flowing through the magnetic field detection portion HP is limited from expanding in the horizontal direction so that the current component flowing in the vertical direction is relatively increased. Thus, the sensitivity of the Hall device is improved.

(9) The impurity concentrations of the semiconductor region 12 and the diffusion layers 14a, 14b are controlled to prepare the current path near the bottom of the semiconductor region 12 after the depletion layer is formed between the semiconductor region 12 and the diffusion layers 14a, 14b. Thus, the current path near the bottom of the semiconductor region 12 is prepared appropriately. Further, this preparation method can be performed only by controlling the impurity concentration.

(10) The current supply terminals and the voltage output terminals are formed on the surface of the semiconductor region 12. The current is supplied to the magnetic field detection portion HP from one terminal of the current supply terminals. When the current including the component perpendicular to the chip surface flows through the detection portion HP, and the magnetic field parallel to the chip surface is applied to the detection portion HP, the Hall voltage is generated between the voltage output terminals. The Hall voltage corresponds to the magnetic field. The Hall device having a sufficient performance for detecting the magnetic field is manufactured.

(11) The contact region 13a corresponding to one terminal of the current supply terminals is sandwiched and disposed between the contact regions 13a, 13e corresponding to the voltage output terminals. The Hall voltage corresponding to the current flowing through the detection portion HP is appropriately measured through the voltage output terminals.

(12) The contact region 13a is sandwiched between the contact regions 13d, 13e, and the contact regions 13b, 13c corresponding to the other terminal of the current supply terminals is disposed in line symmetry of a line connecting between the voltage output terminals. Thus, the magnetic field as a detection object can be detected with high accuracy.

(13) A pair of the current supply terminal is perpendicular to a pair of the voltage output terminals. This construction provides an excellent device characteristics of the Hall device although the construction is simple.

(14) The contact regions 13a-13e as the current supply terminal and the voltage output terminals are formed on the surface of the semiconductor region 12 by increasing the impurity concentration selectively. Thus, the electrode disposed on the contact region 13a-13e and the contact region 13a-13e are connected with excellent ohmic contact so that the current supply for supplying the contact region 13a-13e and the voltage output for outputting from the contact region 13a-13e are effectively performed.

(15) The Hall voltage signal outputting from the contact regions 13d, 13e corresponding to the voltage output terminals is outputted through the wiring system, which is capable of controlling it's resistance. The wiring system has multiple wirings, which are connected in parallel each other. Further, the wirings having different resistances are connected and disconnected between the voltage output terminals V1, V2 so that the wiring system provides different resistance. Thus, the offset voltage is compensated and reduced.

(16) The current flowing through the detection portion HP flows in a tilt direction slanted from the vertical direction. This current includes the component perpendicular to the chip surface, which flows through the detection portion HP. Thus, the Hall device can detect the magnetic field parallel to the chip surface.

(17) The substrate 11 is made of the silicon substrate having the (100)-surface orientation. Therefore, the offset voltage caused by the stress applied to the substrate when the device is packaged is reduced.

(18) Since the substrate 11 is made of silicon, the Hall device is manufactured with low cost. This is because the silicon substrate is processed in a conventional semiconductor process, and the characteristics of the silicon substrate have been studied sufficiently.

(19) The Hall device has no embedded layer BL. Thus, the offset voltage is reduced. Further, the temperature characteristics of the magnetic field detection sensitivity is improved. Thus, the temperature compensation circuit is simplified and minimized.

(20) The Hall device with the periphery circuit is integrated into one chip. This Hall device can be used for a magnetic sensor such as an angular detection sensor. The Hall device is provide by a Hall IC.

(21) The Hall device includes the CMOS circuit as the periphery circuit. Thus, the Hall device can be manufactured by a conventional CMOS process together with manufacturing the CMOS circuit.

(22) The number of process of the manufacturing method described above is reduced.

(23) The semiconductor region 12 is formed by doping and diffusing the conductive impurity in the semiconductor substrate 11. The substrate 11 can be made of an epitaxial substrate or a SOI (i.e., silicon on insulator) substrate. Therefore, the selecting degree of freedom for selecting the substrate composing the Hall device is increased.

(24) Further, the semiconductor region 12 is formed in such a manner than the N conductive type impurity is doped on the surface of the substrate 11 by the ion implantation method and then the N conductive type impurity is diffused in the substrate 11 by the heat treatment. Thus, the impurity concentration of the semiconductor region 12 has the maximum impurity concentration near the surface, and is decreased as the depth from the surface becomes deeper. The semiconductor region 12 is easily manufactured by the conventional semiconductor process. Since the semiconductor region 12 has a simple construction and is formed with low cost, the Hall device can be manufactured in mass production.

The impurity concentrations of the semiconductor region 12 and the diffusion layers 14a, 14b are controlled to provide the current path near the bottom of the semiconductor region 12 after the depletion layer is formed between the semiconductor region 12 and the diffusion layers 14a, 14b. However, in a case where the diffusion layers 14a, 14b are formed by the ion implantation method, the current path near the bottom of the semiconductor region 12 can be prepared by controlling the implantation energy.

Although the Hall cell portion 10 is manufactured together with the periphery circuit portion C10, the Hall cell portion 10 and the periphery circuit portion C10 can be manufactured individually.

Although the switches SW11-SW14, SW21-SW24 are used for connecting and disconnecting the wirings, a fuse or a thin film resistor can be used for connecting and disconnecting the wirings. The fuse disconnects itself when excess current flows through the fuse. The thin film resistor is capable of disconnecting the wire by trimming. Further, the fuse or the thin film resistor can be formed at least one of the voltage output terminals. Thus, the Hall voltage is outputted from the voltage output terminals, at least one of which is capable of changing the Hall voltage signal. Thus, when a variable resistance device is used for the wirings, the wiring system provides different resistance so that the offset voltage is compensated and reduced.

Although the diffusion layer 14a, 14b has the maximum impurity concentration near the chip surface, the diffusion layer 14a, 14b can have the minimum impurity concentration near the chip surface, and the impurity concentration of the semiconductor region 12 is increased as the depth from the surface becomes deeper. This type Hall device as a modification of the first embodiment is shown in FIG. 10.

Figure 10:
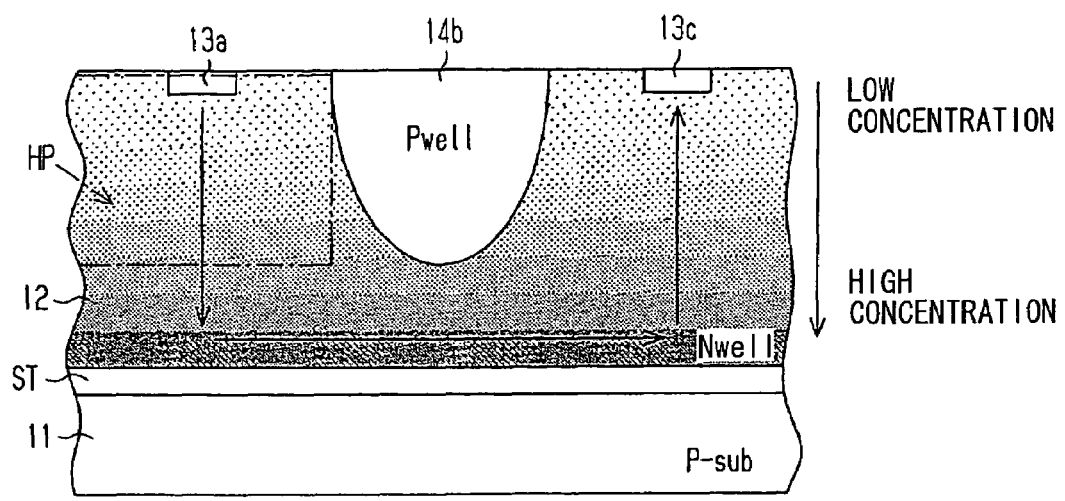
FIG. 10 is a partially enlarged cross sectional view explaining an impurity concentration profile in a semiconductor region of a vertical Hall device according to a modification of the first embodiment.

When the current flows from the contact region 13a to the contact region 13c, the current including the component perpendicular to the chip surface flows through the magnetic field detection portion HP, shown as an arrow in FIG. 10. Here, the Hall device includes a diffusion stopper layer ST in the semiconductor region 12. The semiconductor region 12 has the maximum impurity concentration adjacent to the diffusion stopper layer ST. The impurity concentration of the semiconductor region 12 is decreased as the depth from the diffusion stopper layer ST becomes shallower.

In this case, the following advantage is obtained.

(25) The component of the current perpendicular to the chip surface flowing through the magnetic field detection portion HP can be increased comparatively. Thus, the sensitivity (i.e., the product sensitivity) of the Hall device is increased.

(26) The diffusion layer 14a, 14b has the minimum impurity concentration near the chip surface, and the impurity concentration of the semiconductor region 12 is increased as the depth from the surface becomes deeper. In this case, the impurity concentration of the semiconductor region 12 can be easily controlled with high design degree of freedom.

Figure 11A:
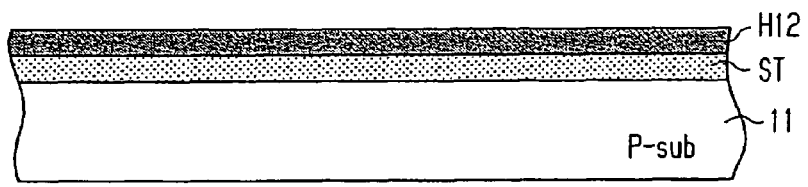
FIGS. 11A and 11B are cross sectional views explaining a method for manufacturing the device according to the modification of the first embodiment.
Figure 11B:
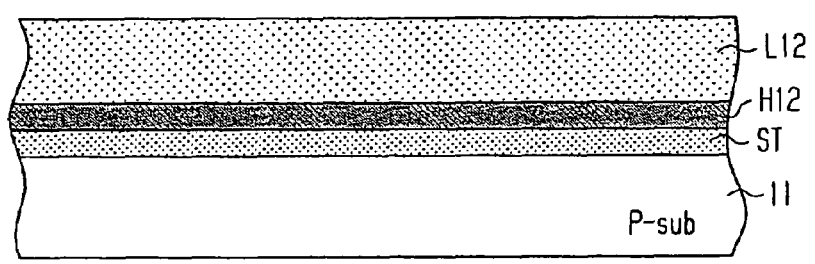

FIGS. 11A, 11B, 12A and 12B show a manufacturing process for manufacturing the Hall device shown in FIG. 10. Firstly, the P conductive type silicon substrate 11 is prepared. Then, the impurity is doped on the surface of the substrate 11 so that the diffusion stopper layer ST having the P conductive type is formed. The impurity concentration of the diffusion stopper layer ST is higher than the substrate 11. Further, a semiconductor region H12 is formed on the diffusion stopper layer ST. The semiconductor region H12 is made of a N conductive type diffusion layer. As shown in FIG. 11B, another semiconductor region L12 is formed on the semiconductor region H12. The semiconductor region L12 is made of a N conductive type epitaxial film, and the impurity concentration of the region L12 is lower than that of the region H12. Then, the substrate 11 is annealed if necessary so that the conductive impurity in the region H12 is diffused into the region L12. Thus, the semiconductor region 12 is formed. Here, the diffusion stopper layer ST and the semiconductor region H12 are formed as a diffusion layer (i.e., well construction). The diffusion stopper layer ST and the semiconductor region H12 can be made of an epitaxial film. Further, although the diffusion stopper layer ST and the semiconductor regions H12, L12 are laminated on the substrate 11 so that ternary-layered construction is formed, the number of the multiple-layered construction can be another number. For example, multiple semiconductor layers having different conductive types can be laminated on the substrate 11, the number of layers being equal to or larger than four.

The above manufacturing method has the following advantages.

(27) Two high impurity concentration layers having different conductive types composing the diffusion stopper layer ST and the semiconductor region H12 are laminated on the substrate 11. Then, the epitaxial film composing the region L12 is formed on the substrate. These processes can be performed by a conventional semiconductor process easily.

Figure 12A:
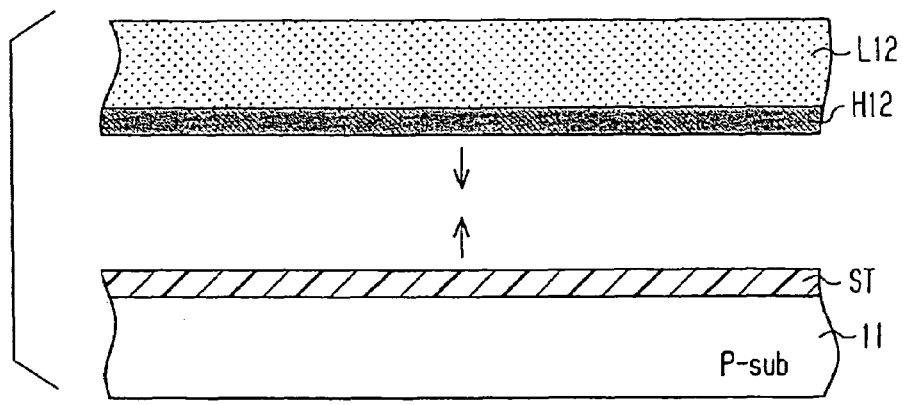
FIGS. 12A and 12B are cross sectional views explaining the method for manufacturing the device according to the modification of the first embodiment.
Figure 12B:
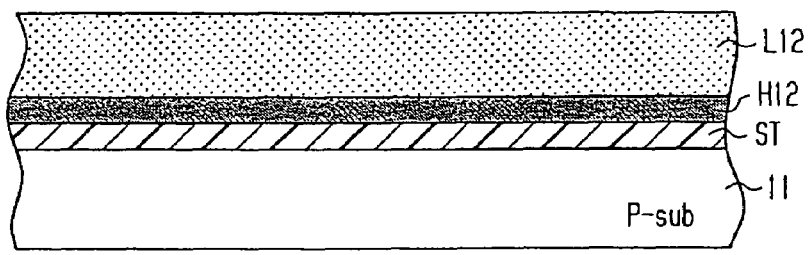

Next, another manufacturing method for manufacturing the semiconductor region 12 is described with reference to FIG. 12A and 12B. The first substrate having the semiconductor regions H12, L12 and the second substrate having the diffusion stopper layer ST are prepared. Then, the first and the second substrates are bonded in such a manner that the semiconductor region H12 and the diffusion stopper layer ST are bonded. After bonding, the substrate 11 is annealed in necessary so that the conductive impurity in the semiconductor region H12 is diffused in the semiconductor region L12. Thus, the semiconductor region 12 is formed. This method has the following advantage.

(28) The diffusion stopper layer ST prevents the conductive impurity from diffusing into the substrate 11. Further, the semiconductor region 12 can be formed by a conventional semiconductor process.

Figure 13:
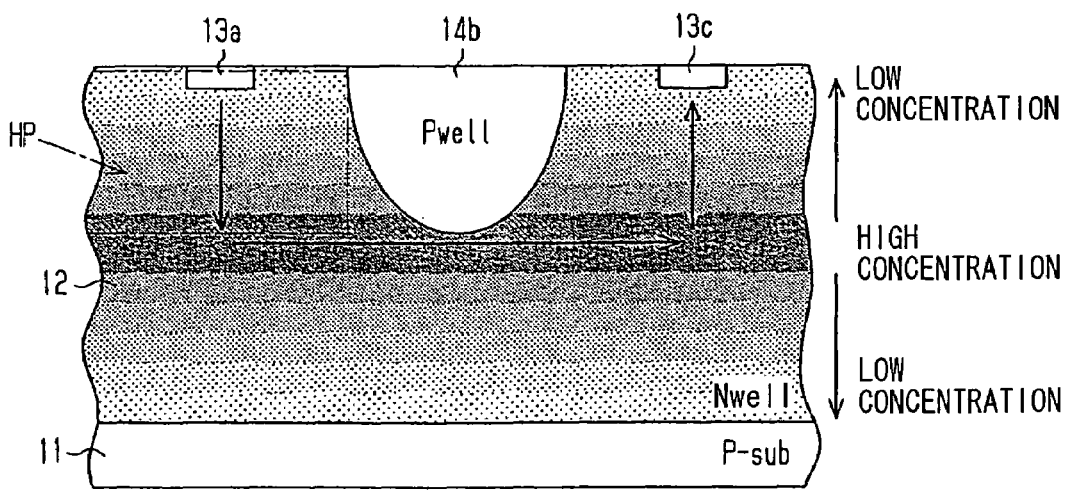
FIG. 13 is a partially enlarged cross sectional view explaining an impurity concentration profile in a semiconductor region of a vertical Hall device according to a second modification of the first embodiment.

The impurity concentration of the semiconductor region 12 can have the maximum impurity concentration at a predetermined depth from the chip surface, as shown in FIG. 13. In this case, the impurity concentration of the semiconductor region 12 is decreased as the depth from the diffusion stopper layer ST becomes shallower or deeper.

When the current flows from the contact region 13a to the contact region 13c, the current flows through a portion having low resistance, the portion which has the high impurity concentration. Specifically, the current firstly flows from the contact region 13a in the vertical direction. Then, the current flows through the semiconductor region 12 having the maximum impurity concentration. Then, the current flows to the contact region 13c. Thus, the current having the component perpendicular to the chip surface flows through the magnetic field detection portion HP. This Hall device has the following advantages.

(29) In the Hall device, the current having the component perpendicular to the chip surface is comparatively increased so that the sensitivity of the Hall device is increased.

Figure 14A:
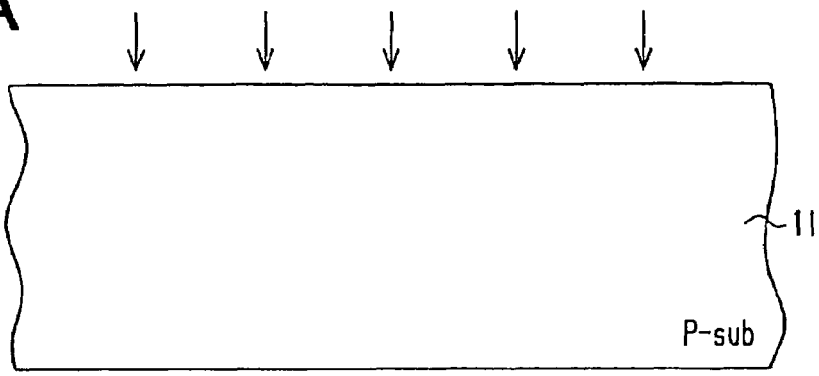
FIGS. 14A and 14B are cross sectional views explaining a method for manufacturing the device according to the second modification of the first embodiment.
Figure 14B:
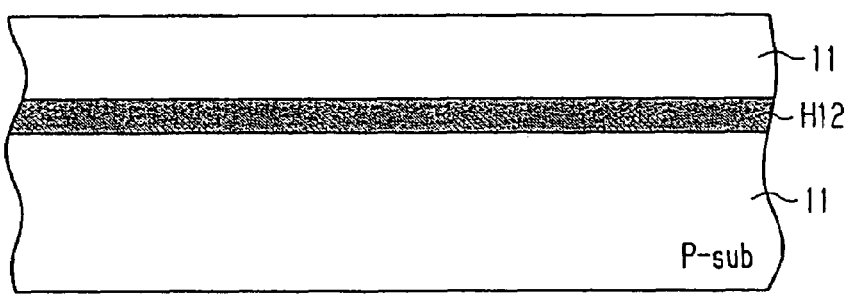

The Hall device shown in FIG. 13 is manufactured as follows. FIGS. 14 and 15 show the manufacturing methods. As shown in FIGS. 14A and 14B, the P conductive type silicon substrate 11 is prepared. Then, the semiconductor region H12 having the high impurity concentration higher than that of the substrate 11 is formed inside of the substrate 11 by the ion implantation method. The semiconductor region H12 has the N conductive type. Then, the substrate 11 is annealed so that the conductive impurity in the region H12 is diffused into the semiconductor substrate 11. Specifically, the impurity is diffused toward the surface and the bottom of the substrate 11. Thus, the semiconductor region 12 is formed.

The above method has the following advantage.

(30) The ion implantation of the N conductive type impurity into the inside of the substrate 11 is performed by a conventional semiconductor method, which is suitably used for the SOI substrate manufacturing method.

Figure 15A:
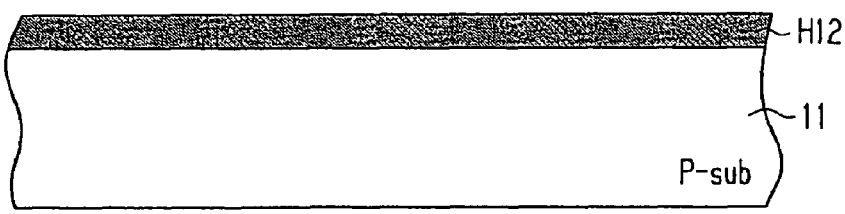
FIGS. 15A and 15B are cross sectional views explaining another method for manufacturing the device according to the second modification of the first embodiment.
Figure 15B:
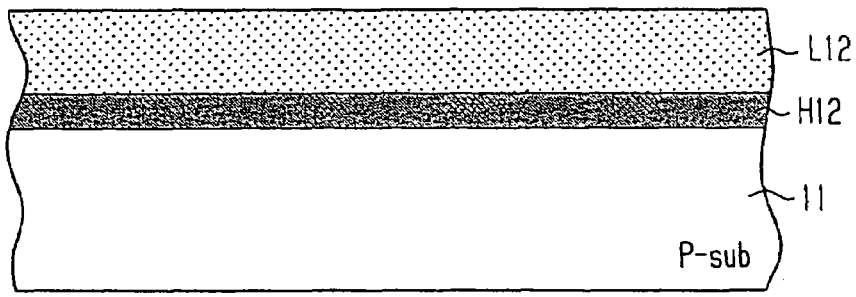

Next, another manufacturing method is shown in FIGS. 15A and 15B. Firstly, the P conductive type silicon substrate 11 is prepared. Then, the semiconductor region H12 having the high impurity concentration higher than that of the substrate 11 is formed on the surface of the substrate 11 by the ion implantation method. The semiconductor region H12 has the N conductive type. Then, the semiconductor region L12 having the low impurity concentration is formed on the region H12. Then, the substrate 11 is annealed so that the conductive impurity in the region H12 is diffused into the semiconductor substrate 11 and the region L12. Specifically, the impurity is diffused toward the surface and the bottom of the substrate 11. Thus, the semiconductor region 12 is formed. Here, the semiconductor region H12 is made of the diffusion layer, i.e., the well construction. However, the semiconductor region H12 can be made of an epitaxial film. This method has the following advantage.

(31) This method can be performed by a conventional semiconductor process.

Second Embodiment

Figure 16A:
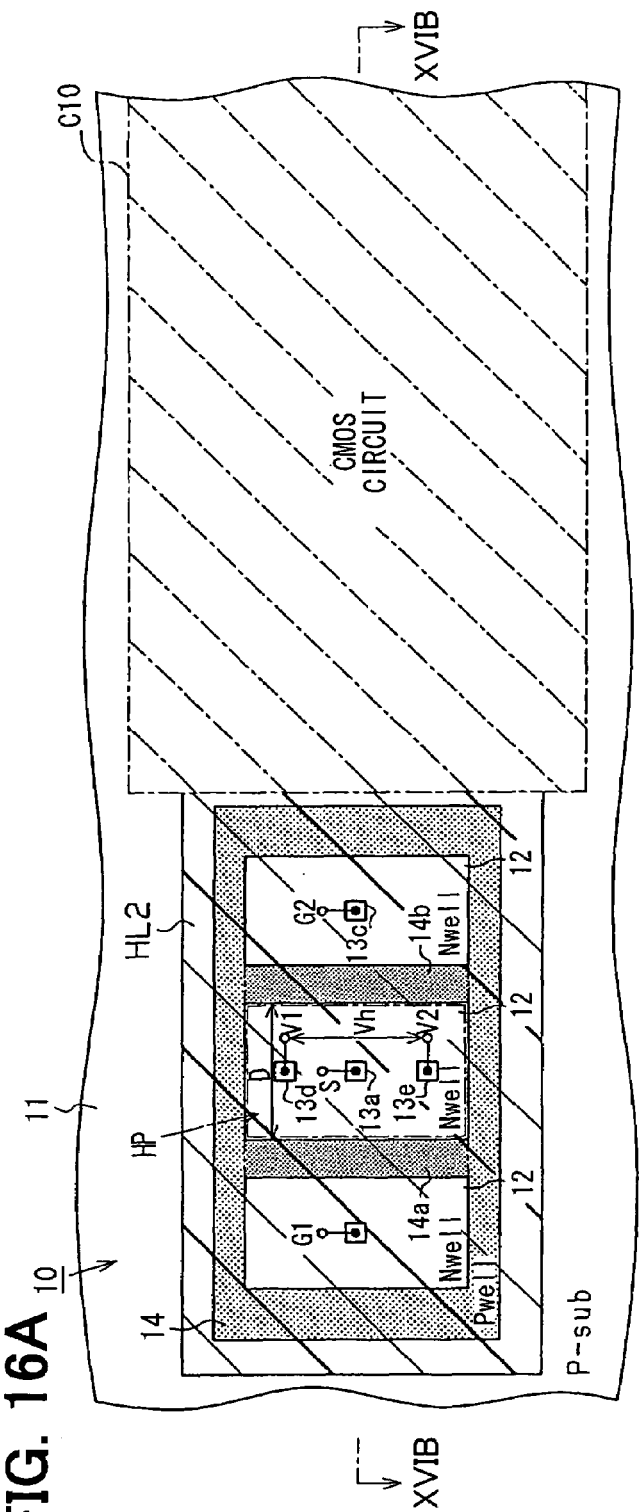
FIG. 16A is a plan view showing a vertical Hall device according to a second embodiment of the present invention.
Figure 16B:
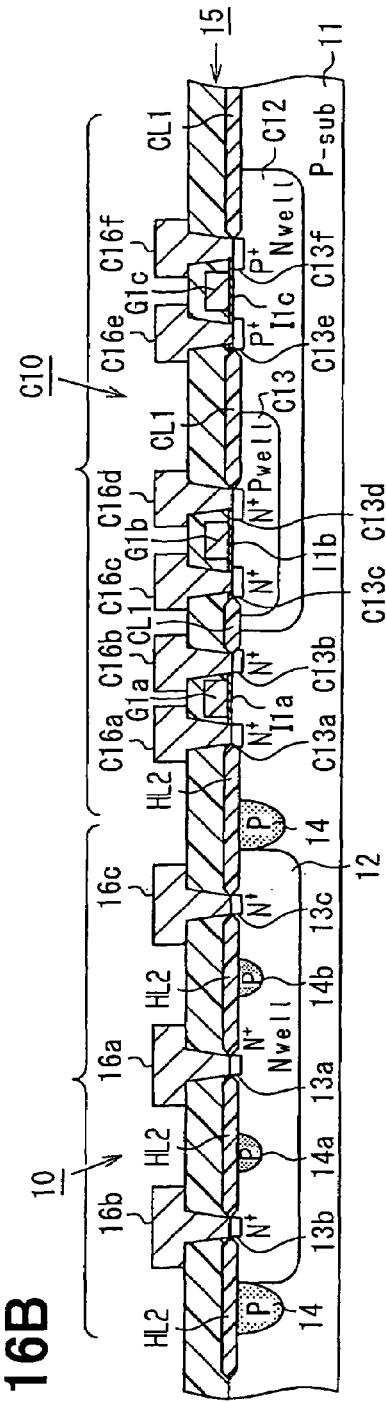
FIG. 16B is a cross sectional view showing the device taken along line XVIB-XVIB in FIG. 16A.

A vertical Hall device having a Hall cell portion 10 and a periphery circuit portion C10 according to a second embodiment of the present invention is shown in FIG. 16. The Hall device includes a field oxide film HL2 having a LOCOS construction. The field oxide film HL2 covers whole surface of the semiconductor region 12. Specifically, the field oxide film HL2 covers whole surface of the Hall cell portion 10 except for the contact regions 13a-13e for connecting to the wirings 16a-16c. The field oxide film HL2 protects the Hall cell portion 10 from damage caused in an ion implantation process, a plasma process or the like. Specifically, after the Hall cell portion 10 is formed in the Hall device, the ion implantation process or the plasma process is performed to form the periphery circuit portion C10. In this case, the field oxide film HL2 protects the Hall cell portion 10. Therefore, the field oxide film HL2 is used for manufacturing the Hall device to integrate into one chip. The field oxide film HL2 can be formed together with the field oxide film CL1 in the periphery circuit portion C10. Therefore, the field oxide film HL2 is formed by a conventional CMOS process easily.

Third Embodiment

Figure 17A:
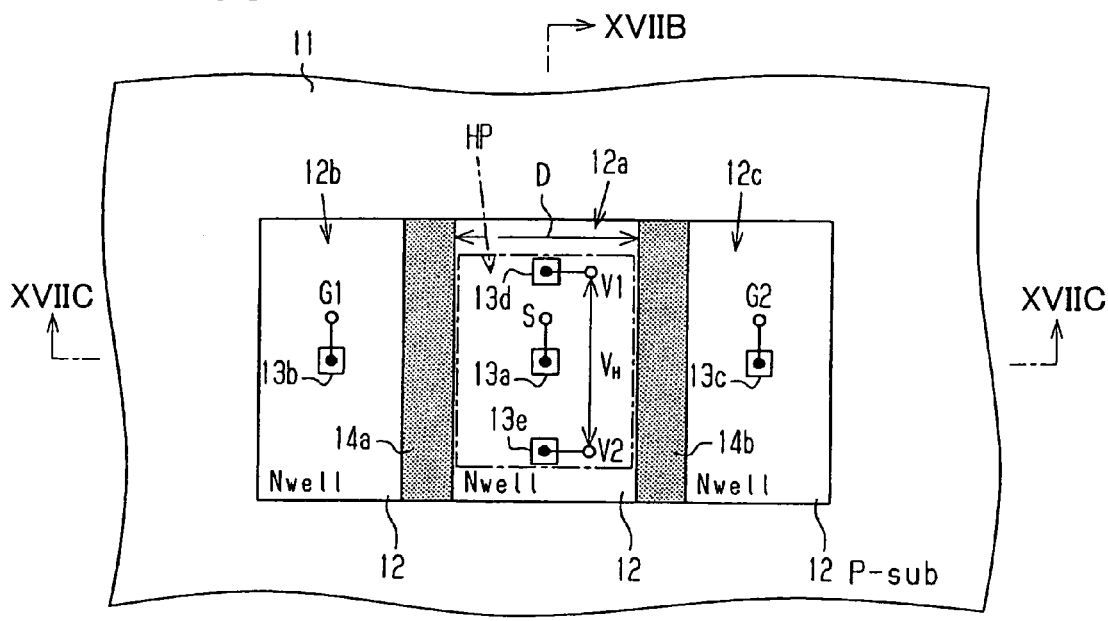
FIG. 17A is a plan view showing a vertical Hall device according to a third embodiment of the present invention.
Figure 17B:
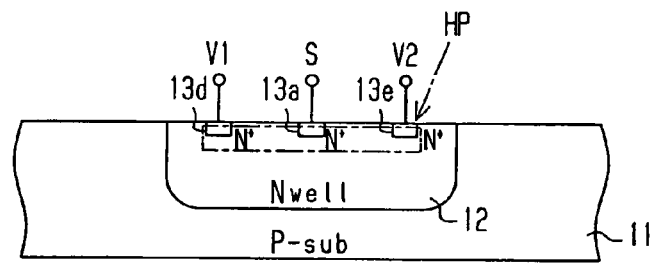
FIG. 17B is a cross sectional view showing the device taken along line XVIIB-XVIIB in FIG. 17A.
Figure 17C:
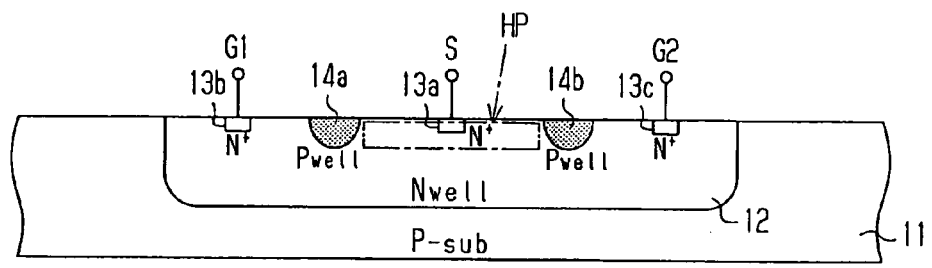
FIG. 17C is a cross sectional view showing the device taken along line XVIIC-XVIIC in FIG. 17A.

A vertical Hall device according to a third embodiment of the present invention is shown in FIGS. 17A to 17C. The Hall device has no diffusion layer 14, which separates the Hall device from other parts, as shown in FIG. 17A. Thus, the construction of the Hall device is simplified. Further, the dimensions of the Hall device are reduced. In this case, the semiconductor substrate 11 works as a separation wall instead of the diffusion region 14. The semiconductor substrate 11 surrounds the Hall device, i.e., the semiconductor region 12.

Figure 18:
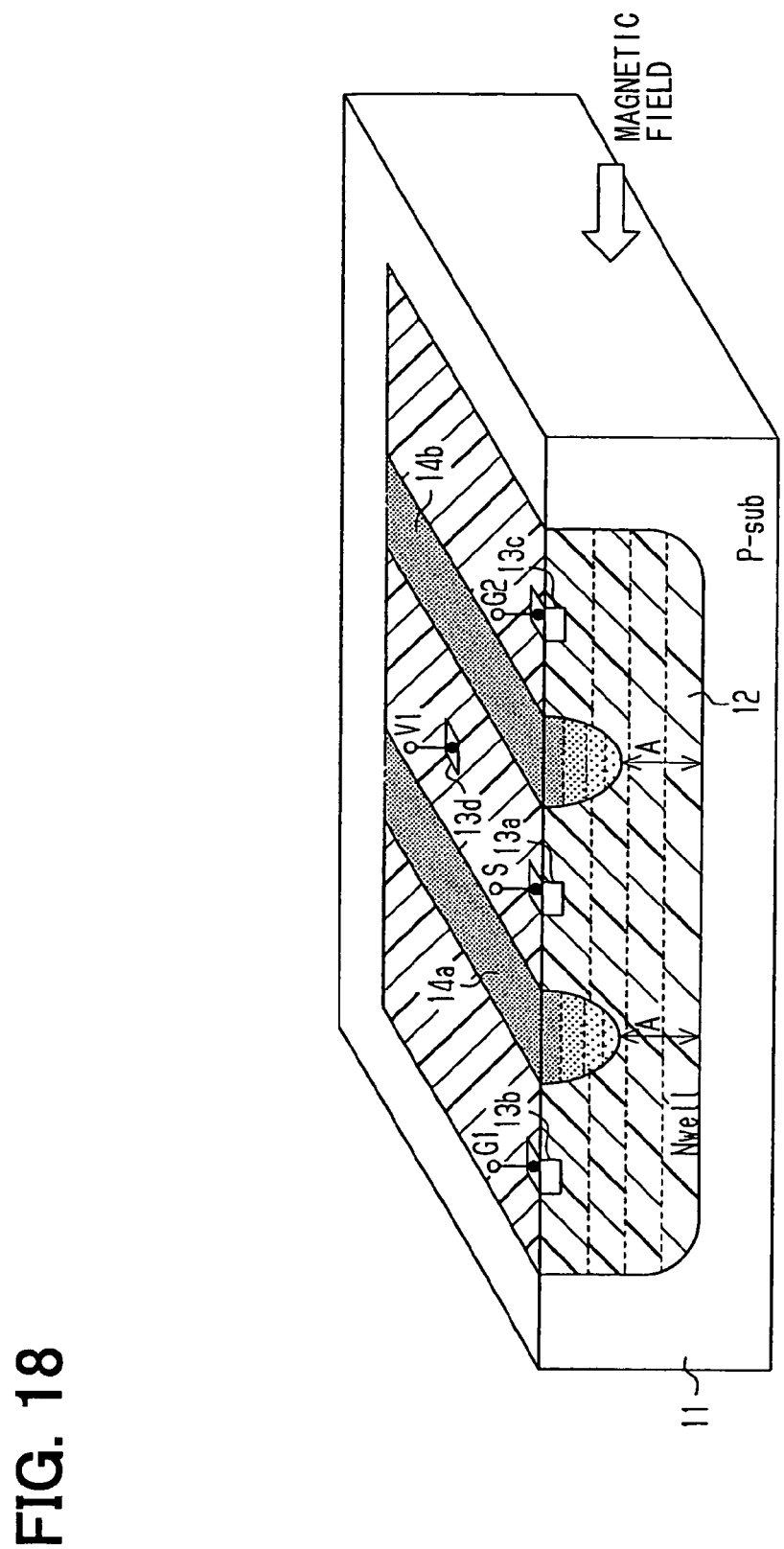
FIG. 18 is a schematic perspective view explaining an impurity concentration profile in the device according to the third embodiment.

FIG. 18 shows the impurity concentration in the Hall device. Specifically, the impurity concentrations of the semiconductor region 12 and the diffusion layers 14a, 14b are shown. The impurity concentration of the diffusion layers 14a, 14b has the maximum concentration near the chip surface. Further, the impurity concentration of the semiconductor region 12 also has the maximum concentration near the chip surface.

In this case, the Hall device has the advantages described above, which are described in advantages of (1) to (24). In addition, the Hall device has the following advantage.

(32) The construction of the Hall device is simplified. Further, the dimensions of the Hall device are reduced.

Fourth Embodiment

Figure 19A:
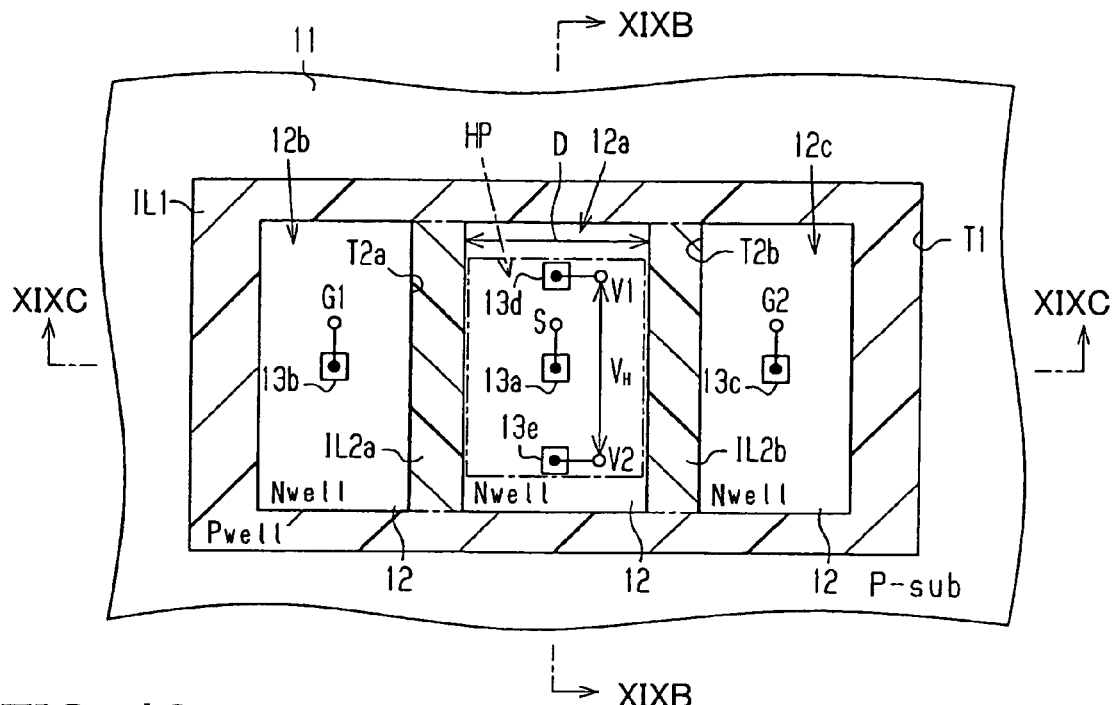
FIG. 19A is a plan view showing a vertical Hall device according to a fourth embodiment of the present invention.
Figure 19B:
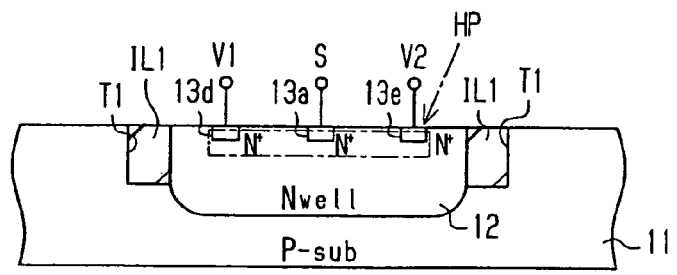
FIG. 19B is a cross sectional view showing the device taken along line XIXB-XIXB in FIG. 19A.
Figure 19C:
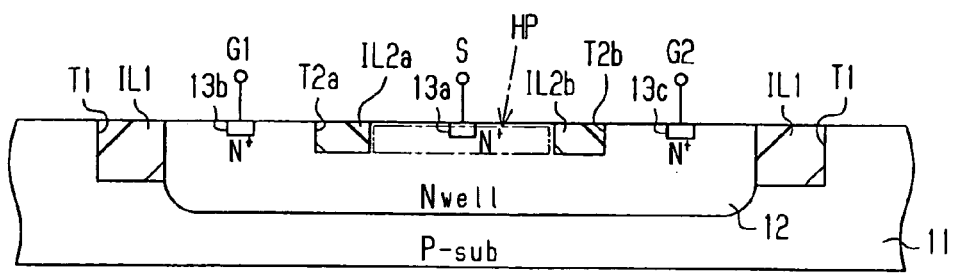
FIG. 19C is a cross sectional view showing the device taken along line XIXC-XIXC in FIG. 19A.

A vertical Hall device according to a fourth embodiment of the present invention is shown in FIGS. 19A to 19C. The Hall device includes trenches T1, T2a, T2b, in which insulation films IL1, IL2a, IL2b are embedded. The insulation film IL1, IL2a, IL2b in each trench T1, T2a, T2b is made of silicon oxide, and has a STI (i.e., shallow trench isolation) construction as a separation wall. The Hall device is separated from other parts with the insulation films IL1, IL2a, IL2b as the insulation separation wall. Further, the depth of the insulation separation wall composed of the insulation films IL1, IL2a, IL2b is shallower than that of the semiconductor region 12 so that the insulation separation wall separates the magnetic field detection portion HP electrically in the semiconductor region 12. Furthermore, the insulation separation wall selectively narrows the semiconductor region 12 near the bottom so that the current path is prepared.

The manufacturing method of the Hall device is described as follows.

The insulation separation wall is formed by the STI method. Specifically, a silicon oxide film as a pad oxide film and a silicon nitride film are deposited on the substrate 11. Then, the substrate 11 is selectively etched by using the photo-lithography method so that the trenches T1, T2a, T2b are formed on the substrate 11 at a predetermined position. Next, the insulation films IL1, IL2a, IL2b are embedded in the trenches T1, T2a, T2b by the CVD method or the like. At this time, the insulation film outside of the trenches T1, T2a, T2b are removed by, for example, CMP (i.e., chemical mechanical polishing) method. Then, the pad oxide film and the silicon nitride film are removed from the substrate. Thus, the insulation separation wall is formed.

Here, the STI method is used in the conventional CMOS process such as a part separation wall. Therefore, the insulation separation wall can be formed by the conventional semiconductor process. Further, the insulation separation wall having the shallow depth shallower than the semiconductor region 12 is easily formed by the STI method since the STI method is suitably used for forming the part separation wall.

The insulation separation wall having the STI construction includes a trench, and therefore, the insulation separation wall is easily formed on the surface of the substrate 11 vertically. Thus, the current flowing through the detection portion HP is limited from broadening so that the component of the current flowing in the vertical direction is increased comparatively. Accordingly, the sensitivity of the Hall device is improved.

Further, the deviation of the temperature characteristics of the magnetic field detection sensitivity is reduced. Accordingly, the temperature compensation circuit is minimized.

Figure 20A:
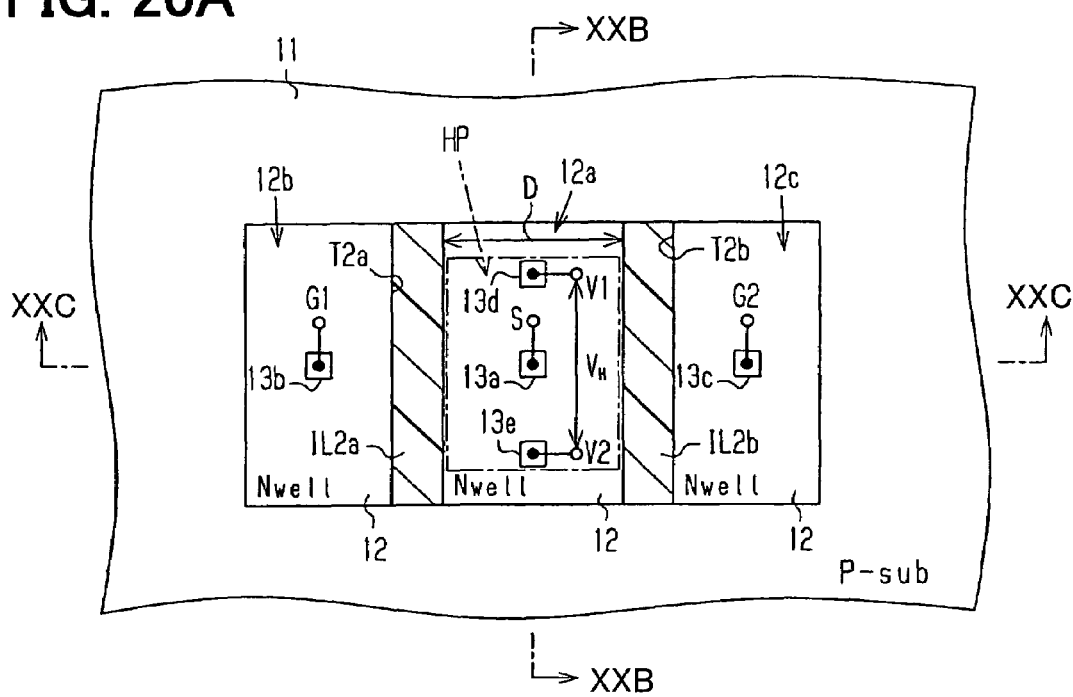
FIG. 20A is a plan view showing a vertical Hall device according to a modification of the fourth embodiment.
Figure 20B:
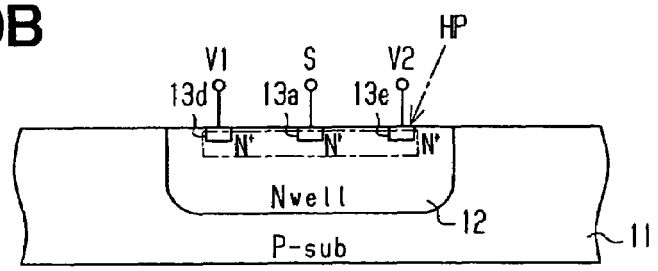
FIG. 20B is a cross sectional view showing the device taken along line XXB-XXB in FIG. 20A.
Figure 20C:
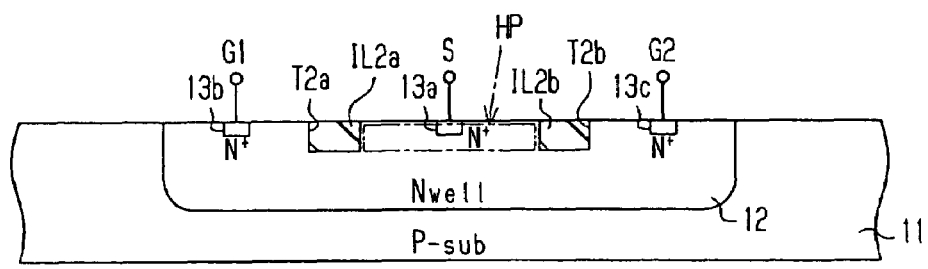
FIG. 20C is a cross sectional view showing the device taken along line XXC-XXC in FIG. 20A.

Furthermore, as shown in FIGS. 20A to 20C, the Hall device can have no insulation film IL1 embedded in the trench T1, which surrounds the semiconductor region 12, similar to the Hall device shown in FIGS. 17A to 17C.

Fifth Embodiment

Figure 21A:
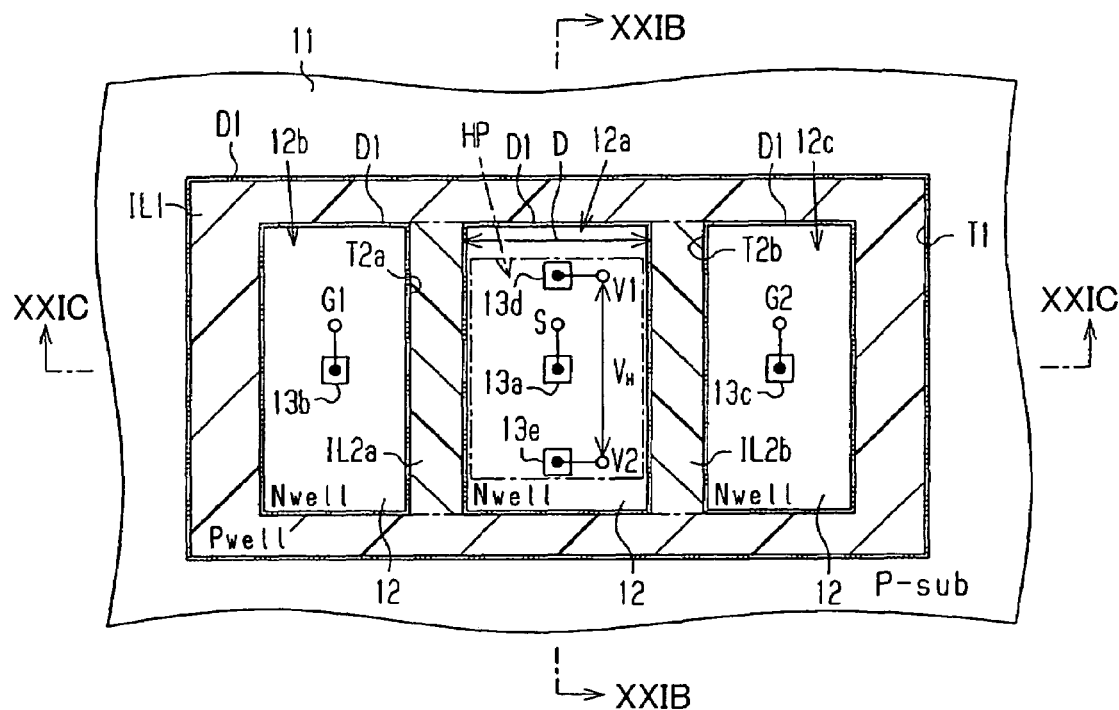
FIG. 21A is a plan view showing a vertical Hall device according to a fifth embodiment of the present invention.
Figure 21B:
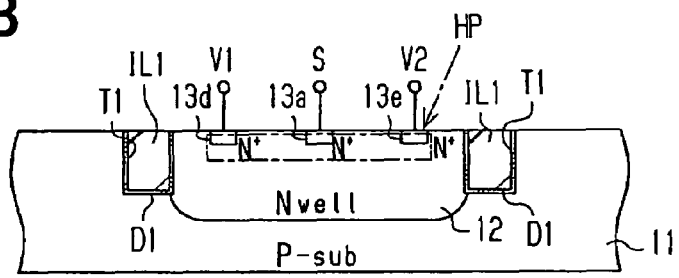
FIG. 21B is a cross sectional view showing the device taken along line XXIB-XXIB in FIG. 21A.
Figure 21C:
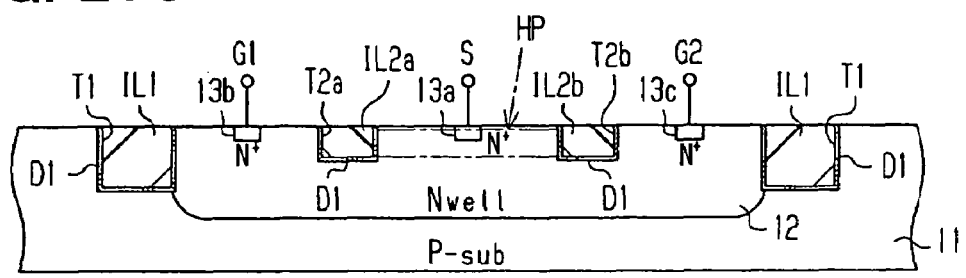
FIG. 21C is a cross sectional view showing the device taken along line XXIC-XXIC in FIG. 21A.
Figure 22A:
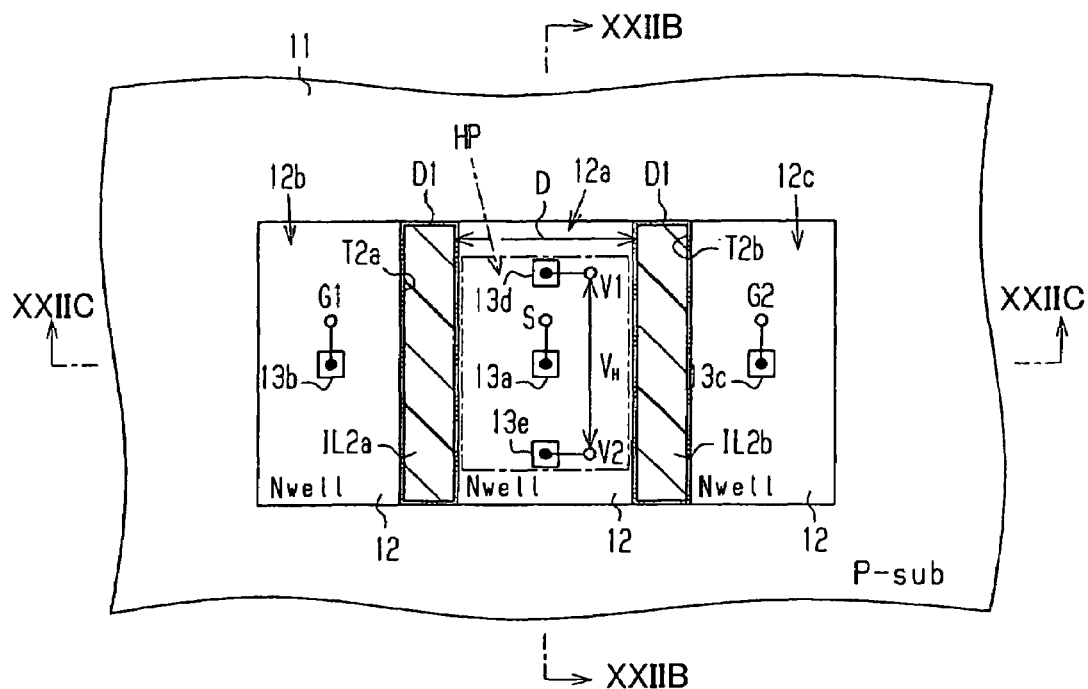
FIG. 22A is a plan view showing a vertical Hall device according to a modification of the fifth embodiment.
Figure 22B:
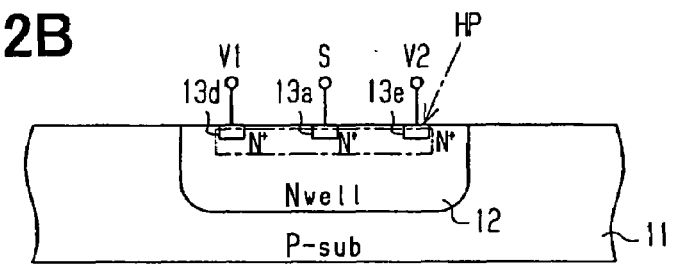
FIG. 22B is a cross sectional view showing the device taken along line XXIIB-XXIIB in FIG. 22A.
Figure 22C:
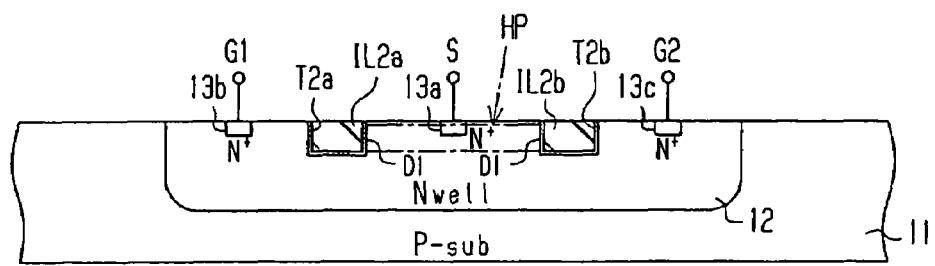
FIG. 22C is a cross sectional view showing the device taken along line XXIIC-XXIIC in FIG. 22A.
Figure 23A:
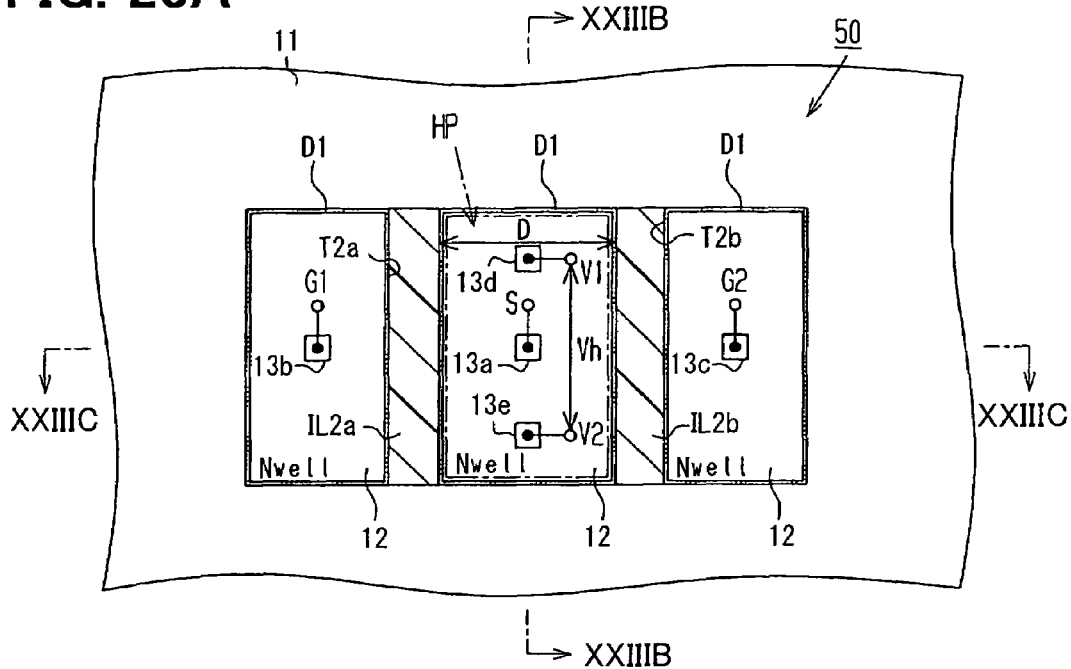
FIG. 23A is a plan view showing a vertical Hall device according to a second modification of the fifth embodiment.
Figure 23B:
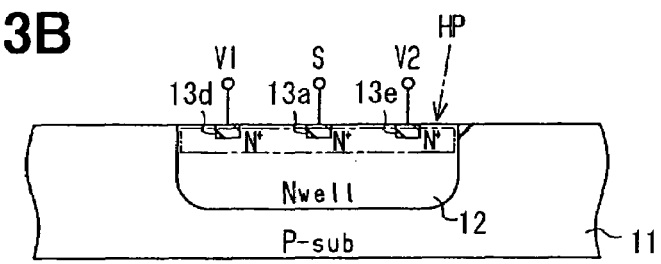
FIG. 23B is a cross sectional view showing the device taken along line XXIIIB-XXIIIB in FIG. 23A.
Figure 23C:
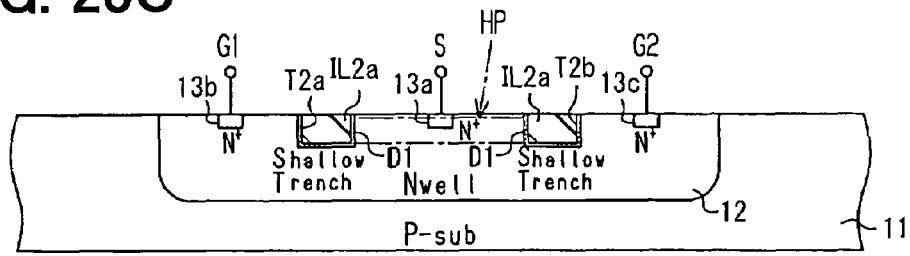
FIG. 23C is a cross sectional view showing the device taken along line XXIIIC-XXIIIC in FIG. 23A.

A vertical Hall device according to a fifth embodiment of the present invention is shown in FIGS. 21A to 21C. The Hall device includes an impurity layer D1 having the P conductive type. The impurity layer D1 is made of boron (i.e., B). Specifically, the impurity layer D1 is disposed on the inner wall of the trench.

When the trench T1, T2a, T2b is formed in the substrate 11, the inner wall of the trench T1, T2a, T2b is damaged. Therefore, a carrier is recombined at a damaged layer ion the inner wall of the trench T1, T2a, T2b. However, when the impurity layer D1 is formed on the inner wall of the trench T1, T2a, T2b, the impurity layer D1 prevents the carrier from recombining. Accordingly, the carrier mobility in the semiconductor region 12 is improved so that the mobility is not reduced. Further, a depletion layer at a PN junction between the impurity layer D1 and the semiconductor region 12 can penetrate into the device deeply. Accordingly, the thickness D of the detection portion HP is substantially narrowed. Thus, the sensitivity of the Hall device is improved.

In this case, the Hall device has the advantages described above, which are described in advantages of (1) to (24). In addition, the Hall device has the following advantage.

(33) The sensitivity of the Hall device is increased.

Further, as shown in FIGS. 22A to 23C, the Hall device can have no insulation film IL1 embedded in the trench T1, which surrounds the semiconductor region 12, similar to the Hall device shown in FIGS. 17A to 17C.

Sixth Embodiment

Figures 24A, 24B:
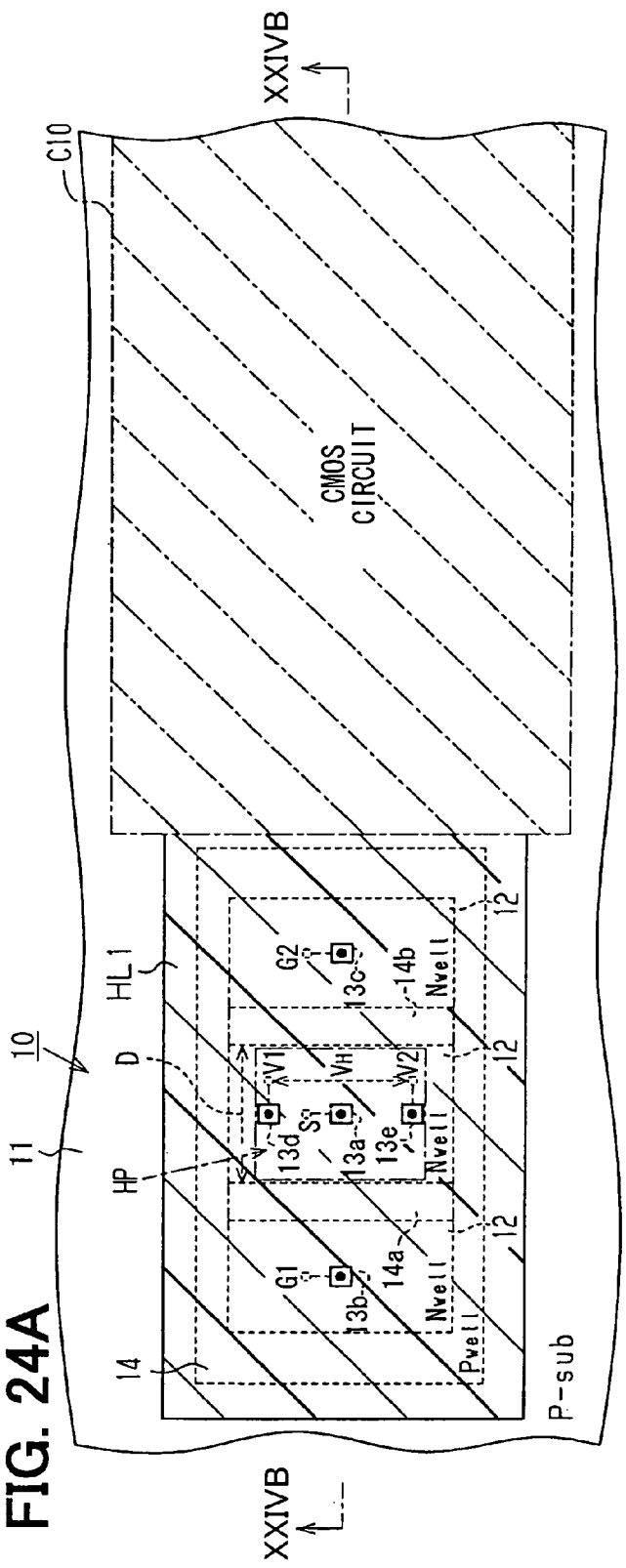
FIG. 24A is a plan view showing a vertical Hall device according to a sixth embodiment of the present invention.
FIG. 24B is a cross sectional view showing the device taken along line XXIVB-XXIVB in FIG. 24A.

A vertical Hall device according to a fifth embodiment of the present invention is shown in FIGS. 24A and 24B. The Hall device includes a field oxide film HL1 as a LOCOS oxide film, which covers whole surface of the device except for the contact regions 13a-13e.

In general, an interlayer insulation film such as the insulation film 15 formed on a chip surface of a Hall device includes a movable ion such as sodium ion. Therefore, the movable ion is displaced in accordance with energizing the Hall device or temperature change, so that an electric potential near an voltage output terminal disposed on the chip surface may become unstable. Accordingly, the Hall voltage signal outputted from the Hall device is fluctuated. This fluctuation is a drift of the Hall voltage signal or a fluctuation with time, which generates a detection error of the magnetic field. When the Hall device is used for an angular detection sensor, the sensor characteristics are deteriorated by the drift.

However, the field oxide film HL1 covers the Hall device, i.e., the semiconductor region 12, the movable ion is prevented from generating the drift. Thus, the detection accuracy of the Hall device is improved. Further, the field oxide film HL1 can be formed together with the field oxide film CL1. The field oxide film HL1 protects the Hall device from damage caused in an ion implantation process, a plasma process or the like. Specifically, after the Hall cell portion 10 is formed in the device, the ion implantation process or the plasma process is performed to form the periphery circuit portion C10. In this case, the field oxide film HL1 protects the Hall cell portion 10. Therefore, the field oxide film HL1 is used for manufacturing the Hall device to integrate into one chip.

In this case, the Hall device has the advantages described above, which are described in advantages of (1) to (24). In addition, the Hall device has the following advantage.

(34) The influence of the movable ion for reducing the detection accuracy is limited in the Hall device. Further, the damage in the manufacturing process is reduced by the field oxide film HL1.

Although the field oxide film HL1 covers whole surface of the device except for the contact regions 13a-13e, the field oxide film HL1 can only cover the semiconductor region 12. In this case, the above advantage of (34) is also obtained.

Seventh Embodiment

Figure 25A:
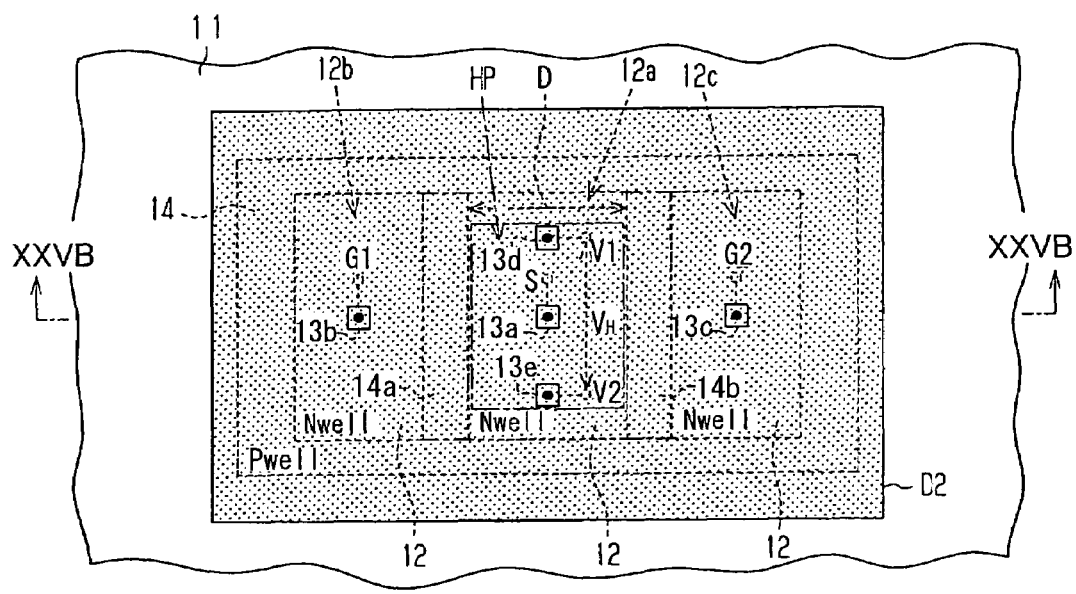
FIG. 25A is a plan view showing a vertical Hall device according to a seventh embodiment of the present invention.
Figure 25B:
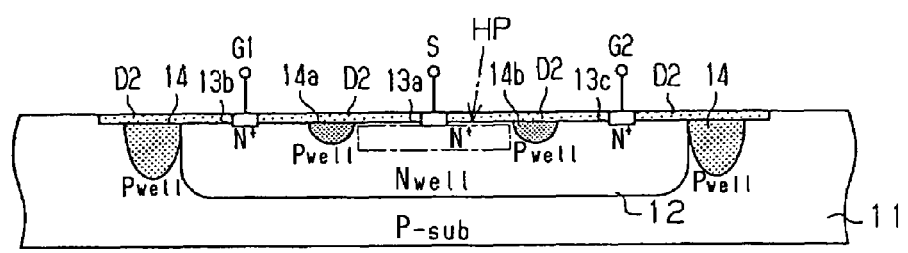
FIG. 25B is a cross sectional view showing the device taken along line XXVB-XXVB in FIG. 25A.

A vertical Hall device according to a seventh embodiment of the present invention is shown in FIGS. 25A and 25B. The Hall device includes an impurity layer D2, which covers whole surface of the device except for the contact regions 13a-13e. The P conductive type impurity such as boron is doped in the substrate 11 so that the impurity layer D2 having the P conductive type is formed.

When a reverse bias is applied between the impurity layer D2 and the semiconductor region 12, the reverse bias provides the depletion layer near a PN junction between the impurity layer D2 and the semiconductor region 12. This depletion layer protects the surface of the device from the movable ion. Thus, the influence of the movable ion is reduced so that the detection accuracy of the Hall device is improved.

Eighth Embodiment

Figure 26A:
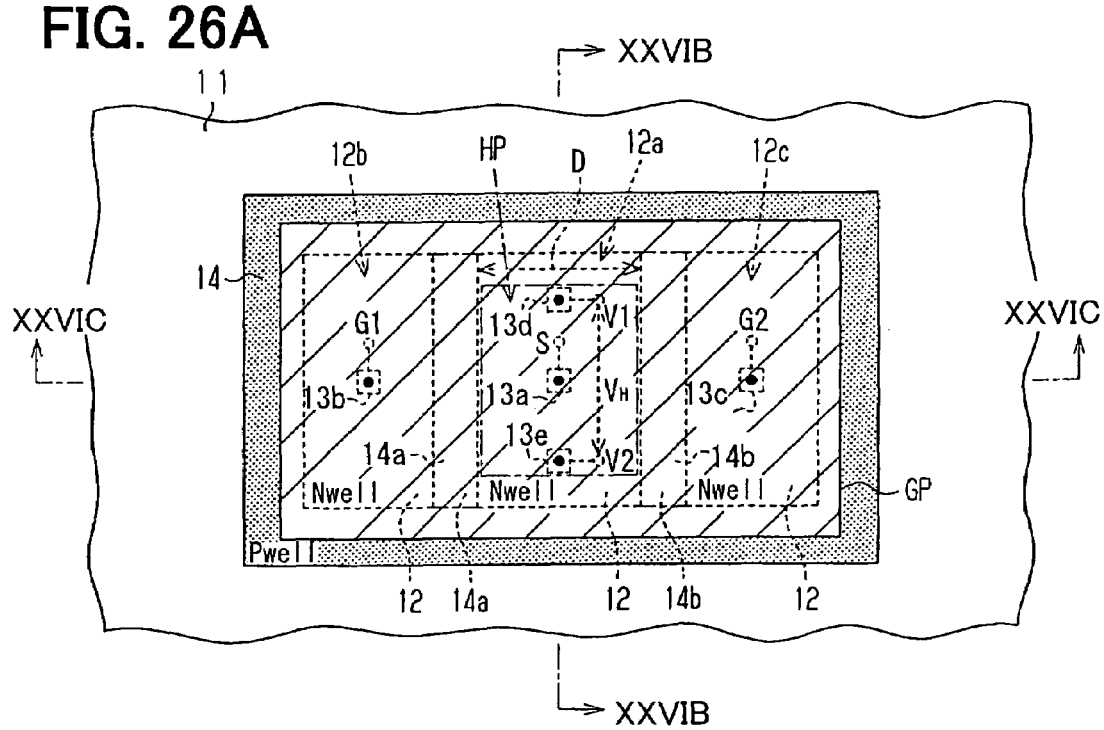
FIG. 26A is a plan view showing a vertical Hall device according to an eighth embodiment of the present invention.
Figure 26B:
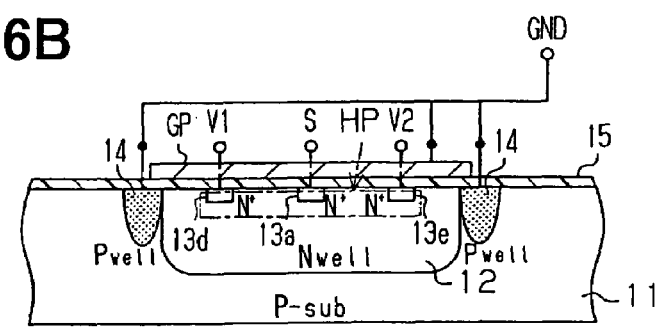
FIG. 26B is a cross sectional view showing the device taken along line XXVIB-XXVIB in FIG. 26A.
Figure 26C:
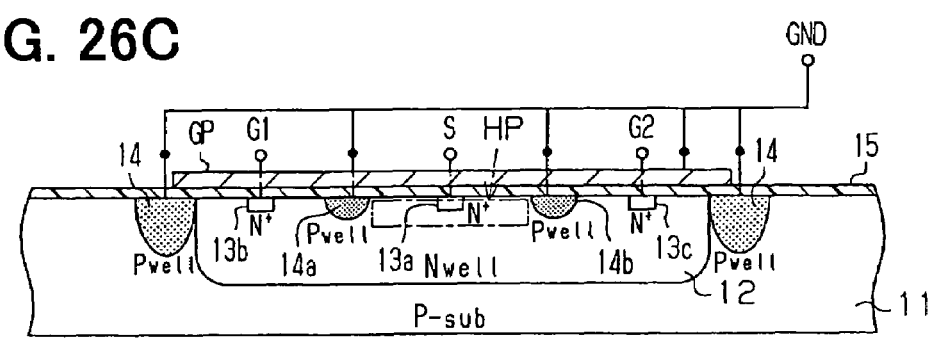
FIG. 26C is a cross sectional view showing the device taken along line XXVIC-XXVIC in FIG. 26A.

A vertical Hall device according to an eighth embodiment of the present invention is shown in FIGS. 26A to 26C. The Hall device includes a ground plate GP disposed on the insulation film 15. Here, the insulation film 15 is made of PSG, silicon oxide or the like. The ground plate GP is made of aluminum, poly crystalline silicon, or the like. The ground plate GP has a thin place shape, and covers the chip surface including the magnetic field detection portion HP. The ground plate GP together with the diffusion layers 14, 14a, 14b is connected to a predetermined place through a wiring so that the ground plate GP is fixed to a predetermined potential, e.g., a ground potential. Thus, the surface potential near the chip surface is fixed to a predetermined potential so that the electric potential around the chip surface becomes stable. Thus, the movable ion is limited from displacement, so that the drift derived from the displacement of the movable ion is reduced. Accordingly, the detection accuracy of the Hall device is improved. Further, the ground plate GP works as a shield for protecting the Hall device from a noise. Accordingly, the noise resistance of the Hall device is increased.

In this case, the Hall device has the advantages described above, which are described in advantages of (1) to (24). In addition, the Hall device has the following advantage.

(35) The ground plate GP improves the detection accuracy of the Hall device and the noise resistance of the device.

Although the ground plate GP is fixed to the ground potential, the ground plate GP can be fixed to another potential such as a power source potential.

Although the diffusion layers 14, 14a, 14b are also fixed to the ground potential to increase the fixation of the potential, The diffusion layers 14, 14a, 14b can not be always fixed to the ground potential.

Although the ground plate GP covers the chip surface, the ground plate GP can be formed on a part of the chip surface or the ground plate GP can be divided into multiple parts. In this case, the ground plate GP is applied with a predetermined voltage so that the resistance distribution of the detection portion HP is variable. In this case, the ground plate GP is disposed appropriately so that the resistance distribution of the detection portion HP at a predetermined position is variable. Thus, the potential distribution in the device is changed so that the offset voltage of the Hall device is reduced. Specifically, imbalance of the potential distribution in the device is compensated by changing the potential distribution. Thus, the offset voltage is reduced without a compensation circuit or with a simple compensation circuit. Thus, the dimensions of the compensation circuit are reduced.

Ninth Embodiment

Figure 27A:
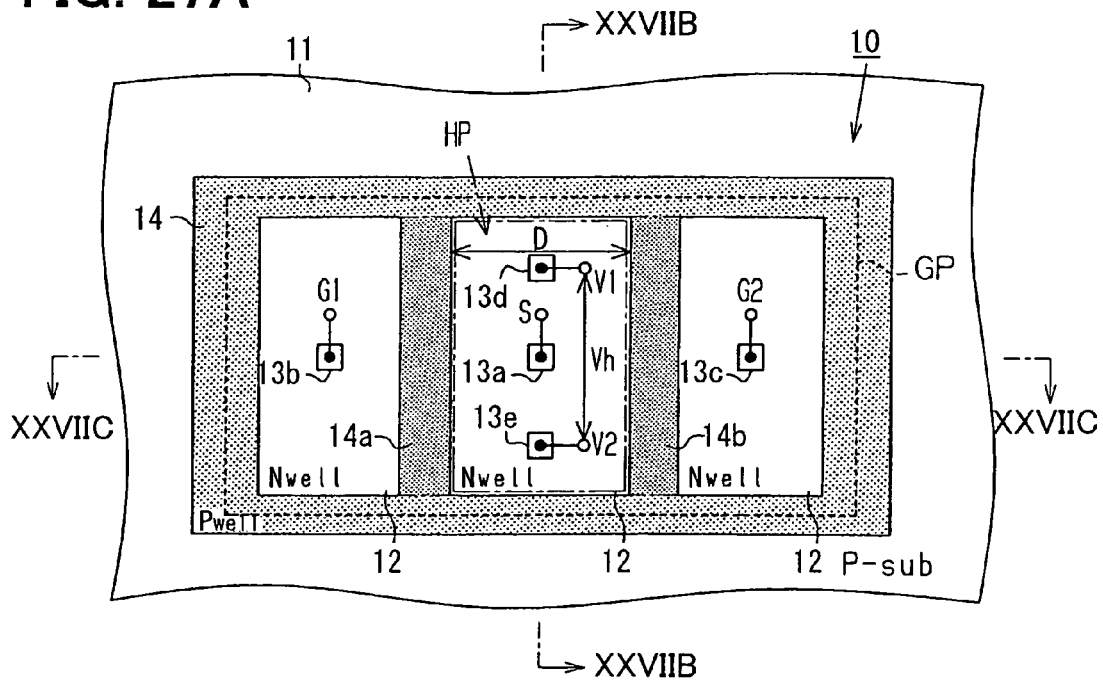
FIG. 27A is a plan view showing a vertical Hall device according to a ninth embodiment of the present invention.
Figure 27B:
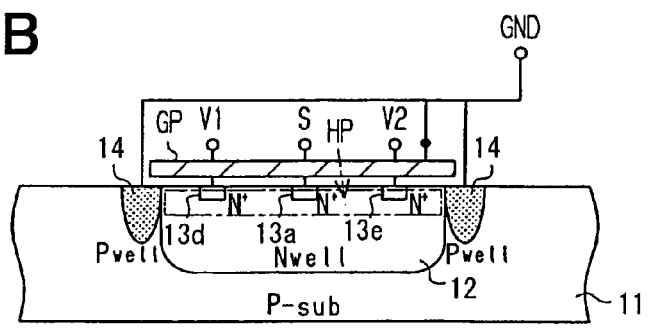
FIG. 27B is a cross sectional view showing the device taken along line XXVIIB-XXVIIB in FIG. 27A.
Figure 27C:
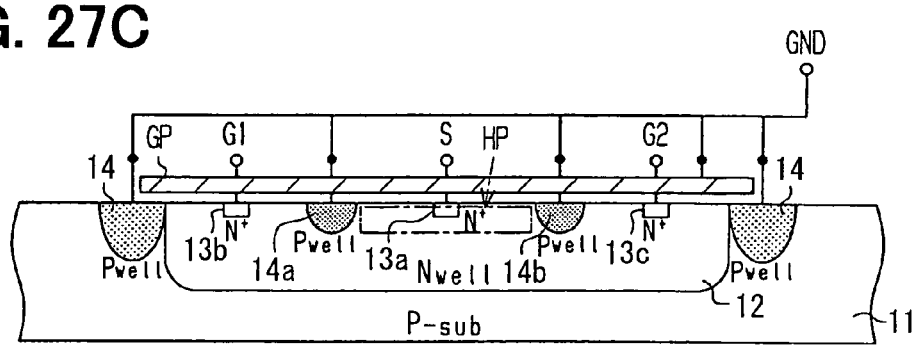
FIG. 27C is a cross sectional view showing the device taken along line XXVIIC-XXVIIC in FIG. 27A.

A vertical Hall device according to a ninth embodiment of the present invention is shown in FIGS. 27A to 27C. The Hal device includes the ground plate GP without the insulation film 15.

In general, the Hall voltage detected by the Hall device is small. The magnetic field is detected by measuring the small Hall voltage change with high accuracy. Therefore, the noise, which comes from the outside of the device, or a charge-up according to the driving current of the Hall device may affect the potential of the Hall device. In this case, the detection accuracy of the Hall device is reduced.

However, the ground plate GP covering the semiconductor region 12 electrically connects to the diffusion layers 14, 14a, 14b disposed in the semiconductor region 12. Thus, the electric potential of the Hall device is stabilized so that the detection accuracy of the device is improved.

Figure 28A:
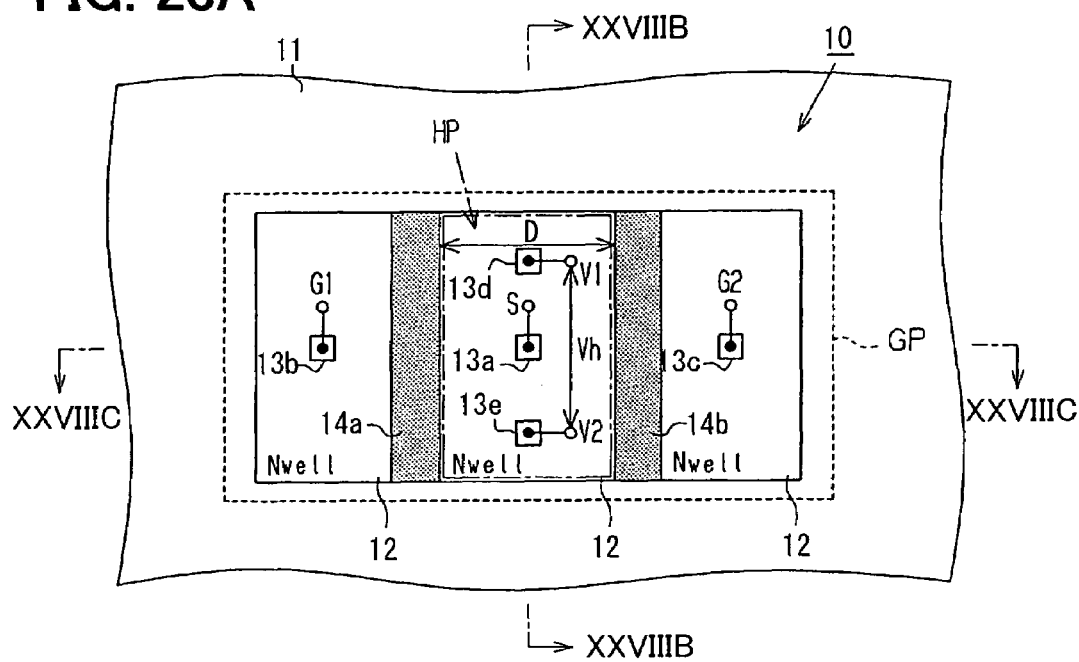
FIG. 28A is a plan view showing a vertical Hall device according to a modification of the ninth embodiment.
Figure 28B:
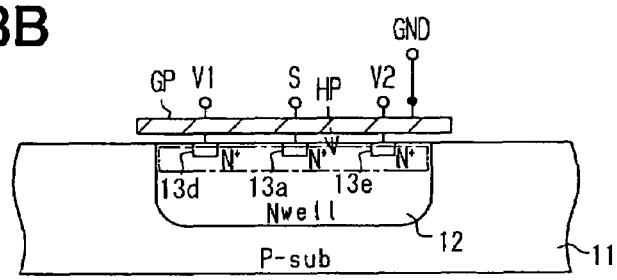
FIG. 28B is a cross sectional view showing the device taken along line XXVIIIB-XXVIIIB in FIG. 28A.
Figure 28C:
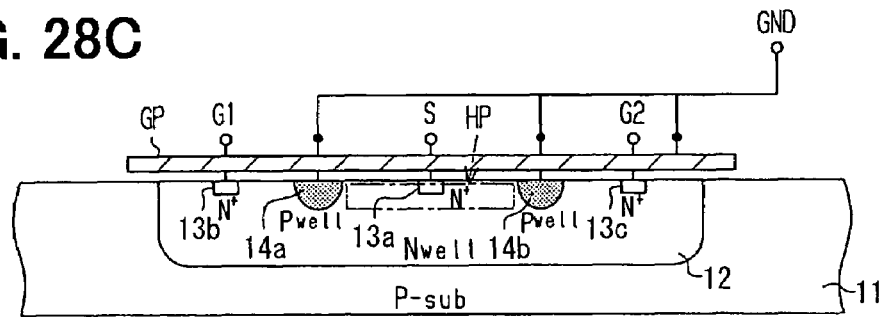
FIG. 28C is a cross sectional view showing the device taken along line XXVIIIC-XXVIIIC in FIG. 28A.

Further, as shown in FIGS. 28A to 28C, the Hall device can have no diffusion layer 14, which surrounds the semiconductor region 12, similar to the Hall device shown in FIGS. 17A to 17C.

Tenth Embodiment

Figure 29:
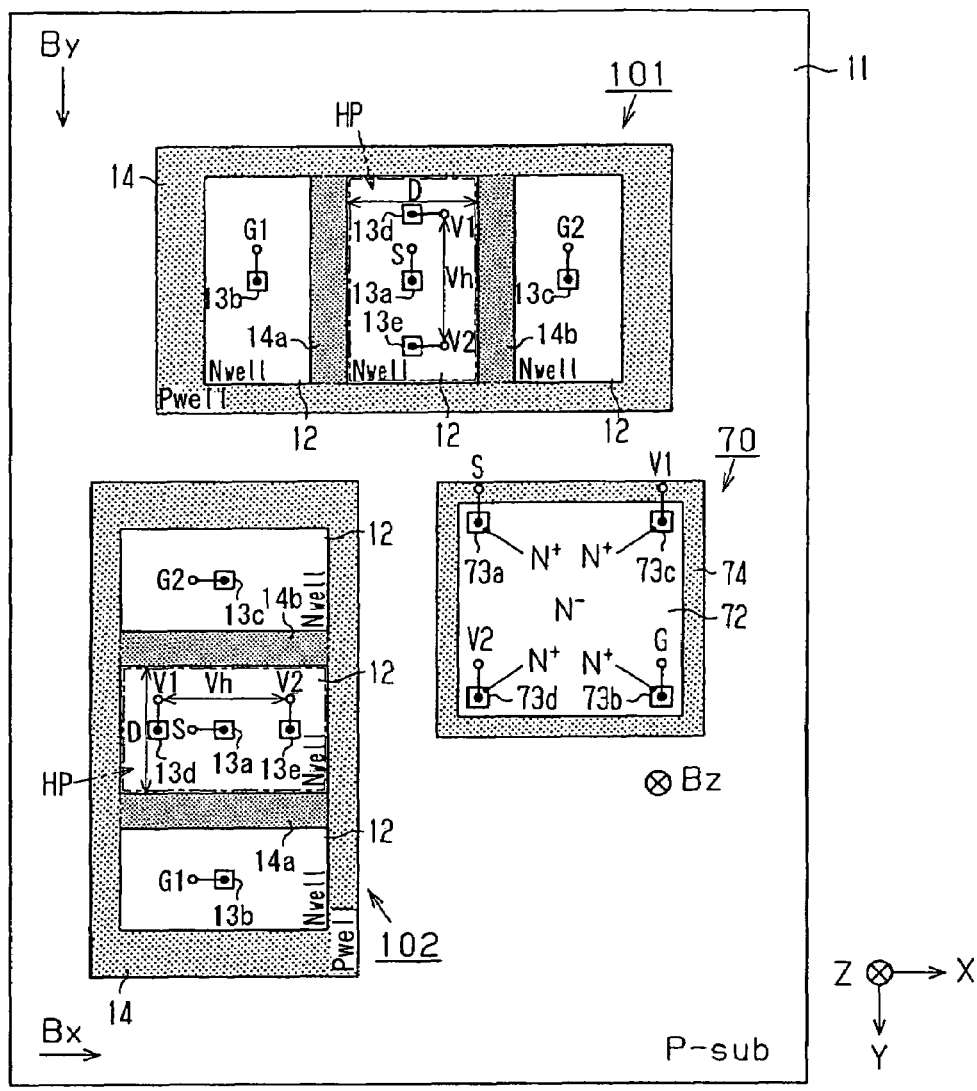
FIG. 29 is a plan view showing a vertical Hall device according to a tenth embodiment of the present invention.

A Hall device according to a tenth embodiment of the present invention is shown in FIG. 29. The Hall device includes three Hall cells 101, 102, 70. The Hall cells 101, 102 detect two magnetic components in the X direction and the Y direction. Here, the X direction, the Y direction and the Z direction are perpendicular together. Thus, the Hall cells 101, 102 are vertical Hall cells. The Hall cell 70 is the lateral Hall cell so that the Hall cell 70 detects the magnetic component parallel to the Z direction. The lateral Hall cell 70 is formed in the substrate 11. The Hall device 70 includes a semiconductor region 72, a $N^+$ conductive type diffusion layer 73a-73d, and a diffusion layer 74, which are formed by doping a conductive impurity in the substrate 11.

Figure 30:
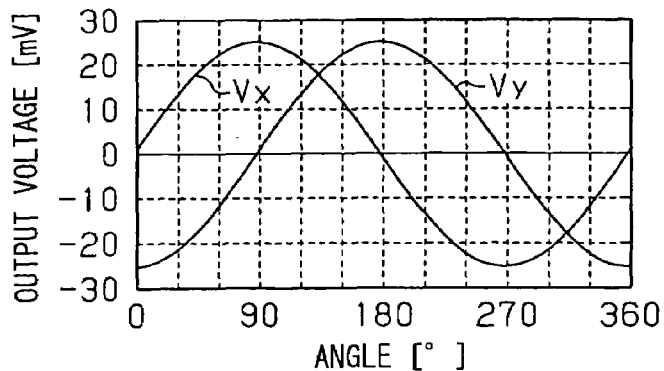
FIG. 30 is a graph showing a relationship between an output voltage and an angle between the device and a magnetic field, according to the tenth embodiment.

FIG. 30 shows a voltage signal outputted from the Hall cells 101, 102. The Hall voltage signal outputted from the Hall cell 101 is defined as Vy, and the Hall voltage signal outputted from the Hall cell 102 is defined as Vx.

In this device, the output voltage Vx from the cell 102 is a sine curve, and the output voltage Vy from the cell 101 is a cosine curve. Even when the output voltages are changed in accordance with temperature change so that the output voltages become Vx' and Vy', the changes of the output voltages can be cancelled as follows. For example, when the changes of the output voltages are defined as V, the output voltages Vx', Vy' are shown as:

$Vx=V\sin\theta$; and $Vy=V\cos\theta$.

In this case, the changes of the output voltages can be cancelled to computing a ratio of the output voltages Vx', Vy' as follows:

$Vx/Vy=\sin\theta/\cos\theta=\tan\theta$.

Thus, the changes of the output voltages are cancelled.

Accordingly, the Hall cells 101, 102 can detect the magnetic component parallel to the substrate 11 with high accuracy by computing the Hall voltage signals outputted from the Hall cells. Thus, the Hall device detects the magnetic field around 3600. Further, the Hall cell 70 detects the magnetic component perpendicular to the substrate 11. Thus, the Hall device can detect the magnetic field three-dimensionally. Specifically, the Hall device can independently detect three magnetic components in the X, Y, and Z directions. Accordingly, the Hall device works as a three-dimensional magnetic sensor.

Eleventh Embodiment

A vertical Hall device according to an eleventh embodiment of the present invention is shown in FIGS. 31A and 31B. The Hall device includes multiple vertical Hall cells 101-10n. The number of the Hall cells is defined as n. The Hall cells 101-10n are electrically connected in series, and are integrated in the substrate 11.

Specifically, the Hall cell 101 includes two terminals G1, G2, and the adjacent Hall cell 102 includes a terminal S, which is connected to the terminals G1, G2 in parallel. Then, the Hall cell 103 next to the Hall cell 102 includes a terminal S, which is connected to two terminals G1, G2 of the Hall cell 102 in parallel. Thus, the Hall cell 10n is connected to the Hall cell 101 in series. The terminal S of the Hall cell 101 is connected to a terminal S0, and the terminals G1, G2 of the Hall cell 10n are connected to a terminal G0. Each Hall cell 101-10n is energized through the terminals S0, G0.

Since the Hall cells are connected in series, the Hall voltage signal outputted from the Hall device becomes larger. Thus, the detection sensitivity of the device is improved.

In this case, the Hall device has the advantages described above, which are described in advantages of (1) to (24). In addition, the Hall device has the following advantage.

(36) The magnetic field detection sensitivity, i.e., the product sensitivity of the device is increased.

Twelfth Embodiment

Figure 32A:
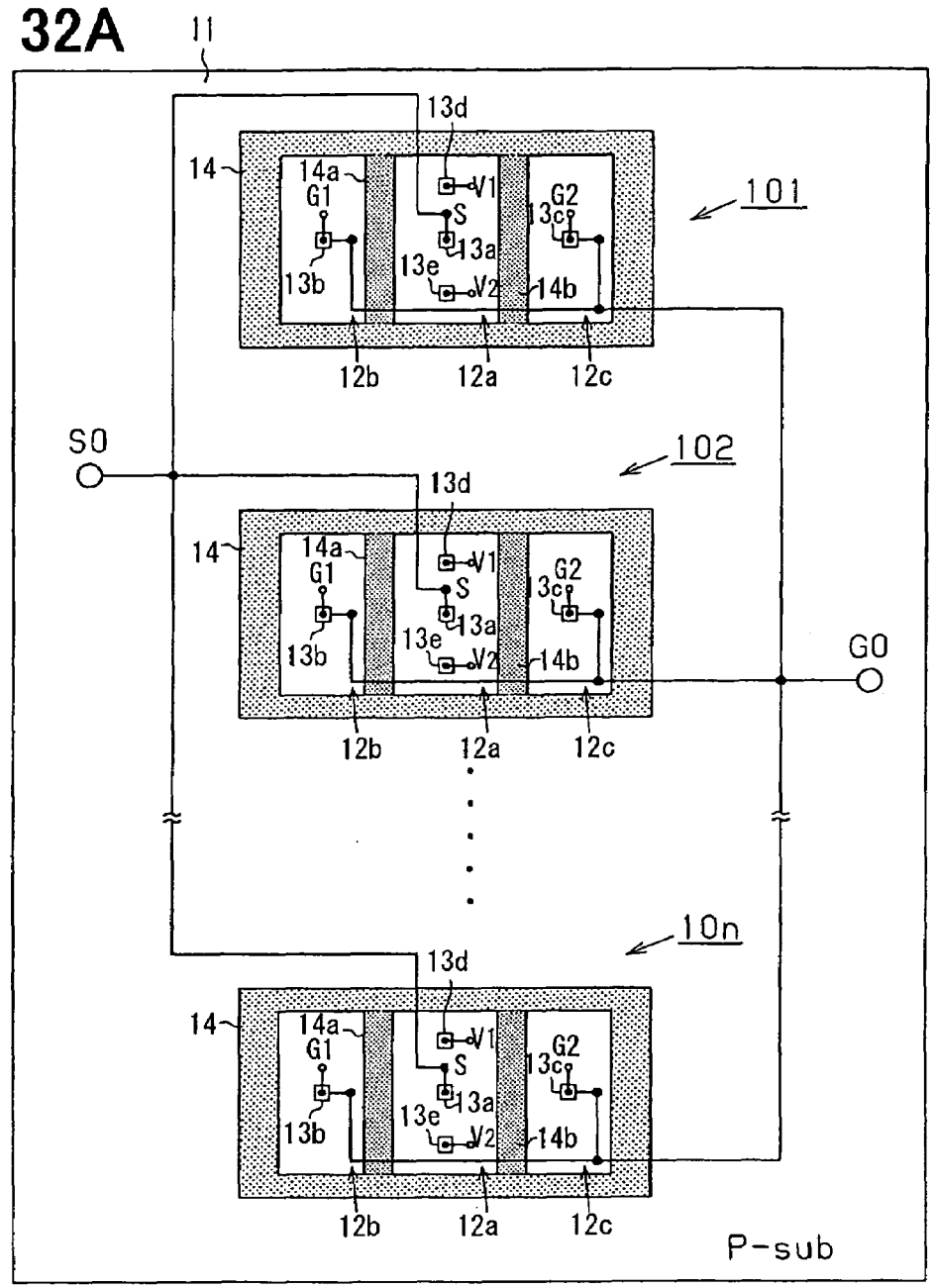
FIG. 32A is a plan view showing a vertical Hall device.
Figure 32B:
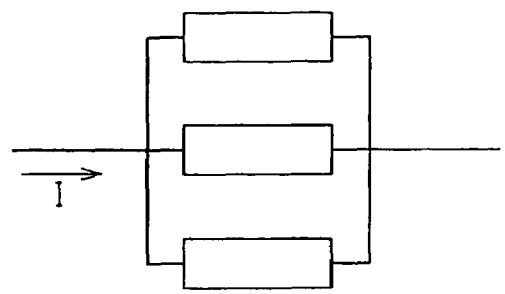
FIG. 32B is a schematic circuit diagram showing the device, according to a twelfth embodiment of the present invention.

A vertical Hall device according to a twelfth embodiment of the present invention is shown in FIGS. 32A and 32B. The Hall device includes multiple vertical Hall cells 101-10n. The number of the Hall cells is defined as n. The Hall cells 101-10n are electrically connected in parallel, and are integrated in the substrate 11.

Specifically, two terminals G1, G2 of each Hall cell 101-10n are connected to the terminal G0 in parallel, and the terminal S of each Hall cell 101-10n is connected to the terminal S0 in parallel. Thus, the Hall cells 101-10n are connected in parallel. Each Hall cell 101-10n is energized through the terminals S0, G0.

In general, when multiple Hall cells are manufactured in mass production, or when multiple Hall cells are integrated into one chip, the Hall cells have deviations of the output voltages and/or the offset voltages. However, since the Hall device according to the twelfth embodiment includes multiple Hall cells connected each other in parallel, the Hall voltage signal outputted from the device and the offset voltage of the device are normalized so that the detection accuracy of the device is improved.

In this case, the Hall device has the advantages described above, which are described in advantages of (1) to (24). In addition, the Hall device has the following advantage.

(37) The magnetic field detection accuracy of the device is increased.

Thirteenth Embodiment

Figure 33:
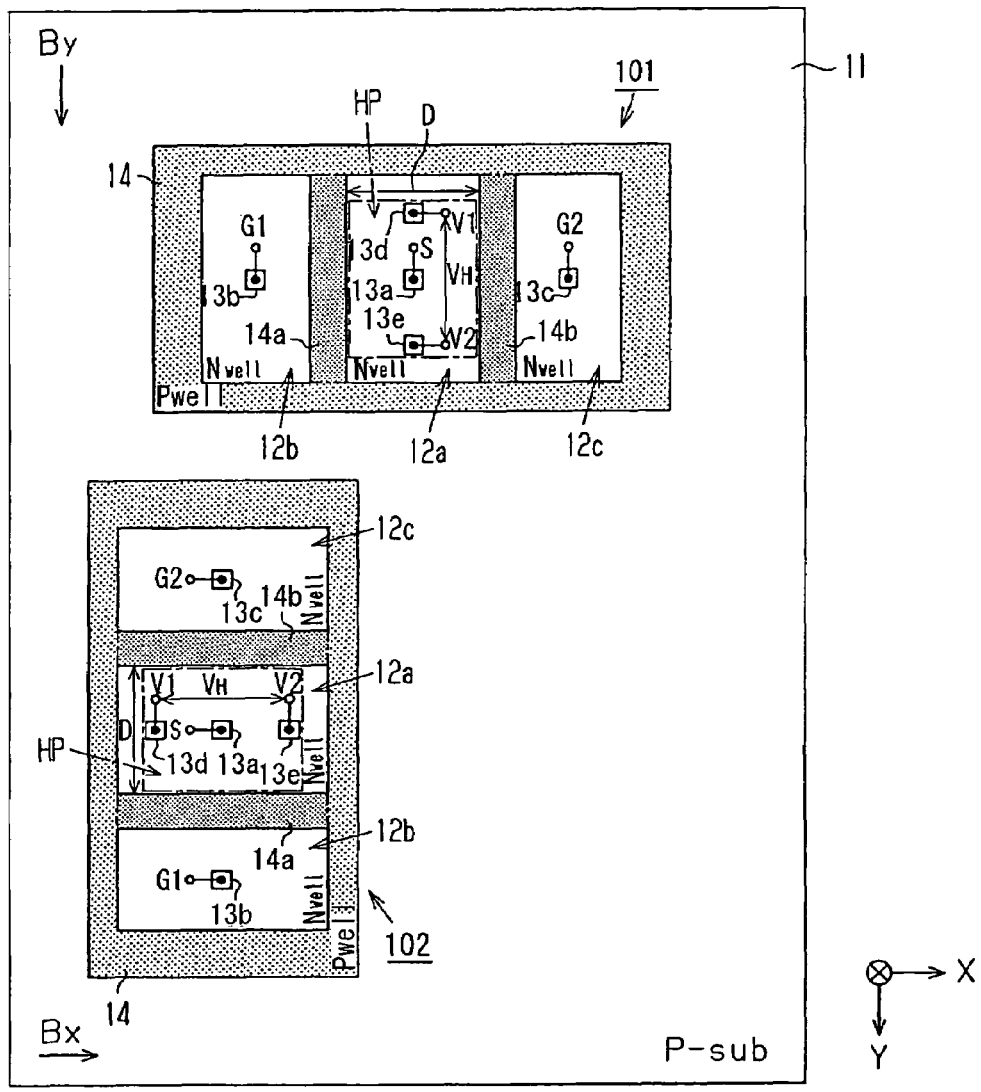
FIG. 33 is a plan view showing a vertical Hall device according to a thirteenth embodiment of the present invention.
Figure 34:
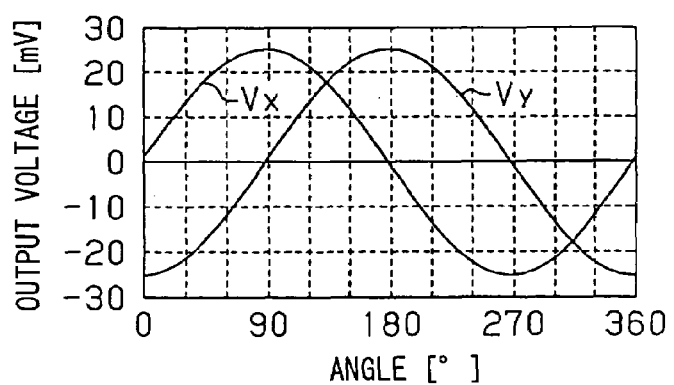
FIG. 34 is a graph showing a relationship between an output voltage and an angle between the device and a magnetic field, according to the thirteenth embodiment.

A Hall device according to a thirteenth embodiment of the present invention is shown in FIG. 33. The Hall device includes two vertical Hall cells 101, 102. The Hall cells 101, 102 detect two magnetic components in the X direction and the Y direction. FIG. 34 shows a voltage signal outputted from the Hall cells 101, 102. The Hall voltage signal outputted from the Hall cell 101 is defined as Vy, and the Hall voltage signal outputted from the Hall cell 102 is defined as Vx.

The Hall cells 101, 102 can detect the magnetic component parallel to the substrate 11 with high accuracy by computing the Hall voltage signals outputted from the Hall cells. Thus, the Hall device detects the magnetic field around 360°.

Here, it is considered that the sensor characteristics of two Hall cells 101, 102 may be varied in the manufacturing process. Therefore, to reduce the variation between the Hall cells 101, 102, it is preferred that a distance between the Hall cells 101, 102 is equal to or smaller than 100 µm. Thus, the variation between the Hall cells 101, 102 caused in the manufacturing process is reduced so that the sensor characteristics between the cells 101, 102 are uniformed. Further, another variation between the cells 101, 102 caused by, for example, temperature change is also reduced.

In this case, the Hall device has the advantages described above, which are described in advantages of (1) to (24). In addition, the Hall device has the following advantage.

(38) The Hall device can detect the magnetic field around 360° with high accuracy.

Although the cells 101, 102 are perpendicularly disposed, an angle between the cells 101, 102 can be another angle. For example, the angle between the cells 101, 102 can be a sharp angle.

Fourteenth Embodiment

Figure 35:
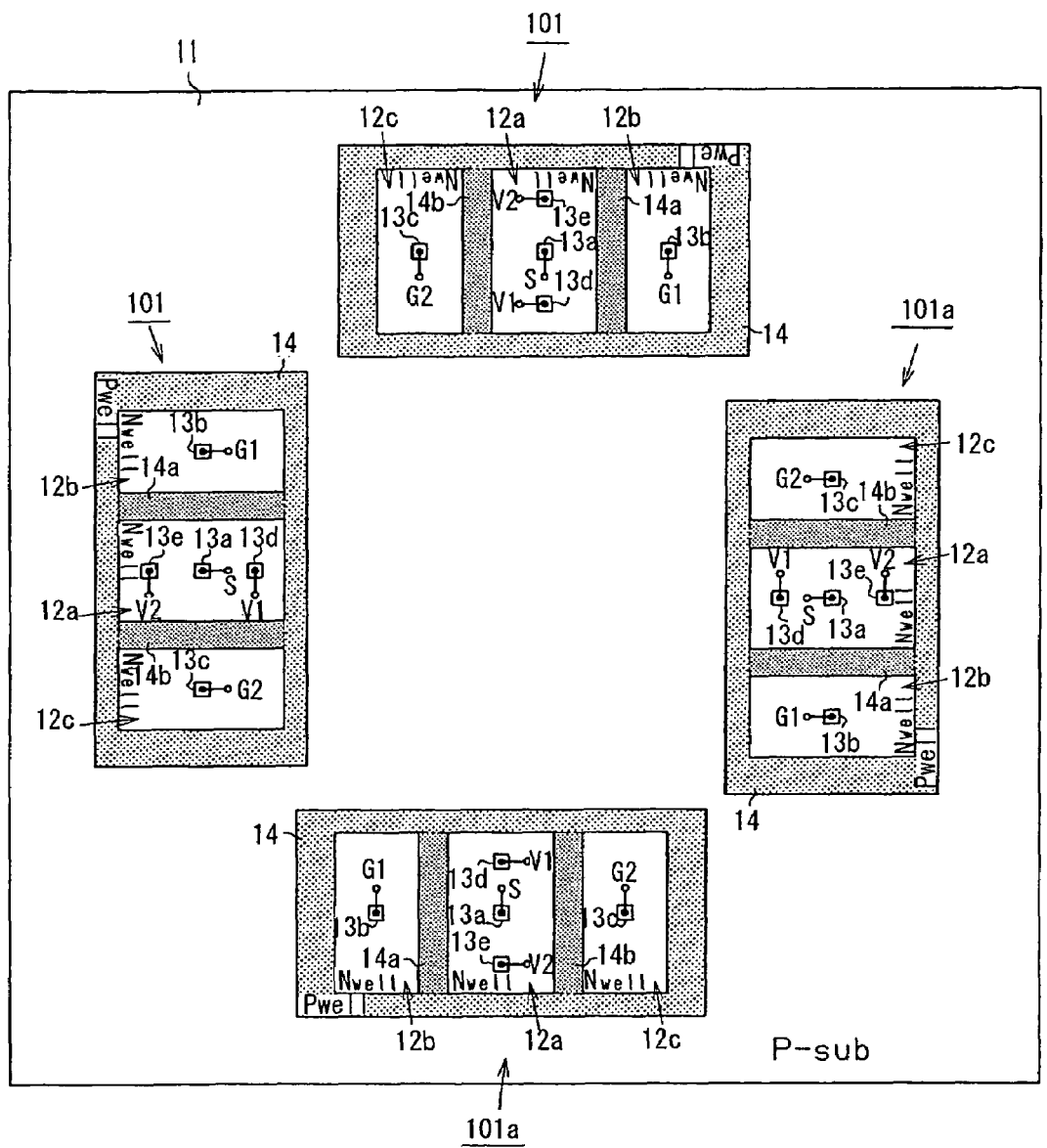
FIG. 35 is a plan view showing a vertical Hall device according to a fourteenth embodiment of the present invention.
Figure 36:
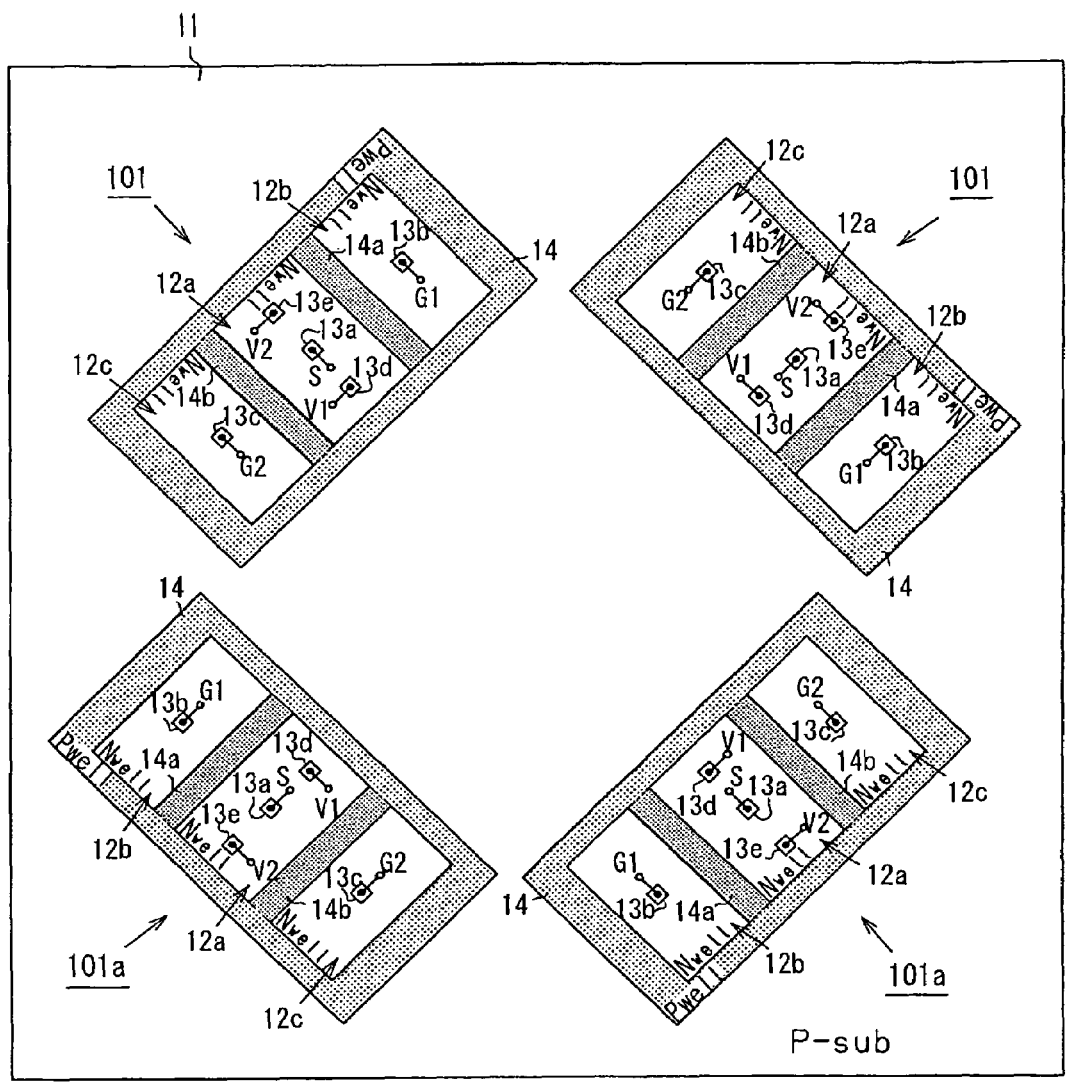
FIG. 36 is a plan view showing a vertical Hall device according to a modification of the fourteenth embodiment of the present invention.

A Hall device according to a fourteenth embodiment of the present invention is shown in FIGS. 35 and 36. The Hall device includes four Hall cells 101, 101a. Specifically, two pairs of the Hall cells 101, 101a are disposed on the substrate 11. Each pair of the Hall cells 101, 101a detects two magnetic components in two directions, which are perpendicular each other. One of the Hall cells 101 faces and is parallel to one of the Hall cells 101a, and the other of the Hall cells 101 faces and is parallel to the other of the Hall cells 101a. Thus, the Hall voltage signals outputted from two pairs of the Hall cells 1011, 101a are averaged and/or switched so that the detection accuracy of the device is improved.

As shown in FIG. 36, the Hall cells 101, 101a are slanted from an edge of the Hall device, i.e., an edge of the substrate. Specifically, an angle between one edge of the substrate 11 and one side of one of the Hall cells 101, 101a is 45 degree. In this case, the Hall cells 101, 101a are not affected by several mechanical stress applied to the substrate 11 outside of the device. Thus, the offset voltage of the Hall cells 101, 101a are reduced appropriately; and therefore, the detection accuracy of the device is improved.

Fifteenth Embodiment

Figure 37:
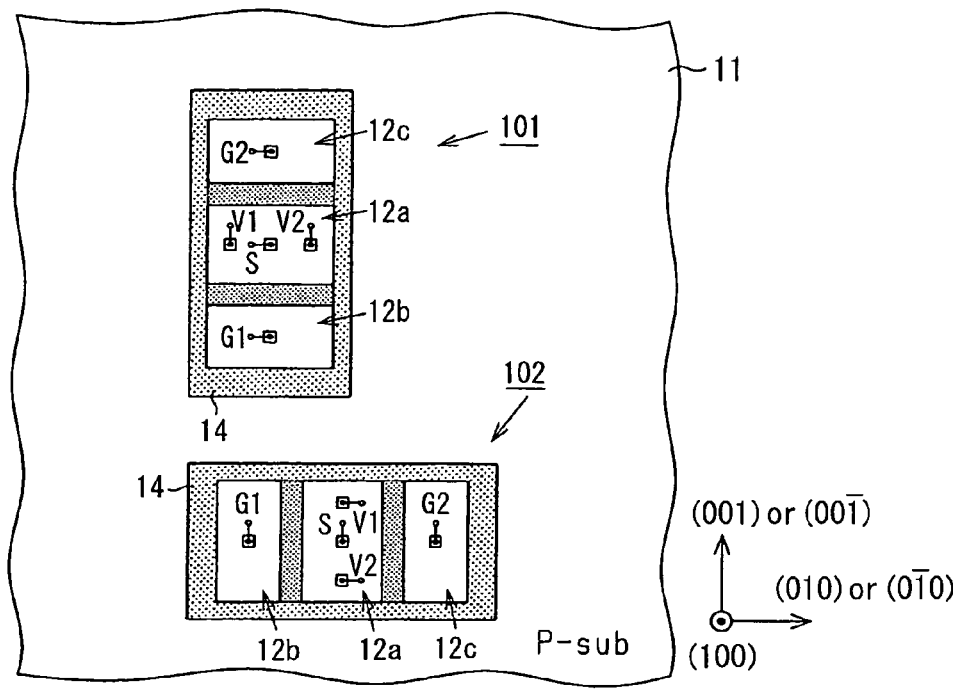
FIG. 37 is a plan view showing a vertical Hall device according to a fifteenth embodiment of the present invention.

A Hall device according to a fifteenth embodiment of the present invention is shown in FIG. 37. The hall device includes two Hall cells 101, 102, which are perpendicularly disposed. Specifically, one of the Hall cells 101, 102 is parallel to a <001> direction or a <00-1> direction of silicon crystal axis. The other one of the Hall cells 101, 102 is parallel to a <010> direction or a <0-10> direction of the silicon crystal axis.

In general, the output voltage of the Hall cell is in proportion to the carrier mobility in the magnetic field detection portion HP. The carrier mobility depends on the crystal structure, i.e., atomic arrangement. Here, the Piezo resistance in accordance with the mechanical stress applied to the substrate 11 also depends on the crystal structure. Therefore, it is important for the Hall cell to arrange the cell parallel to a predetermined crystal axis. Specifically, when multiple Hall cells are integrated into one chip, it is important to arrange the cells to be parallel to the predetermined crystal axis. In the above Hall device, the deviation between the cells 101, 102 is reduced since the crystal axis parallel to the cell 101, 102 is determined appropriately. Specifically, the deviation of each Hall voltage outputted from the cell 101, 102 is reduced. Further, the deviation of each resistance change in accordance with the stress applied to the substrate 11 caused from the Piezo resistance effect is reduced. Thus, the detection accuracy of the device is improved.

Figure 38:
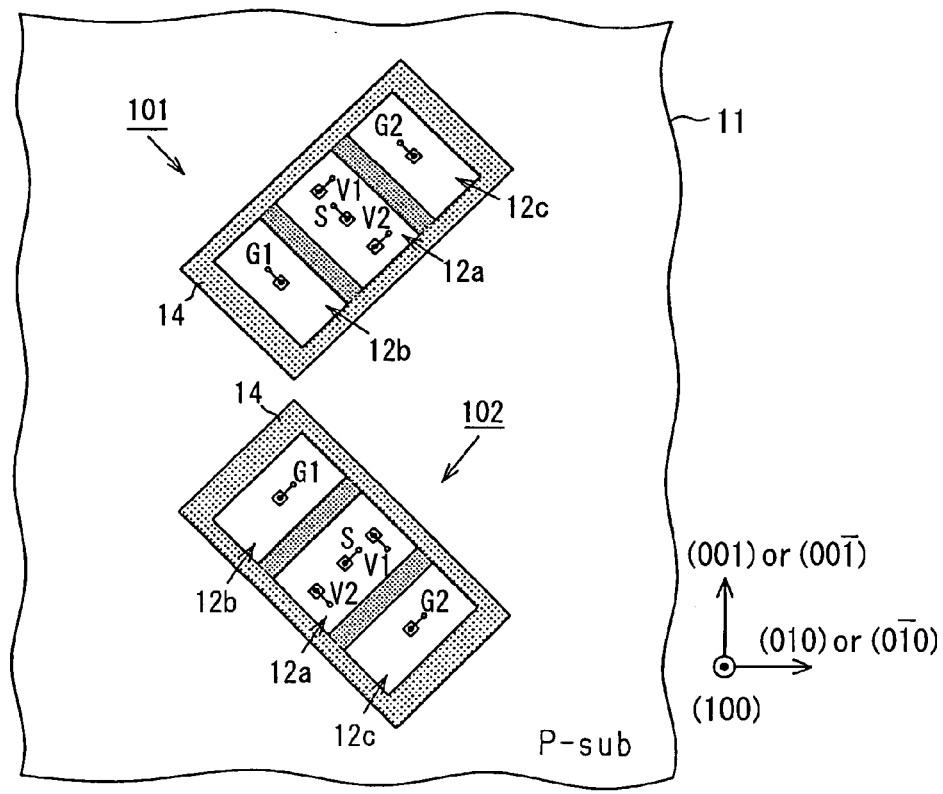
FIG. 38 is a plan view showing a vertical Hall device according to a modification of the fifteenth embodiment.
Figure 39:
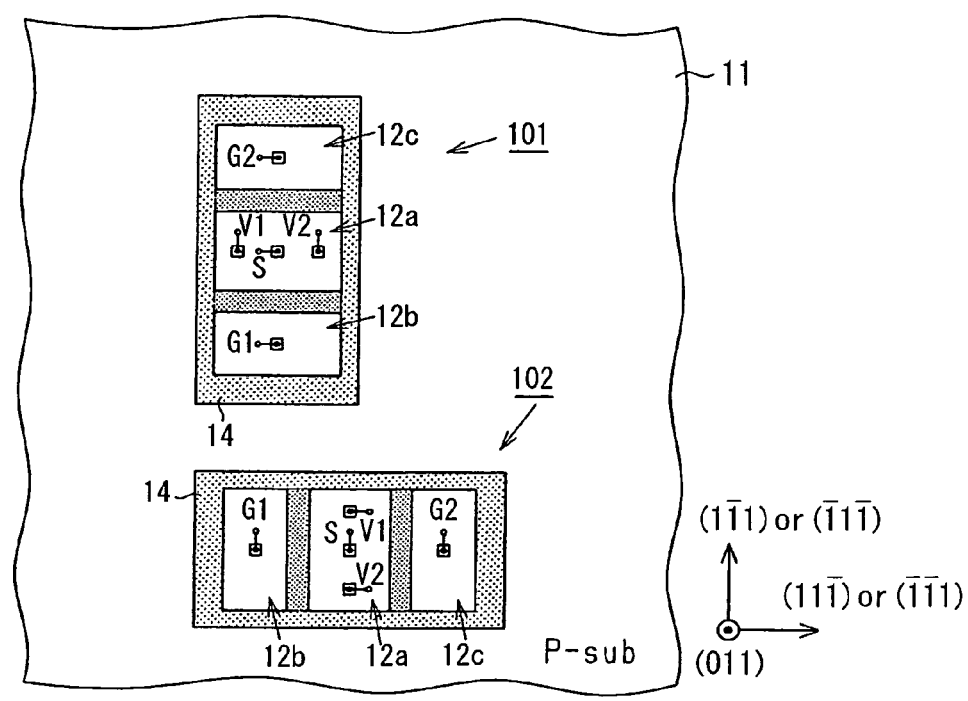
FIG. 39 is a plan view showing a vertical Hall device according to a second modification of the fifteenth embodiment.
Figure 40A:
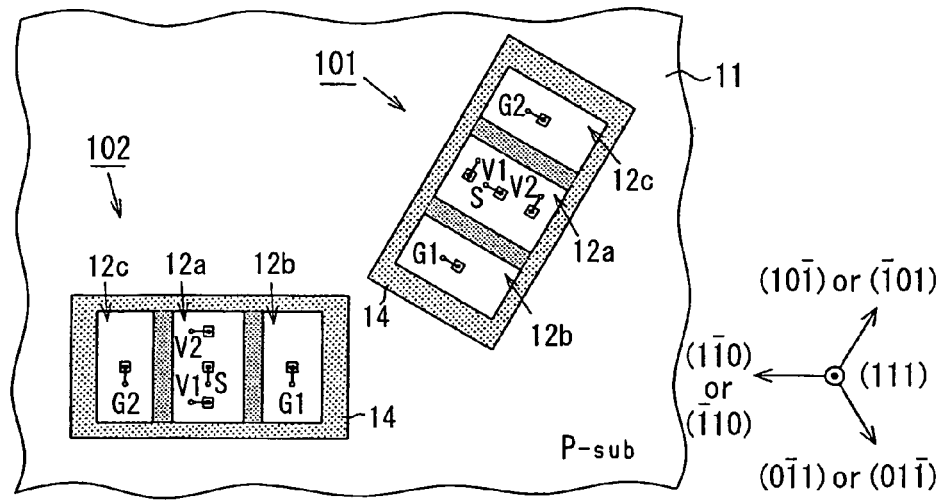
FIG. 40A is a plan view showing a vertical Hall device according to a third modification of the fifteenth embodiment.
Figure 40B:
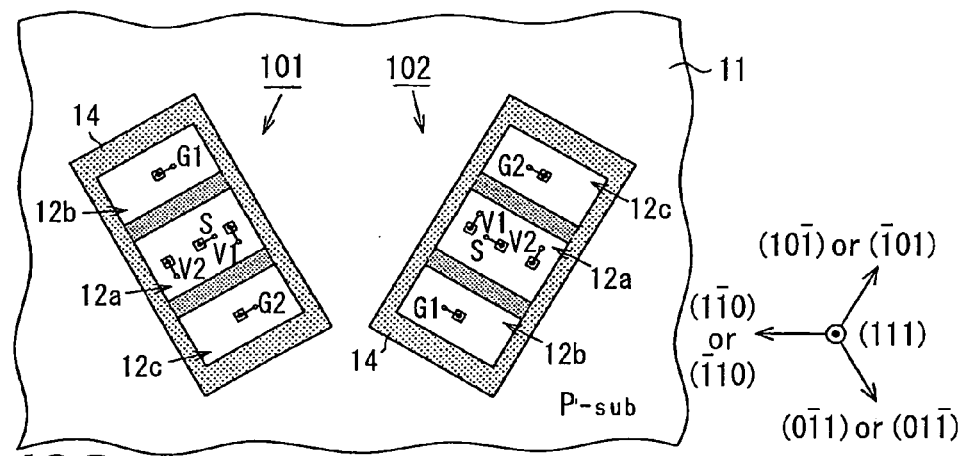
FIG. 40B is a plan view showing a vertical Hall device according to a fourth modification of the fifteenth embodiment.
Figure 40C:
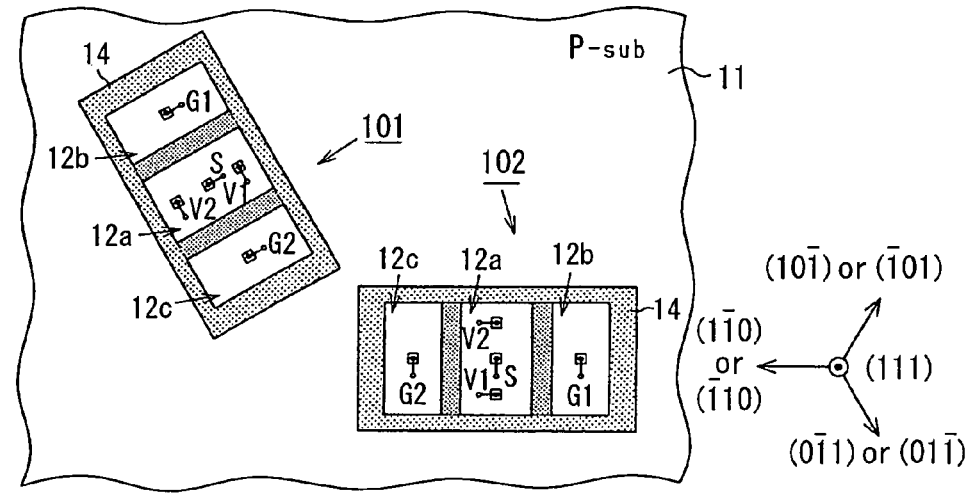
FIG. 40C is a plan view showing a vertical Hall device according to a fifth modification of the fifteenth embodiment.

Although the Hall cell is parallel to the <001> direction or the <010> direction, the Hall cell can be parallel to another direction. Here, the single silicon crystal has a diamond type crystal structure, and therefore, the <001>, the <010>, the <00-1>, the <0-10> directions are equivalent. Therefore, the Hall cell can be parallel to a <011> direction (or a <0-1-1> direction) and a <0-11> direction (or a <01-1> direction), as shown in FIG. 38. Further, the Hall cell can be parallel to a <1-11> direction (or a <-11-1> direction) and a <11-1> direction (or a <-1-11> direction), as shown in FIG. 39. Further, the Hall cell can be parallel to a <1-10> direction (or a <-110> direction) and a <10-1> direction (or a <-101> direction), as shown in FIG. 40A. Further, the Hall cell can be parallel to a <10-1> direction (or a <-101> direction) and a <0-11> direction (or a <01-1> direction), as shown in FIG. 40B. Further, the Hall cell can be parallel to a <0-11> direction (or a <01-1> direction) and a <1-10> direction (or a <-110> direction), as shown in FIG. 40C.

Although the Hall device includes two cells 101, 102, the Hall device can have multiple cells such as three cells 101, 102, 103.

Figure 41:
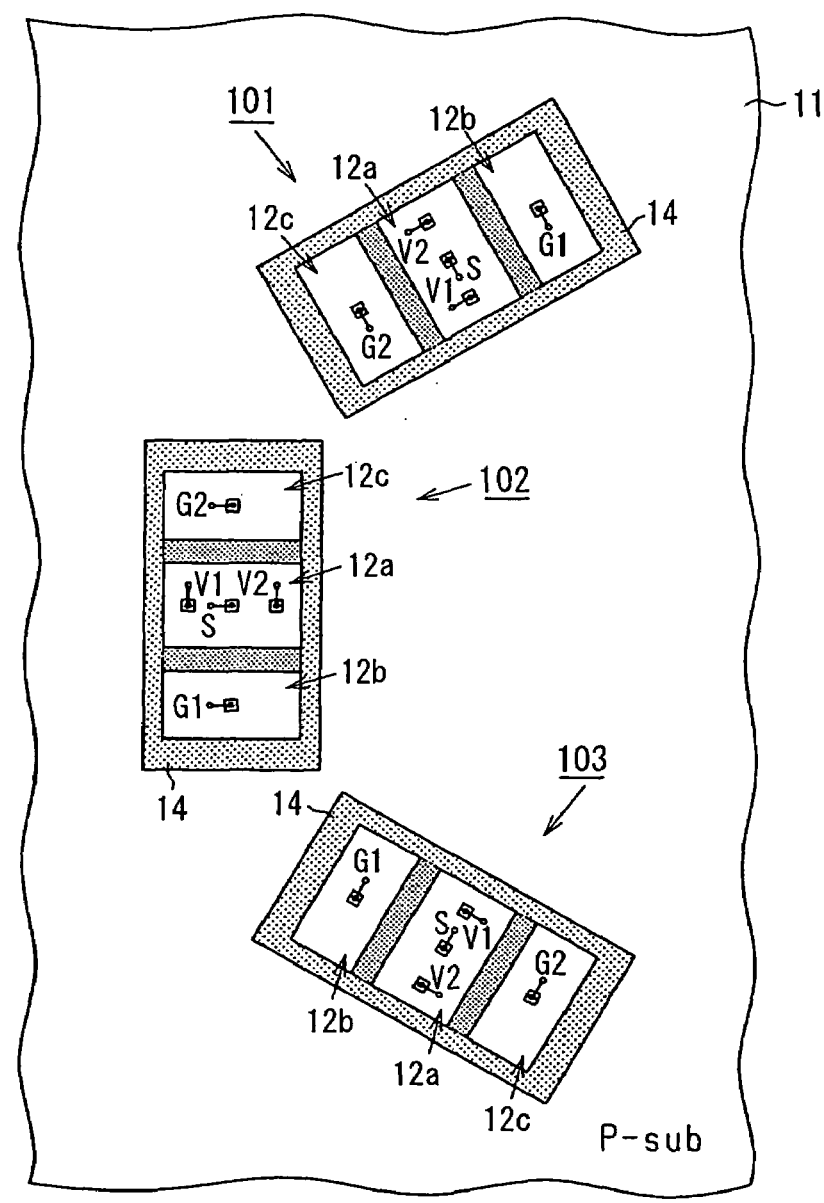
FIG. 41 is a plan view showing a vertical Hall device according to a sixth modification of the fifteenth embodiment.

As shown in FIG. 41, three Hall cells 101, 102, 103 are parallel to a <1-10> direction (or a <-110> direction), a <0-11> direction (or a <01-1> direction, and a <10-1> direction (or a <-101> direction).

Sixteenth Embodiment

Figure 42:
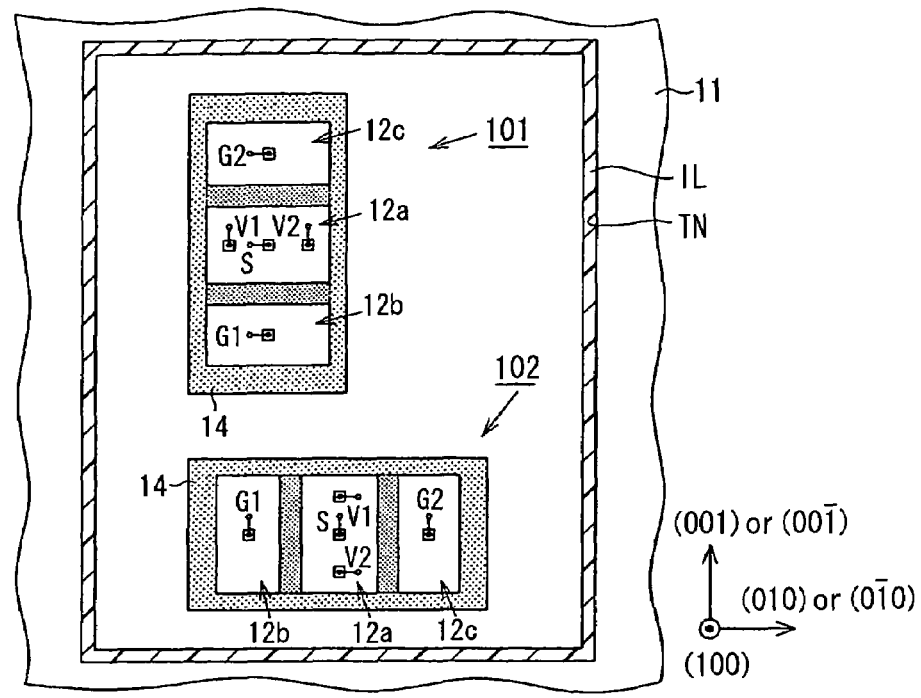
FIG. 42 is a plan view showing a vertical Hall device according to a sixteenth embodiment of the present invention.

A Hall device according to a sixteenth embodiment of the present invention is shown in FIG. 42. The Hall device includes two Hall cells 101, 102, which are perpendicularly disposed. Specifically, one of the Hall cells 101, 102 is parallel to a <001> direction or a <00-1> direction of silicon crystal axis. The other one of the Hall cells 101, 102 is parallel to a <010> direction or a <0-10> direction of the silicon crystal axis. The Hall device further includes a trench TN, in which an insulation film IL is embedded. The trench TN with the insulation film IL provides a trench isolation construction. This construction surrounds the Hall cells 101, 102 for reducing the mechanical stress applied to the substrate 11. Thus, the detection accuracy and the sensitivity of the Hall device are improved. The construction can be formed of the shallow trench isolation construction.

Figure 43:
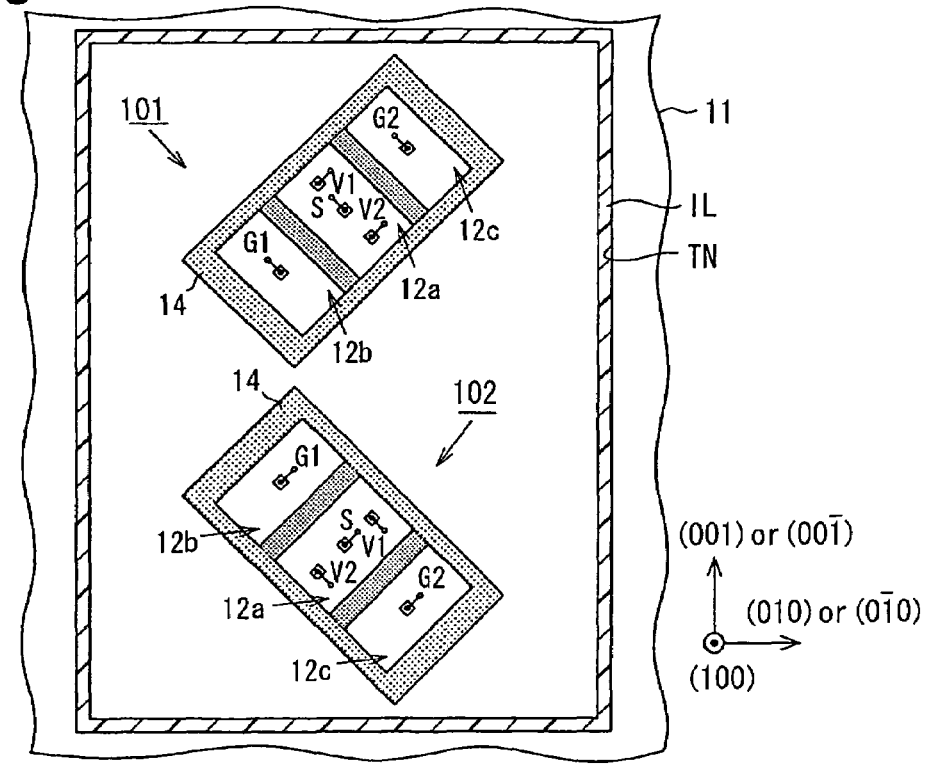
FIG. 43 is a plan view showing a vertical Hall device according to a modification of the sixteenth embodiment.

Although the Hall cell 101, 102 is parallel to the <001> direction or the <010> direction, the Hall cell can be parallel to another direction. As shown in FIG. 43, the Hall cell 101, 102 can be parallel to a <011> direction (or a <0-1-1> direction) and a <0-11> direction (or a <01-1> direction), as shown in FIG. 38.

Although the Hall device includes two cells 101, 102, the Hall device can have multiple cells such as three cells.

Seventeenth Embodiment

Figure 44:
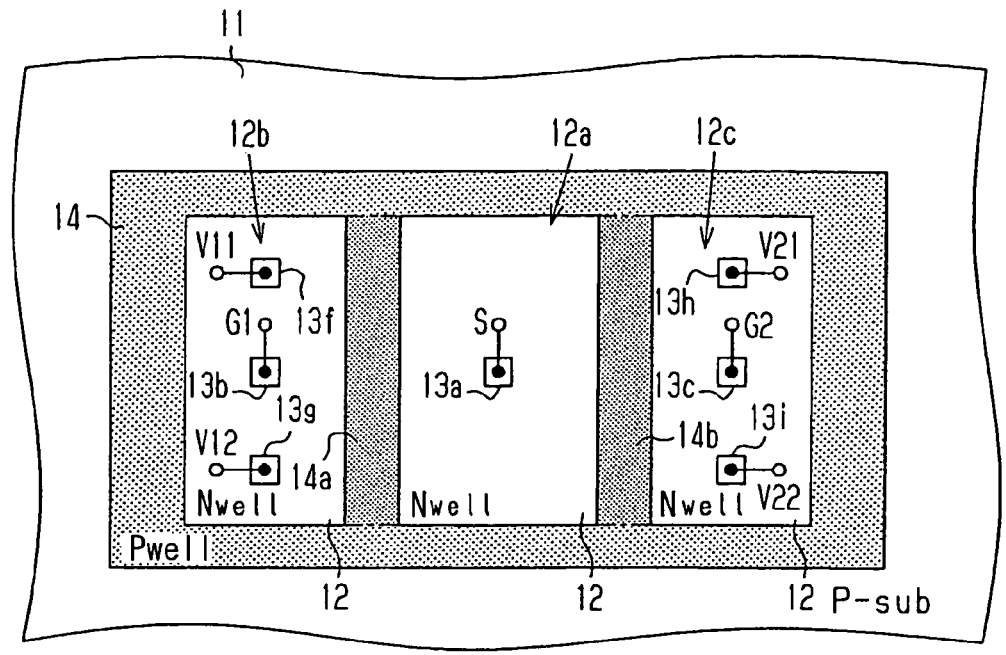
FIG. 44 is a plan view showing a vertical Hall device according to a seventeenth embodiment of the present invention.

A Hall device according to a seventeenth embodiment of the present invention is shown in FIG. 44. The Hall device includes a Hall cell having two pairs of voltage output terminals V11, V12, V21, V22. In the Hall cell, the contact regions 13a-13c correspond to the current supply terminals G1, G2, S, and the contact regions 13f-13i correspond to the voltage output terminals V11, V12, V21, V22. In this case, the voltage output signal Vout outputted from each pair of the terminals V11, V12, V21, V22 is opposite to that outputted from the terminals V1, V2 in the Hall device shown in FIG. 1.

Figure 45:
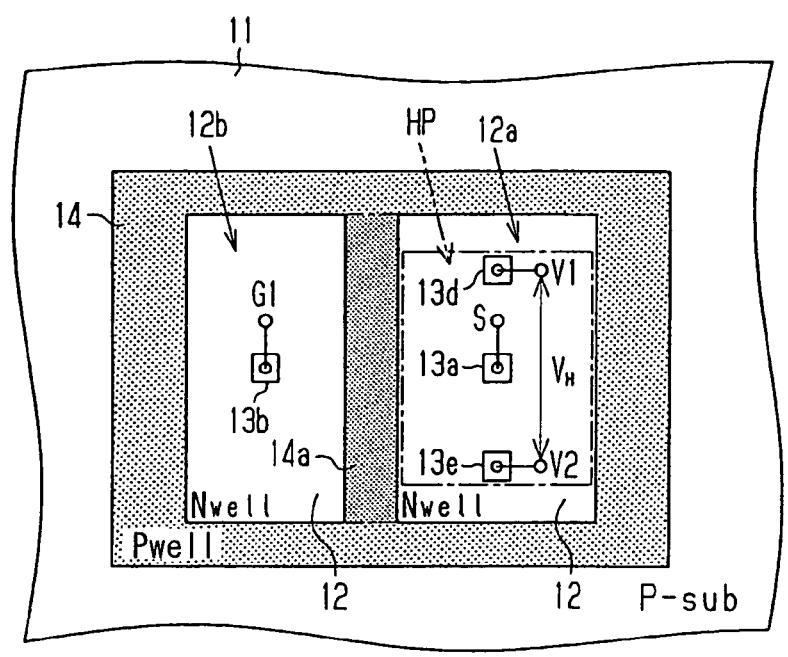
FIG. 45 is a plan view showing a vertical Hall device according to a modification of the seventeenth embodiment.

Although the Hall device shown in FIG. 1 includes two current supply terminals G1, G2, the Hall device can have one current supply terminal G1, as shown in FIG. 45. In FIG. 45, the Hall device includes the terminal G1 corresponding to the contact region 13b, and does not include the other current terminal G2 corresponding to the contact region 13c. In this case, one of the current supply terminals S, G1 is sandwiched between the voltage output terminals V1, V2. The other one of the current supply terminals S, G1 is disposed on one side of the voltage output terminals V1, V2. Thus, the Hall device has two-thirds area compared with the Hall device shown in FIG. 1. Therefore, the Hall device shown in FIG. 45 is minimized in dimensions.

Although the current supply terminals S, G1, G2 are disposed perpendicularly to the voltage output terminals V1, V2, the current supply terminals S, G1, G2 and the voltage output terminals V1, V2 can be disposed in line. In this case, the Hall device can have no diffusion layer 14, 14a, 14b. Even when the Hall device has no diffusion layer 14, 14a, 14b, the current including the component perpendicular to the substrate 11 can flow through the magnetic field detection portion HP. Further, one of the current supply terminals S, G1, G2 can be disposed on the bottom of the substrate 11 so that the other one of the current supply terminals S, G1, G2 faces the one of the current supply terminals S, G1, G2 in the vertical direction of the substrate 11. In this case, even when the Hall device has no diffusion layer 14, 14a, 14b, the current including the component perpendicular to the substrate 11 can flow through the magnetic field detection portion HP.

Although the current supply terminals S, G1, G2 and the voltage output terminals V1, V2 are disposed on the contact regions 13a-13e, the impurity concentration of each of which is selectively increased, the current supply terminals S, G1, G2 and the voltage output terminals V1, V2 can be disposed on the semiconductor region 12 directly.

Although the periphery circuit C10 is formed of the CMOS circuit, the periphery circuit C10 can be formed of another circuit such as a bipolar circuit.

Although the Hall device shown in FIG. 1 is operated with a constant current, the Hall device can be operated with a constant voltage.

In the Hall device, the P conductive type can be exchange to the N conductive type. For example, although the semiconductor region 12 has the P conductive type, the semiconductor region 12 can have the N conductive type.

Although the substrate 11 is made of silicon, the substrate 11 can be made of another material such as GaAs, InSb, InAs, SiC, or Ge. Specifically, when the substrate is made of GaAs or InAs, the Hall device can have high sensitivity since the material such as GaAs and InAs has excellent temperature characteristics. In this case, the Hall cell is disposed in parallel to a certain direction, which has small resistance change in accordance with the stress applied to the substrate 11 caused by the Piezo resistance effect.

Although the substrate 11 is made of a single conductive type substrate, the substrate 11 can be made of an epitaxial substrate, a SOI (i.e., silicon on insulator) substrate, or a multilayer substrate having different conductive type layers (e.g., the substrate has a P-N-P-N-P, or a N-P-N-P-N construction).

Such changes and modifications are to be understood as being within the scope of the present invention as defined by the appended claims.

What is claimed is:

1. A vertical Hall device comprising:
   a substrate;
   a semiconductor region having a first conductive type and disposed in the substrate; and
   a magnetic field detection portion disposed in the semiconductor region, wherein:
   the magnetic field detection portion is capable of detecting a magnetic field parallel to a surface of the substrate in a case where a current flows through the magnetic field detection portion in a vertical direction of the substrate;
   the semiconductor region is a diffusion layer including a conductive impurity doped and diffused therein;
   the semiconductor region has an impurity concentration changing in the vertical direction of the substrate;
   the semiconductor region has a minimum impurity concentration at a surface portion of the substrate; and
   the impurity concentration of the semiconductor region is increased toward a bottom of the substrate.

2. A vertical Hall device comprising:
   a substrate;
   a semiconductor region having a first conductive type and disposed in the substrate; and
   a magnetic field detection portion disposed in the semiconductor region, wherein:
   the magnetic field detection portion is capable of detecting a magnetic field parallel to a surface of the substrate in a case where a current flows through the magnetic field detection portion in a vertical direction of the substrate;
   the semiconductor region is a diffusion layer including a conductive impurity doped and diffused therein;
   the semiconductor region has an impurity concentration changing in the vertical direction of the substrate;
   the semiconductor region has a maximum impurity concentration at a predetermined portion of the substrate, which has a predetermined depth from the surface of the substrate; and
   the impurity concentration of the semiconductor region is decreased toward a bottom and the surface of the substrate.

3. A vertical Hall device comprising:
   a substrate;
   a semiconductor region having a first conductive type and disposed in the substrate;
   a magnetic field detection portion disposed in the semiconductor region; and
   a diffusion stopper layer disposed under a bottom of the semiconductor region, wherein:
   the magnetic field detection portion is capable of detecting a magnetic field parallel to a surface of the substrate in a case where a current flows through the magnetic field detection portion in a vertical direction of the substrate;
   the semiconductor region is a diffusion layer including a conductive impurity doped and diffused therein;
   the semiconductor region has an impurity concentration changing in the vertical direction of the substrate;
   the semiconductor region has a maximum impurity concentration at a portion adjacent to the diffusion stopper layer; and
   the impurity concentration of the semiconductor region is decreased toward the surface of the substrate.

4. A vertical Hall device comprising:
   a substrate;
   a semiconductor region having a first conductive type and disposed in the substrate;
   a magnetic field detection portion disposed in the semiconductor region; and
   a separation wall having a second conductive type and disposed in the semiconductor region for separating the magnetic field detection portion electrically, wherein:
   the magnetic field detection portion is capable of detecting a magnetic field parallel to a surface of the substrate in a case where a current flows through the magnetic field detection portion in a vertical direction of the substrate;
   the semiconductor region is a diffusion layer including a conductive impurity doped and diffused therein;
   the separation wall provides a current path in such a manner that the separation wall selectively narrows near a bottom of the semiconductor region;
   an impurity concentration of a portion of the semiconductor region that contacts the substrate is lower than an impurity concentration of a surface portion of the semiconductor region; and
   an impurity concentration of a bottom portion of the semiconductor region under the separation wall is lower than the surface portion of the semiconductor region.

5. The device according to claim 4, wherein
the separation wall is disposed from the surface of the semiconductor region to a predetermined depth of the semiconductor region so that the current path is formed between a bottom of the separation wall and a bottom of the semiconductor region.

6. The device according to claim 5, wherein
the predetermined depth of the separation wall is equal to or larger than 2 μm.

7. A vertical Hall device comprising:
   a substrate;
   a semiconductor region having a first conductive type and disposed in the substrate;
   a magnetic field detection portion disposed in the semiconductor region; and a separation wall having a second conductive type and
  disposed in the semiconductor region for separating the
  magnetic field detection portion electrically, wherein:
the magnetic field detection portion is capable of detect-
  ing a magnetic field parallel to a surface of the substrate
  in a case where a current flows through the magnetic
  field detection portion in a vertical direction of the
  substrate;
the semiconductor region is a diffusion layer including a
  conductive impurity doped and diffused therein;
the separation wall is shallower than the semiconductor
  region;
the separation wall has an impurity concentration chang-
  ing in the vertical direction of the substrate;
the separation wall has a maximum impurity concentra-
  tion at a surface portion of the substrate; and
the impurity concentration of the separation wall is
  decreasing toward a bottom of the substrate.

8. The device according to claim 7, wherein
the separation wall has a predetermined depth equal to or
  larger than 2.

9. A vertical Hall device comprising:
a substrate;
a semiconductor region having a first conductive type and
  disposed in the substrate;
a magnetic field detection portion disposed in the semi-
  conductor region; and
a separation wall having a second conductive type and
  disposed in the semiconductor region for separating the
  magnetic field detection portion electrically, wherein:
the magnetic field detection portion is capable of detect-
  ing a magnetic field parallel to a surface of the substrate
  in a case where a current flows through the magnetic
  field detection portion in a vertical direction of the
  substrate;
the semiconductor region is a diffusion layer including a
  conductive impurity doped and diffused therein;
the separation wall is shallower than the semiconductor
  region;
the separation wall is disposed from the surface of the
  semiconductor region to a predetermined depth of the
  semiconductor region so that a current path is formed
  between a bottom of the separation wall and a bottom
  of the semiconductor region;
an impurity concentration of a portion of the semicon-
  ductor region that contacts the substrate is lower than
  an impurity concentration of a surface portion of the
  semiconductor region; and
an impurity concentration of a bottom portion of the
  semiconductor region under the separation wall is
  lower than the surface portion of the semiconductor
  region.

10. The device according to claim 7, wherein
the separation wall is disposed from the surface of the
  semiconductor region to a predetermined depth of the
  semiconductor region so that a current path is formed
  between a bottom of the separation wall and a bottom
  of the semiconductor region.

11. A vertical Hall device comprising:
a substrate;
a semiconductor region having a first conductive type and
  disposed in the substrate;
a magnetic field detection portion disposed in the semi-
  conductor region;
a first, a second and a third current supply terminals
  disposed on a surface of the semiconductor region; and
a first and a second voltage output terminals disposed on
  the surface of the semiconductor region, wherein:
the magnetic field detection portion is capable of detect-
  ing a magnetic field parallel to a surface of the substrate
  in a case where a current flows through the magnetic
  field detection portion in a vertical direction of the
  substrate;
the semiconductor region is a diffusion layer including a
  conductive impurity doped and diffused therein;
the first and the second current supply terminals flow the
  current through the magnetic field detection portion in
  the vertical direction of the substrate;
the first and the third current supply terminals flow the
  current through the magnetic field detection portion in
  the vertical direction of the substrate;
the first and the second voltage output terminals output a
  Hall voltage signal corresponding to the magnetic field
  parallel to the surface of the substrate;
the first current supply terminal is disposed between the
  first and the second voltage output terminals;
the second and the third current supply terminals are
  disposed symmetrically on either side of a line between
  the voltage output terminals; and
the first, the second and the third current supply terminals
  are disposed on a line, which is perpendicular to a line
  between the voltage output terminals.

12. The device according to claim 11, wherein
the current supply terminals and the voltage output ter-
  minals are provided by portions having high impurity
  concentration.

13. The device according to claim 11, wherein
one of the voltage output terminals is connected to a
  wiring having a changeable resistance so that the Hall
  voltage signal is outputted through the wiring.

14. The device according to claim 13, wherein
the wiring includes multiple wires having different resis-
  tances, and
the wires are connected and disconnected electrically in
  parallel so that the wiring is capable of changing a total
  resistance.

15. A vertical Hall device comprising:
a substrate;
a semiconductor region having a first conductive type and
  disposed in the substrate; and
a magnetic field detection portion disposed in the semi-
  conductor region, wherein:
the magnetic field detection portion is capable of detect-
  ing a magnetic field parallel to a surface of the substrate
  in a case where a current flows through the magnetic
  field detection portion in a vertical direction of the
  substrate;
the semiconductor region is a diffusion layer including a
  conductive impurity doped and diffused therein; and
the surface of the substrate is parallel to a predetermined
  surface orientation of crystal, which shows a resistance
  change in accordance with a stress application caused
  by a Piezo resistance effect, the resistance change of the
  predetermined surface orientation is smallest among
  those of other surface orientations.

16. The device according to claim 15, wherein
the substrate is made of silicon, and
the surface of the substrate is parallel to a (100)-surface
  orientation of silicon.

17. The device according to claim 15, wherein the sub-
strate is made of silicon or germanium.

18. The device according to claim 15, wherein the sub-
strate is made of compound semiconductor.

19. The device according to claim 18, wherein the substrate is made of GaAs, InSb, or InAs.

20. The device according to claim 15, further comprising a signal processing circuit for processing a Hall voltage signal outputted from the magnetic field detection portion, wherein
the signal processing circuit is disposed on the substrate so that the device having the signal processing circuit are integrated into one chip.

21. The device according to claim 20, wherein
the signal processing circuit provides a CMOS circuit as a periphery circuit.

22. The device according to claim 15, further comprising:
a pair of current supply terminals disposed on the surface of the semiconductor region; and
a pair of voltage output terminals disposed on the surface of the semiconductor region, wherein
the current supply terminals flow the current through the magnetic field detection portion in the vertical direction of the substrate, and
the voltage output terminals output a Hall voltage signal corresponding to the magnetic field parallel to the surface of the substrate.

23. The device according to claim 22, wherein one of the current supply terminals is disposed between the voltage output terminals.

24. The device according to claim 23, wherein the other one of the current supply terminals is disposed on one side of the voltage output terminals.

25. The device according to claim 22, wherein the current supply terminals provide a line therebetween perpendicular to a line between the voltage output terminals.

26. The device according to claim 22, wherein the current supply terminals and the voltage output terminals are provided by portions having high impurity concentration.

27. The device according to claim 15, wherein
the current flows through the magnetic field detection portion in a direction slanted from the vertical direction of the substrate so that the current includes a component in the vertical direction.

28. The device according to claim 15, wherein
the substrate has a N conductive type, and the semiconductor region has a P conductive type.

29. The device according to claim 15, wherein
the substrate has a P conductive type, and the semiconductor region has a N conductive type.

* * * * *